United States Patent
Yamano

(10) Patent No.: US 7,964,493 B2
(45) Date of Patent: Jun. 21, 2011

(54) METHOD OF MANUFACTURING SEMICONDUCTOR DEVICE

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 55 days.

(21) Appl. No.: 12/336,854

(22) Filed: Dec. 17, 2008

(65) Prior Publication Data

US 2009/0170307 A1    Jul. 2, 2009

(30) Foreign Application Priority Data

Dec. 27, 2007   (JP) ................. 2007-335688

(51) Int. Cl.
*H01L 21/4763* (2006.01)

(52) U.S. Cl. ............... 438/618; 438/110; 257/E21.517; 257/E21.519

(58) Field of Classification Search ................ None
See application file for complete search history.

(56) References Cited

U.S. PATENT DOCUMENTS

| | | |
|---|---|---|
| 2001/0004134 A1* | 6/2001 | Saitoh ........................ 257/759 |
| 2002/0175409 A1* | 11/2002 | Tsubosaki ................... 257/737 |
| 2003/0139004 A1* | 7/2003 | Yoshida ...................... 438/200 |
| 2004/0115868 A1* | 6/2004 | Ono ............................ 438/127 |
| 2004/0227218 A1 | 11/2004 | Farnworth et al. |
| 2005/0205641 A1* | 9/2005 | Takeuchi et al. .............. 228/1.1 |

FOREIGN PATENT DOCUMENTS

| | | |
|---|---|---|
| JP | 10-335528 | 12/1998 |
| JP | 11-45905 A | 2/1999 |
| JP | 11-87605 A | 3/1999 |
| JP | 2002-33414 A | 1/2002 |
| JP | 2002-110854 A | 4/2002 |

* cited by examiner

*Primary Examiner* — Julio J Maldonado
*Assistant Examiner* — Shaka Scarlett
(74) *Attorney, Agent, or Firm* — Rankin, Hill & Clark LLP

(57) ABSTRACT

A metal layer is formed on an upper surface of a resin layer provided to cover a plurality of semiconductor chips at a side on which an internal connecting terminal is disposed and the internal connecting terminal, and the metal layer is pressed to cause the metal layer in a corresponding portion to a wiring pattern to come in contact with the internal connecting terminal, and to then bond the metal layer in a portion provided in contact with the internal connecting terminal to the internal connecting terminal in a portion provided in contact with the metal layer.

18 Claims, 45 Drawing Sheets

METHOD OF MANUFACTURING SEMICONDUCTOR DEVICE

TECHNICAL FIELD

The present disclosure relates to a method of manufacturing a semiconductor device. More particularly, the present disclosure relates to a method of manufacturing a semiconductor device in which a semiconductor chip is connected to a wiring pattern by flip-chip bonding and the semiconductor device has an almost equal size to a size of the semiconductor chip as seen on a plane.

RELATED ART

Related-art semiconductor devices include a semiconductor device which is referred to as a chip size package having an almost equal size to a size of a semiconductor chip as seen on a plane (for example, see FIG. 1).

FIG. 1 is a sectional view showing the related-art semiconductor device.

With reference to FIG. 1, a related-art semiconductor device 200 has a semiconductor chip 201, an internal connecting terminal 202, a resin layer 203, a wiring pattern 204, a solder resist layer 206, and an external connecting terminal 207.

The semiconductor chip 201 has a semiconductor substrate 210 to be a thin plate, a semiconductor integrated circuit 211, a plurality of electrode pads 212, and a protective film 213. The semiconductor integrated circuit 211 is provided on a surface 210A side of the semiconductor substrate 210. The semiconductor integrated circuit 211 is constituted by a diffusion layer, an insulating layer, a via and a wiring which are not shown. The electrode pads 212 are provided on the semiconductor integrated circuit 211. The electrode pads 212 are electrically connected to the wiring and the via (not shown) which are provided in the semiconductor integrated circuit 211. The protective film 213 is provided on the semiconductor integrated circuit 211. The protective film 213 serves to protect the semiconductor integrated circuit 211.

The internal connecting terminal 202 is provided on the electrode pad 212. Consequently, the internal connecting terminal 202 is electrically connected to the semiconductor integrated circuit 211. A surface 202A (an upper surface) of the internal connecting terminal 202 is constituted on almost the level with an upper surface 203A of the resin layer 203. The surface 202A of the internal connecting terminal 202 is almost flat. An upper end of the internal connecting terminal 202 is provided in contact with the wiring pattern 204. The resin layer 203 is provided on a surface of the semiconductor substrate 201 at a side on which the internal connecting terminal 202 is provided to cover a side surface of the internal connecting terminal 202.

The wiring pattern 204 is provided on the surface 202A of the internal connecting terminal 202 and an upper surface 203A of the resin layer 203. Consequently, the wiring pattern 204 is electrically connected to the internal connecting terminal 202. The wiring pattern 204 has an external connecting terminal providing region 204A in which an external connecting terminal 207 is provided. The solder resist layer 206 is provided on the upper surface 203A of the resin layer 203 to cover the wiring pattern 204 in a portion in which the external connecting terminal providing region 204A is excluded. The solder resist layer 206 has an opening portion for exposing an upper surface of the external connecting terminal providing region 204A.

The external connecting terminal 207 is provided in the external connecting terminal providing region 204A. The external connecting terminal 207 serves to mount the semiconductor device 200 on a mounting board (not shown) such as a mother board.

FIGS. 2 to 9 are views showing a process for manufacturing the related-art semiconductor device. In FIGS. 2 to 9, the same components as those in the related-art semiconductor device 200 have the same reference numerals.

With reference to FIGS. 2 to 9, description will be given to a method of manufacturing the related-art semiconductor device. First of all, at a step shown in FIG. 2, there is formed a semiconductor chip 201 having a semiconductor integrated circuit 211, a plurality of electrode pads 212, and a protective film 213 on the surface 210A side of the semiconductor substrate 210 which has not been formed into a thin plate.

At a step shown in FIG. 3, next, an internal connecting terminal 202 is formed on the electrode pads 212. In this stage, the internal connecting terminals 202 have a variation in heights.

At a step shown in FIG. 4, subsequently, a resin layer 203 covering the internal connecting terminal 202 is formed on the electrode pad 212 and the protective film 213 at a side on which the internal connecting terminal 202 is provided. Then, a metal layer 215 is formed on an upper surface 203A of the resin layer 203. The metal layer 215 is a member changed into a wiring pattern 204 by patterning at a step shown in FIG. 6 which will be described below.

At a step shown in FIG. 5, then, the metal layer 215 is pressed to cause a lower surface of the metal layer 215 to come in contact with an upper end of the internal connecting terminal 202 in a state in which the structure shown in FIG. 4 is heated. Consequently, the metal layer 215 and the internal connecting terminal 202 are electrically connected to each other and an almost flat surface 202A is formed on an upper end of the internal connecting terminal 202. Moreover, the surface 202A of the internal connecting terminal 202 is formed on almost the level with an upper surface 203A of the resin layer 203.

Thus, the metal layer 215 is pressed to come in contact with the internal connecting terminals 202. Consequently, there are not required a step of causing the heights of the internal connecting terminals 202 to be uniform and a polishing step of exposing the upper ends of the internal connecting terminals 202 from the resin layer 203. Therefore, it is possible to reduce a manufacturing cost of the semiconductor device 200.

At a step shown in FIG. 6, thereafter, the metal layer 215 illustrated in FIG. 5 is subjected to the patterning to form the wiring pattern 204. At a step shown in FIG. 7, next, a solder resist layer 206 is formed to cover the wiring pattern 204 on the upper surface 203A of the resin layer 203 in a portion excluding the external connecting terminal providing region 204A.

At a step shown in FIG. 8, subsequently, the semiconductor substrate 210 is polished from a back side of the semiconductor substrate 210 and is thus formed into a thin plate. At a step shown in FIG. 9, then, an external connecting terminal 207 is formed in the external connecting terminal providing region 204A. Consequently, a semiconductor device 200 is manufactured (for example, see Patent Document 1).

[Patent Document 1] Japanese Patent Unexamined Publication No. 10-335528

FIG. 10 is a sectional view for explaining a problem of the method of manufacturing the related-art semiconductor device. In FIG. 10, the same components as those in the related-art semiconductor device 200 have the same reference numerals.

In the method of manufacturing the related-art semiconductor device 200, however, the surface 202A (the upper surface) of the internal connecting terminal 202 and the lower surface of the wiring pattern 204 are provided in contact with each other. Consequently, the internal connecting terminal 202 and the wiring pattern 204 are electrically connected to each other. For this reason, in the case in which the resin layer 203 is deformed (more specifically, the case in which the resin layer 203 is swollen by an influence of water or heat), for example, the wiring pattern 204 is moved upward from the internal connecting terminal 202 together with the upper surface 203A of the resin layer 203 as shown in FIG. 10. Consequently, there is a problem in that the wiring pattern 204 is separated from the internal connecting terminal 202 and an electrical connecting reliability between the internal connecting terminal 202 and the wiring pattern 204 cannot be ensured.

SUMMARY

Exemplary embodiments of the present invention provide a method of manufacturing a semiconductor device which can sufficiently ensure an electrical connecting reliability between a wiring pattern to which an internal connecting terminal is to be connected, and the internal connecting terminal.

A first aspect of the invention is directed to a method of manufacturing a semiconductor device including a semiconductor substrate, a plurality of semiconductor chips formed on the semiconductor substrate, the semiconductor chips each having an electrode pad, an internal connecting terminal provided on the electrode pad, and a wiring pattern which is electrically connected to the internal connecting terminal, comprising:

a resin layer forming step of forming a resin layer to cover the semiconductor chips at a side on which the internal connecting terminal is provided and the internal connecting terminal;

a metal layer forming step of forming at least one metal layer on an upper surface of the resin layer;

a contact step of pressing the metal layer to cause the metal layer to come in contact with the internal connecting terminal;

a bonding step of bonding the metal layer in a portion provided in contact with the internal connecting terminal to the internal connecting terminal in a portion provided in contact with the metal layer after the contact step; and a wiring pattern forming step of patterning the metal layer to form the wiring pattern after the bonding step.

According to the invention, the metal layer (a base material of the wiring pattern) formed on the upper surface of the resin layer is pressed to cause the metal layer to come in contact with the internal connecting terminal, and the metal layer in the portion provided in contact with the internal connecting terminal and the internal connecting terminal in the portion provided in contact with the metal layer are then bonded to each other. Also in the case in which the resin layer is deformed (for example, the case in which the resin layer is swollen by an influence of water or heat), consequently, bonding portions of the internal connecting terminal and the metal layer (a metal layer in a corresponding portion to the wiring pattern) are prevented from being separated from each other.

Therefore, it is possible to sufficiently ensure an electrical connecting reliability between the internal connecting terminal and the wiring pattern.

A second aspect of the invention is directed to a method of manufacturing a semiconductor device including a semiconductor substrate, a plurality of semiconductor chips formed on the semiconductor substrate, the semiconductor chips each having an electrode pad, an internal connecting terminal provided on the electrode pad, and a wiring pattern which is electrically connected to the internal connecting terminal, comprising:

a resin layer forming step of forming a resin layer to cover the semiconductor chips at a side on which the internal connecting terminal is provided and the internal connecting terminal;

a metal layer forming step of forming a metal layer on an upper surface of the resin layer;

a contact step of pressing the metal layer to cause the metal layer to come in contact with the internal connecting terminal;

a wiring pattern forming step of patterning the metal layer to form the wiring pattern after the contact step; and a bonding step of bonding the wiring pattern in a portion provided in contact with the internal connecting terminal to the internal connecting terminal in a portion provided in contact with the wiring pattern after the wiring pattern forming step.

According to the invention, the metal layer formed on the upper surface of the resin layer is pressed to cause the metal layer to come in contact with the internal connecting terminal, the metal layer is then subjected to the patterning to form the wiring pattern, and the wiring pattern in the portion provided in contact with the internal connecting terminal and the internal connecting terminal in the portion provided in contact with the metal layer are thereafter bonded to each other. Also in the case in which the resin layer is deformed (for example, the case in which the resin layer is swollen by an influence of water or heat), consequently, bonding portions of the internal connecting terminal and the wiring pattern are prevented from being separated from each other. Therefore, it is possible to sufficiently ensure an electrical connecting reliability between the internal connecting terminal and the wiring pattern.

A third aspect of the invention is directed to the method of manufacturing a semiconductor device according to the first aspect of the invention, wherein in the metal layer forming step, a first metal layer and a second metal layer are sequentially provided on the upper surface of the resin layer, wherein in the contact step, the second metal layer is pressed to cause the first metal layer to come in contact with the internal connecting terminal, wherein in the bonding step, the first metal layer in a portion provided in contact with the internal connecting terminal is bonded to the internal connecting terminal in a portion provided in contact with the first metal layer after the contact step, wherein in the wiring pattern forming step, the etching over the first metal layer is carried out to form the wiring pattern, and wherein the method of manufacturing a semiconductor device further comprises a connecting pad forming step of carrying out etching over the second metal layer to form a connecting pad.

According to the invention, the first metal layer (a base bacterial of the wiring pattern) and the second metal layer (a base material of the connecting pad) are sequentially provided on the resin layer, and the second metal layer is subsequently pressed to cause the first metal layer to come in contact with the internal connecting terminal, and the first metal layer in the portion provided in contact with the internal connecting terminal and the internal connecting terminal in the portion provided in contact with the first metal layer are then bonded to each other. Also in the case in which the resin layer is deformed (for example, the case in which the resin layer is swollen by an influence of water or heat), consequently, bonding portions of the internal connecting terminal and the wiring pattern are prevented from being separated from each other. Therefore, it is possible to sufficiently ensure an electrical connecting reliability between the internal connecting terminal and the wiring pattern.

A fourth aspect of the invention is directed to the method of manufacturing a semiconductor device according to the third aspect of the invention, further comprising:

a protective layer forming step of forming a protective layer for protecting the second metal layer on the second metal layer; and a protective layer removing step of removing the protective layer after the contact step, wherein in the contact step, the protective layer is pressed to cause the first metal layer to come in contact with the internal connecting terminal.

According to the invention, the first metal layer (a base bacterial of the wiring pattern), the second metal layer (a base material of the connecting pad) and the protective layer for protecting the second metal layer are sequentially provided on the resin layer, and the protective layer is subsequently pressed to cause the first metal layer to come in contact with the internal connecting terminal, and the first metal layer in the portion provided in contact with the internal connecting terminal and the internal connecting terminal in the portion provided in contact with the first metal layer are then bonded to each other. Also in the case in which the resin layer is deformed (for example, the case in which the resin layer is swollen by an influence of water or heat), consequently, bonding portions of the internal connecting terminal and the wiring pattern are prevented from being separated from each other. Therefore, it is possible to sufficiently ensure an electrical connecting reliability between the internal connecting terminal and the wiring pattern.

Moreover, the second metal layer is pressed through the protective layer provided on the second metal layer. Consequently, it is possible to prevent the second metal layer from being damaged at the contact step.

A fifth aspect of the invention is directed to the method of manufacturing a semiconductor device according to the third aspect of the invention, wherein in the metal layer forming step, the first metal layer, the second metal layer and a third metal layer are sequentially provided on the upper surface of the resin layer, wherein in the contact step, the third metal layer is pressed to cause the first metal layer to come in contact with the internal connecting terminal, and wherein the method of manufacturing a semiconductor device further comprises a metal post forming step of carrying out etching over the third metal layer to form a metal post.

According to the invention, the first metal layer (a base material of the wiring pattern), the second metal layer (a base material of the connecting pad) and the third metal layer (a base material of the metal post) are sequentially provided on the resin layer, and the third metal layer is subsequently pressed to cause the first metal layer to come in contact with the internal connecting terminal, and the first metal layer in a portion provided in contact with the internal connecting terminal and the internal connecting terminal in a portion pro- vided in contact with the first metal layer are then bonded to each other. Also in the case in which the resin layer is deformed (for example, the case in which the resin layer is swollen by an influence of water or heat), consequently, bonding portions of the internal connecting terminal and the wiring pattern are prevented from being separated from each other. Therefore, it is possible to sufficiently ensure an electrical connecting reliability between the internal connecting terminal and the wiring pattern.

Moreover, the third metal layer is subjected to the etching to form the metal post after the bonding step, and the second metal layer is then subjected to the etching to form the connecting pad. Consequently, the metal post is disposed on the connecting pad. Therefore, it is possible to relieve a stress applied to the external connecting terminal in the case in which the external connecting terminal to be connected to a mounting board such as a mother board is provided on the metal post, for example.

According to the invention, it is possible to sufficiently ensure an electrical connecting reliability between the wiring pattern to which the internal connecting terminal is to be connected and the internal connecting terminal.

DETAILED DESCRIPTION

Next, embodiments according to the invention will be described with reference to the drawings.

First Embodiment

Figure 1:
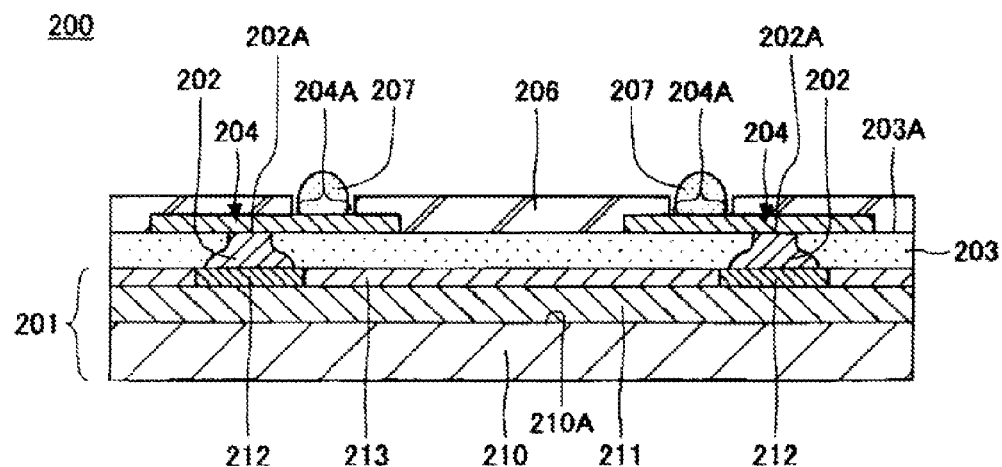
FIG. 1 is a sectional view showing a related-art semiconductor device.
Figure 2:
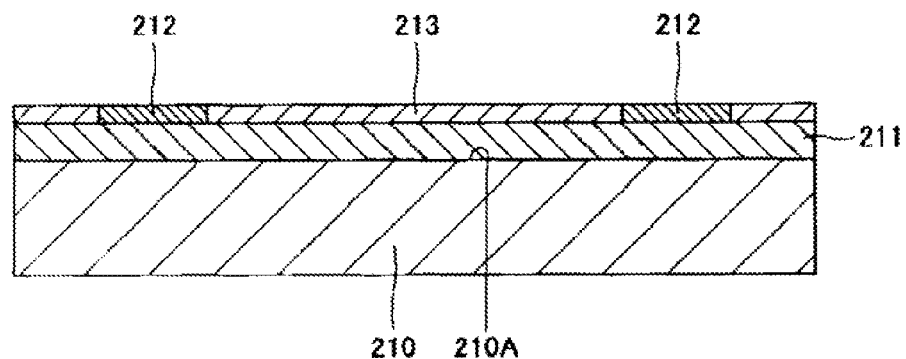
FIG. 2 is a view (No. 1) showing a step of manufacturing the related-art semiconductor device.
Figure 3:
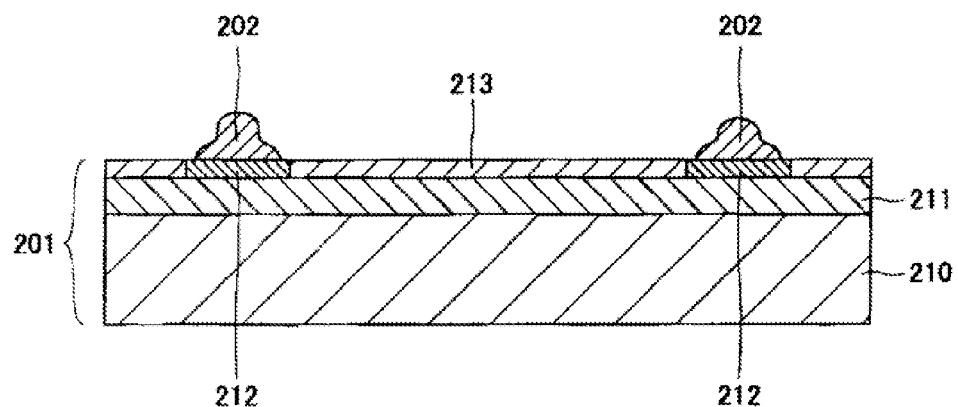
FIG. 3 is a view (No. 2) showing a step of manufacturing the related-art semiconductor device.
Figure 4:
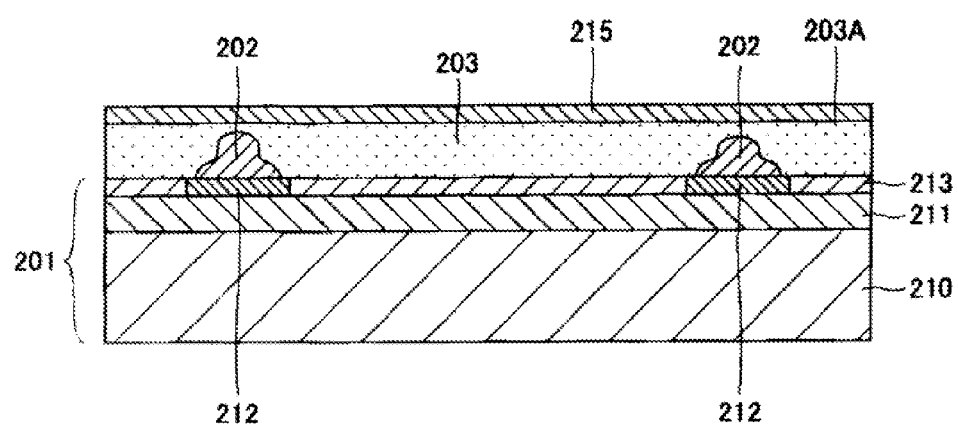
FIG. 4 is a view (No. 3) showing a step of manufacturing the related-art semiconductor device.
Figure 5:
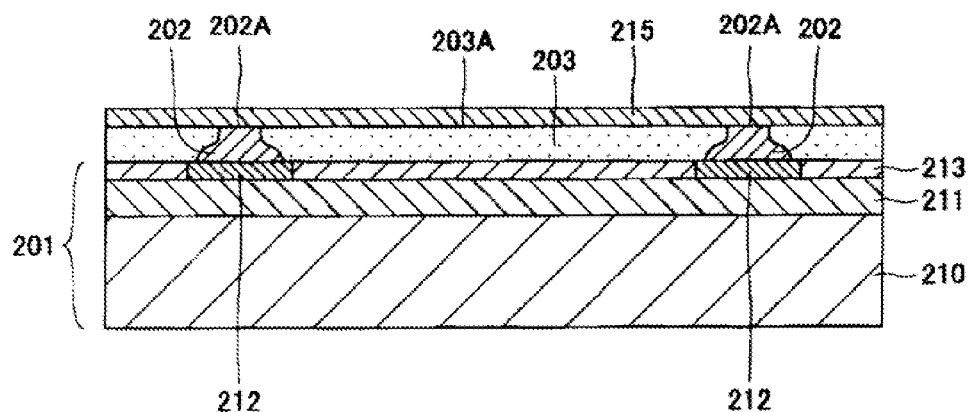
FIG. 5 is a view (No. 4) showing a step of manufacturing the related-art semiconductor device.
Figure 6:
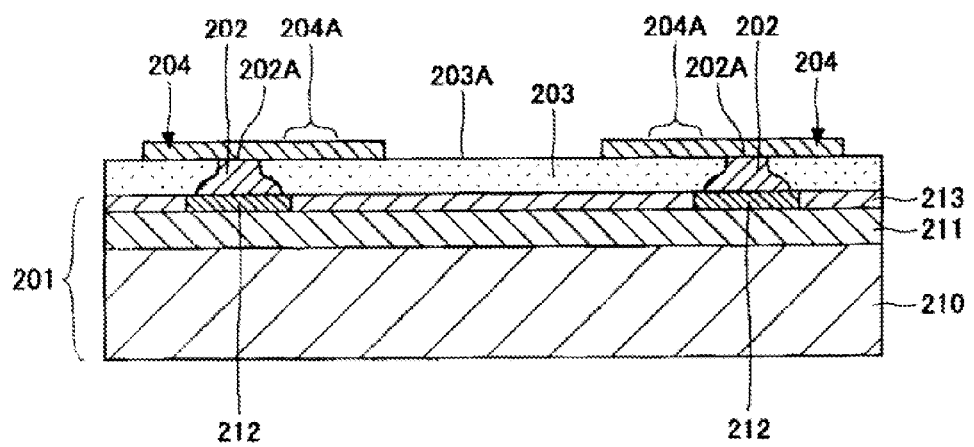
FIG. 6 is a view (No. 5) showing a step of manufacturing the related-art semiconductor device.
Figure 7:
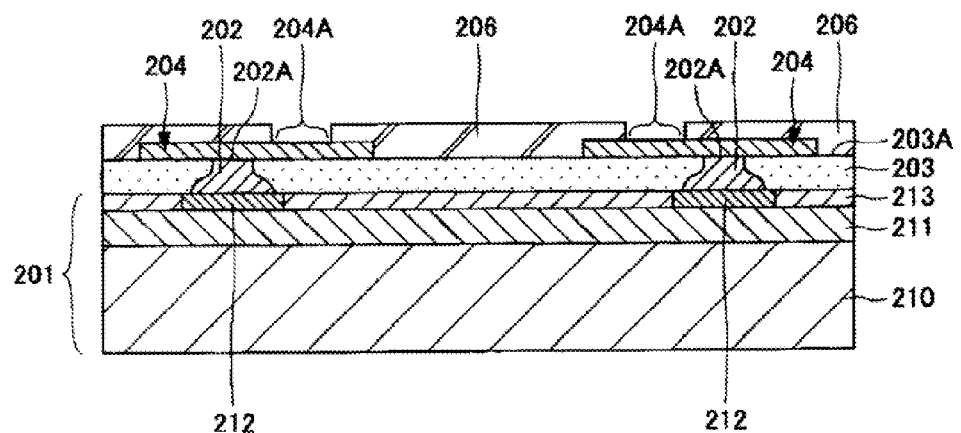
FIG. 7 is a view (No. 6) showing a step of manufacturing the related-art semiconductor device.
Figure 8:
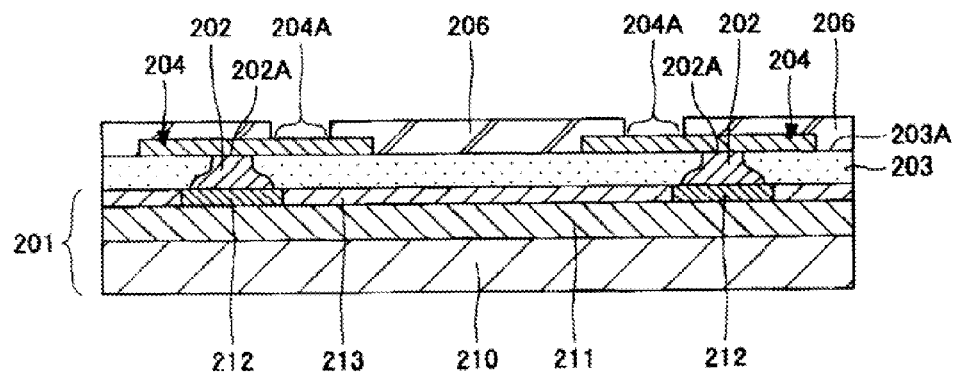
FIG. 8 is a view (No. 7) showing a step of manufacturing the related-art semiconductor device.
Figure 9:
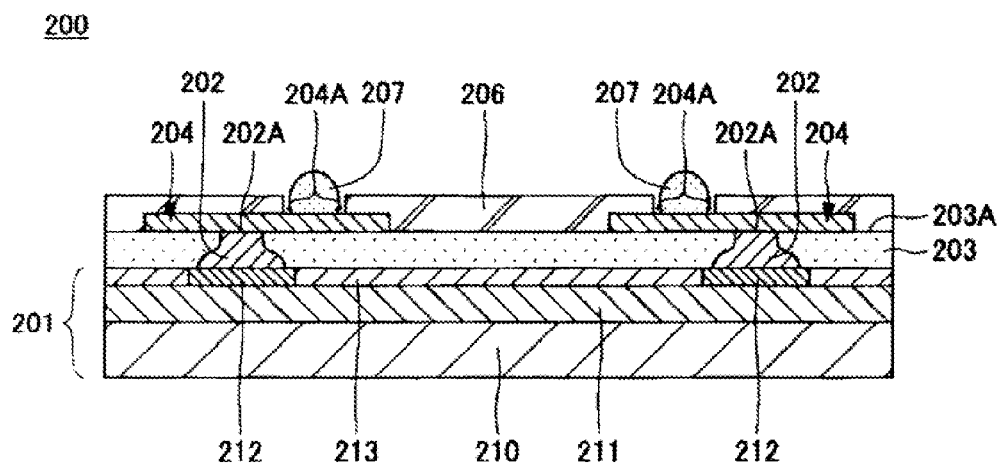
FIG. 9 is a view (No. 8) showing a step of manufacturing the related-art semiconductor device.
Figure 10:
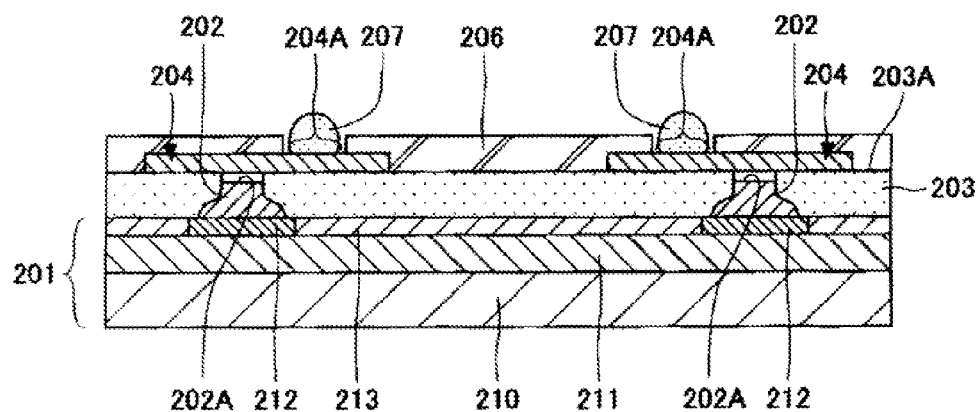
FIG. 10 is a sectional view for explaining a problem of a method of manufacturing the related-art semiconductor device.
Figure 11:
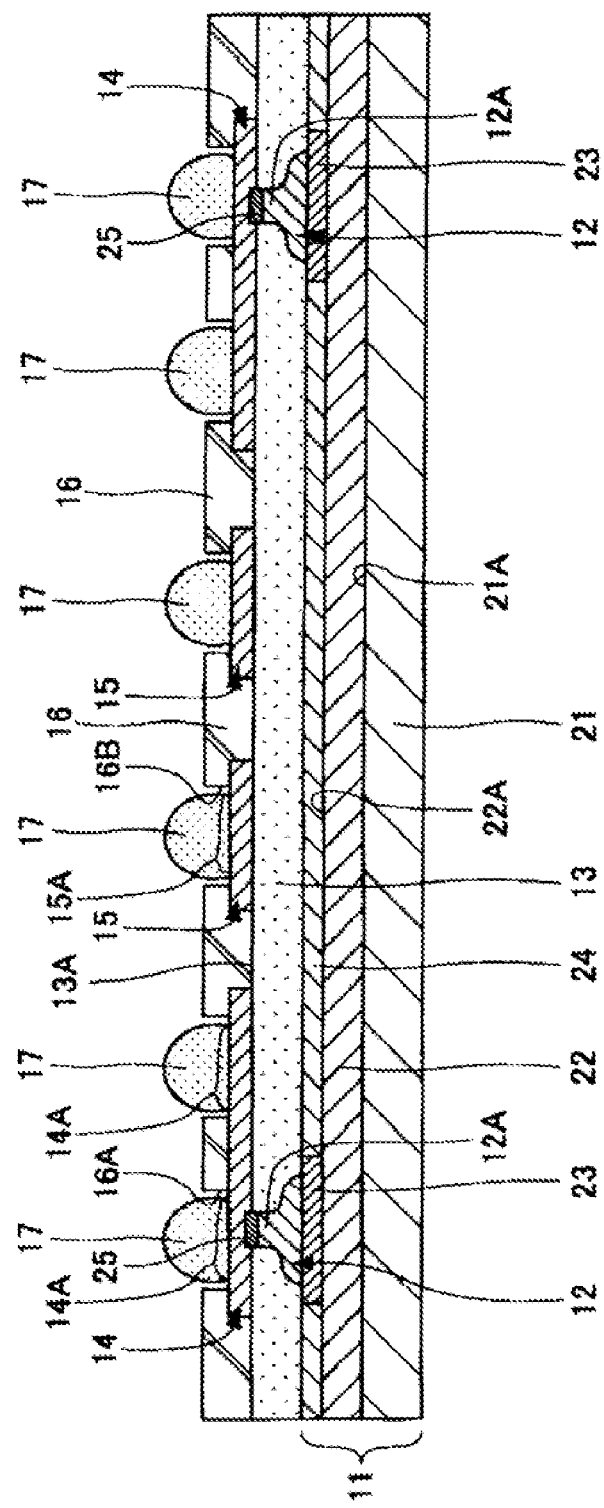
FIG. 11 is a sectional view showing a semiconductor device according to a first embodiment of the invention.
Figure 12:
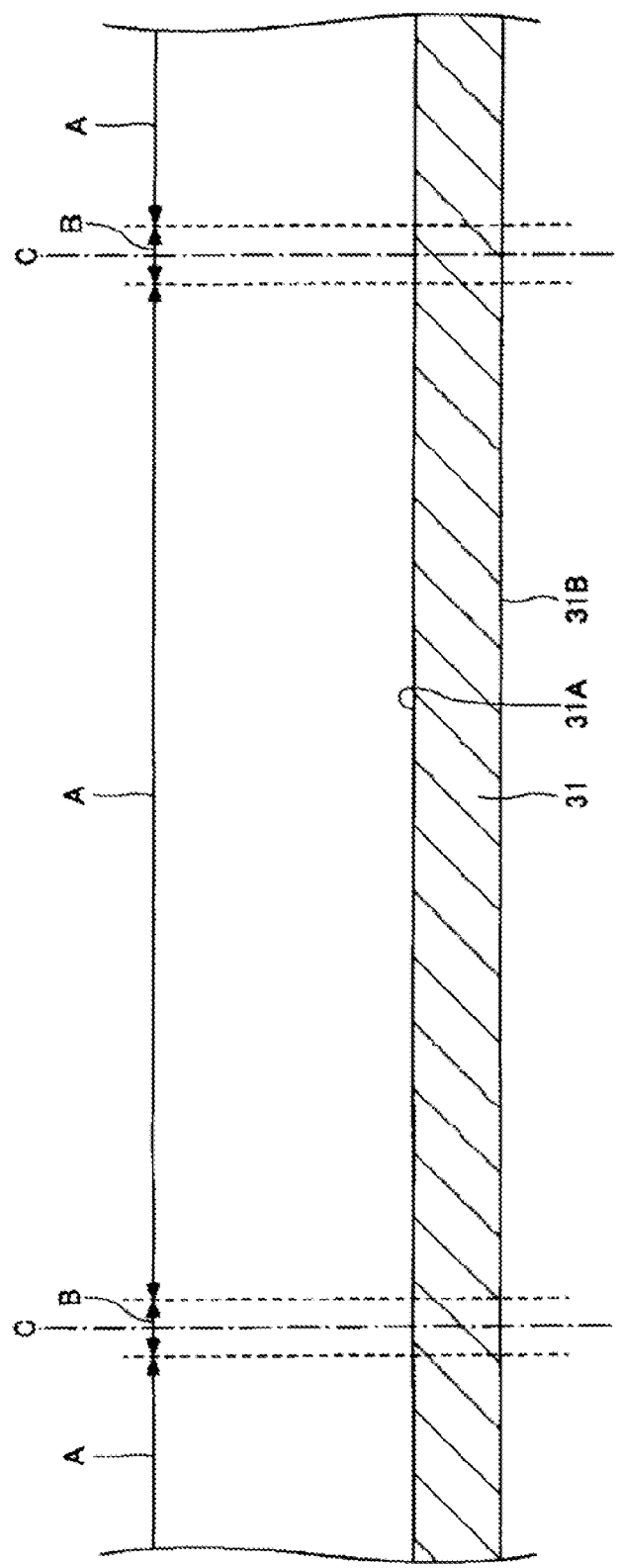
FIG. 12 is a view (No. 1) showing a step of manufacturing the semiconductor device according to the first embodiment of the invention.

FIG. 11 is a sectional view showing a semiconductor device according to a first embodiment of the invention.

With reference to FIG. 11, a semiconductor device 10 according to the first embodiment includes a semiconductor chip 11, an internal connecting terminal 12, a resin layer 13, wiring patterns 14 and 15, a solder resist layer 16, and an external connecting terminal 17.

The semiconductor chip 11 has a semiconductor substrate 21, a semiconductor integrated circuit 22, an electrode pad 23, and a protective film 24. The semiconductor substrate 21 serves to form the semiconductor integrated circuit 22. The semiconductor substrate 21 is formed into a thin plate. The semiconductor substrate 21 can be set to have a thickness of 200 μm to 300 μm, for example. As the semiconductor substrate 21, it is possible to use a silicon wafer which is formed into a thin plate and is divided into individual pieces, for example.

The semiconductor integrated circuit 22 is formed on a surface 21A side of the semiconductor substrate 21. The semiconductor integrated circuit 22 is constituted by a diffusion layer (not shown) formed on the semiconductor substrate 21, a plurality of insulating layers (not shown) provided on the surface 21A of the semiconductor substrate 21, and a via (not shown) and a wiring (not shown) which are provided on the plurality of insulating layers.

The plurality of electrode pads 23 is provided on the semiconductor integrated circuit 22. The electrode pad 23 is electrically connected to a wiring (not shown) and a via (not shown) which are provided in the semiconductor integrated circuit 22. As a material of the electrode pad 23, it is possible to use Al, for example.

The protective film 24 is provided on a surface 22A of the semiconductor integrated circuit 22 (a surface of the semiconductor integrated circuit 22 which is positioned on an opposite side to a surface provided in contact with the semiconductor substrate 21). The protective film 24 serves to protect the semiconductor integrated circuit 22. As the protective film 24, it is possible to use an insulating film, for example. As the insulating film serving as the protective film 24, it is possible to use an SiN film or a PSG film, for example.

The internal connecting terminal 12 is provided on the electrode pad 23 and is electrically connected to the semiconductor integrated circuit 22. The internal connecting terminal 12 serves to electrically connect the semiconductor integrated circuit 22 and the wiring pattern 14 to each other. An upper end 12A of the internal connecting terminal 12 is electrically connected to the wiring pattern 14 through an alloy layer 25.

The alloy layer 25 is formed when the internal connecting terminal 12 and the wiring pattern 14 are caused to come in contact with each other and the upper end 12A of the internal connecting terminal 12 and the lower part of the wiring pattern 14 are bonded to each other by at least one method of a group including a laser welding method, an ultrasonic welding method and a resistance welding method. The alloy layer 25 is an alloy of a metallic material constituting the internal connecting terminal 12 and a metallic material constituting the wiring pattern 14. As the alloy layer 25, it is possible to use a Cu—Au alloy layer having a great bonding force, for example. In the case in which the Cu—Au alloy layer is used as the alloy layer 25, a thickness of the alloy layer 25 can be set to be 0.5 µm to 1.0 µm, for example.

Thus, the internal connecting terminal 12 and the wiring pattern 14 are electrically connected to each other through the alloy layer 25 formed by the metallic material constituting the internal connecting terminal 12 and the metallic material constituting the wiring pattern 14. Also in the case in which the resin layer 13 is deformed (for example, the case in which the resin layer 13 is swollen by an influence of water or heat), consequently, bonding portions of the internal connecting terminal 12 and the wiring pattern 14 (more specifically, the alloy layer 25 and the internal connecting terminal 12 and the wiring pattern 14 in portions provided in contact with the alloy layer 25) are prevented from being separated from each other. Therefore, it is possible to sufficiently ensure (enhance) an electrical connecting reliability between the internal connecting terminal 12 and the wiring pattern 14.

As the internal connecting terminal 12, it is possible to use an Au bump, an Au plated film, and a metallic laminated film constituted by a Ni film formed by an electroless plating method and an Au film covering the Ni film, for example. The Au bump can be formed by a bonding method or a plating method, for example. A height of the internal connecting terminal 12 can be set to be 10 µm to 60 µm, for example.

In the case in which Au is used as the metallic material constituting the internal connecting terminal 12, it is preferable to use Cu as the metallic material constituting the wiring pattern 14, for example.

By using the Au as the metallic material constituting the internal connecting terminal 12 and using the Cu as the metallic material constituting the wiring pattern 14, thus, it is possible to form the Cu—Au alloy layer having a great bonding force as the alloy layer 25 between the internal connecting terminal 12 and the wiring pattern 14.

The resin layer 13 is provided on an upper surface of the semiconductor chip 11 (more specifically, upper surfaces of the electrode pad 23 and the protective film 24) to cover a side surface of the internal connecting terminal 12. As the resin layer 13, it is possible to use an insulating resin layer or an anisotropic conductive resin layer, for example. In the case in which the insulating resin layer is used as the resin layer 13, it is possible to use, as the insulating resin layer, a sheet-like resin layer having an adhesiveness (for example, an NCF (Non Conductive Film)) or a paste-like resin layer (for example, an NCP (Non Conductive Paste)), for instance. In this case, a thickness of the resin layer 13 can be set to be 10 µm to 60 µm, for example.

In the case in which the anisotropic conductive resin layer is used as the resin layer 13, it is possible to use, as the anisotropic conductive resin layer, a sheet-like anisotropic conductive resin layer having an adhesiveness (for example, an ACF (Anisotropic Conductive Film)) or a paste-like anisotropic conductive resin layer (for example, an ACP (Anisotropic Conductive Paste)), for instance. In this case, the thickness of the resin layer 13 can be set to be 20 µm to 100 µm, for example. The ACP and the ACF are obtained by dispersing a resin taking a shape of a ball having a small diameter and covering an Ni/Au laminated film into an insulating resin containing an epoxy type resin as a base, and has an electrical conductivity in a vertical direction and has an insulating property in a horizontal direction.

The wiring pattern 14 is provided on an upper surface 13A of the resin layer 13 and is electrically connected to the internal connecting terminal 12 through the alloy layer 25. The wiring pattern 14 has an external connecting terminal providing region 14A in which the external connecting terminal 17 is provided. As a material of the wiring pattern 14, it is possible to use Cu, for example. In this case, a thickness of the wiring pattern 14 can be set to be 12 µm, for example.

The wiring pattern 15 is provided on the upper surface 13A of the resin layer 13. The wiring pattern 15 has an external connecting terminal providing region 15A in which the external connecting terminal 17 is provided. As a material of the wiring pattern 15, it is possible to use Cu, for example. In this case, a thickness of the wiring pattern 15 can be set to be 12 µm, for example.

The solder resist layer 16 is provided on the upper surface 13A of the resin layer 13 to cover the wiring patterns 14 and 15 in portions excluding the external connecting terminal providing regions 14A and 15A. The solder resist layer 16 has an opening portion 16A for exposing the external connecting terminal providing region 14A and an opening portion 16B for exposing the external connecting terminal providing region 15A.

The external connecting terminal 17 is provided in the external connecting terminal providing regions 14A and 15A of the wiring patterns 14 and 15. The external connecting terminal 17 is electrically connected to a pad (not shown) provided on a mounting board such as a mother board (not shown) As the external connecting terminal 17, it is possible to use a solder bump, for example.

According to the semiconductor device in accordance with the embodiment, the internal connecting terminal 12 and the wiring pattern 14 are electrically connected to each other through the alloy layer 25 formed by the metallic material constituting the internal connecting terminal 12 and the metallic material constituting the wiring pattern 14. Also in the case in which the resin layer 13 is deformed (for example, the case in which the resin layer 13 is swollen by the influence of water or heat), consequently, the bonding portions of the internal connecting terminal 12 and the wiring pattern 14 (more specifically, the alloy layer 25 and the internal connecting terminal 12 and the wiring pattern 14 in the portions provided in contact with the alloy layer 25) are prevented from being separated from each other. Therefore, it is possible to sufficiently ensure an electrical connecting reliability between the internal connecting terminal 12 and the wiring pattern 14.

FIGS. 12 to 23 are views showing a process for manufacturing the semiconductor device according to the first embodiment of the invention. Moreover, FIG. 24 is a plan view showing a semiconductor substrate in which a plurality of semiconductor devices is formed. In FIGS. 12 to 24, the same components as those in the semiconductor device 10 according to the first embodiment have the same reference numerals. In FIGS. 12 to 24, furthermore, C denotes a position in which a dicer cuts a semiconductor substrate 31 (which will be hereinafter referred to as a "cutting position C").

With reference to FIGS. 12 to 24, description will be given to a method of manufacturing the semiconductor device 10 according to the first embodiment. First of all, at a step shown in FIG. 12, there is prepared a semiconductor substrate 31 having a plurality of semiconductor device forming regions A and a scribe region B for separating the semiconductor device forming regions A (see FIG. 24). In the semiconductor device forming region A, the semiconductor device 10 is formed. The semiconductor substrate 31 is not formed into a thin plate in this stage and a thickness of the semiconductor substrate 31 can be set to be 500 μm to 775 μm, for example. The semiconductor substrate 31 is formed into a thin plate at a step shown in FIG. 21 which will be described below, and is then cut along the cutting position C at a step shown in FIG. 23 which will be described below, and is thus formed into a plurality of semiconductor substrates 21 (see FIG. 11). As the semiconductor substrate 31, it is possible to use a silicon wafer, for example.

Figure 13:
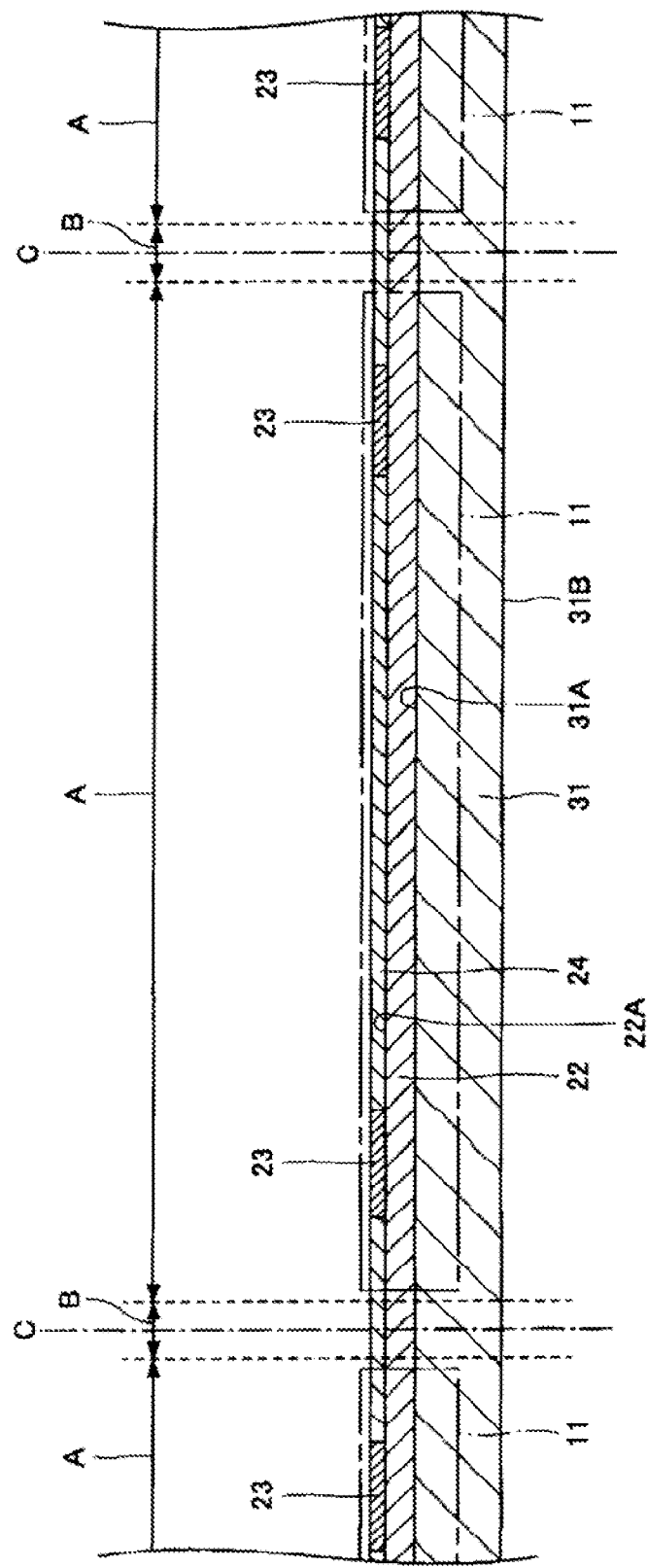
FIG. 13 is a view (No. 2) showing a step of manufacturing the semiconductor device according to the first embodiment of the invention.

At a step shown in FIG. 13, subsequently, a semiconductor chip 11 having a semiconductor integrated circuit 22, an electrode pad 23 and a protective film 24 is formed on a surface 31A side of the semiconductor substrate 31 in a corresponding portion to the semiconductor device forming region A by a well-known technique. Consequently, a plurality of semiconductor chips 11 is formed in the semiconductor substrate 31. As a material of the electrode pad 23, it is possible to use Al, for example. As the protective film 24, it is possible to use an insulating film, for example. As the insulating film serving as the protective film 24, it is possible to use an SiN film or a PSG film, for example.

Figure 14:
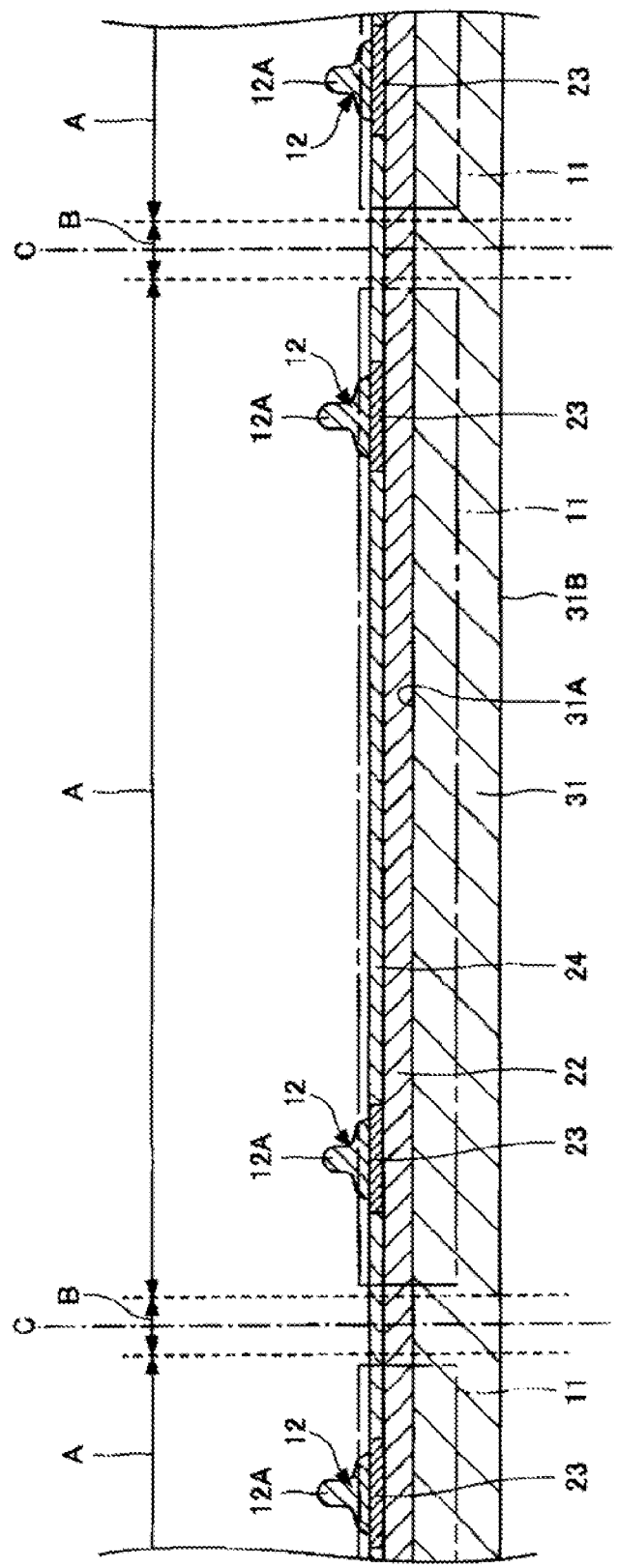
FIG. 14 is a view (No. 3) showing a step of manufacturing the semiconductor device according to the first embodiment of the invention.

At a step shown in FIG. 14, subsequently, an internal connecting terminal 12 is formed on the electrode pads 23 of the semiconductor chips 11, respectively. As the internal connecting terminal 12, it is possible to use an Au bump, an Au plated film and a metal laminated film constituted by an Ni film formed by an electroless plating method and an Au film covering the Ni film. The Au bump can be formed by a bonding method or a plating method, for example. A height of the internal connecting terminal 12 can be set to be 10 μm to 60 μm, for example. The internal connecting terminals 12 formed at the step shown in FIG. 14 have a variation in the height.

Figure 15:
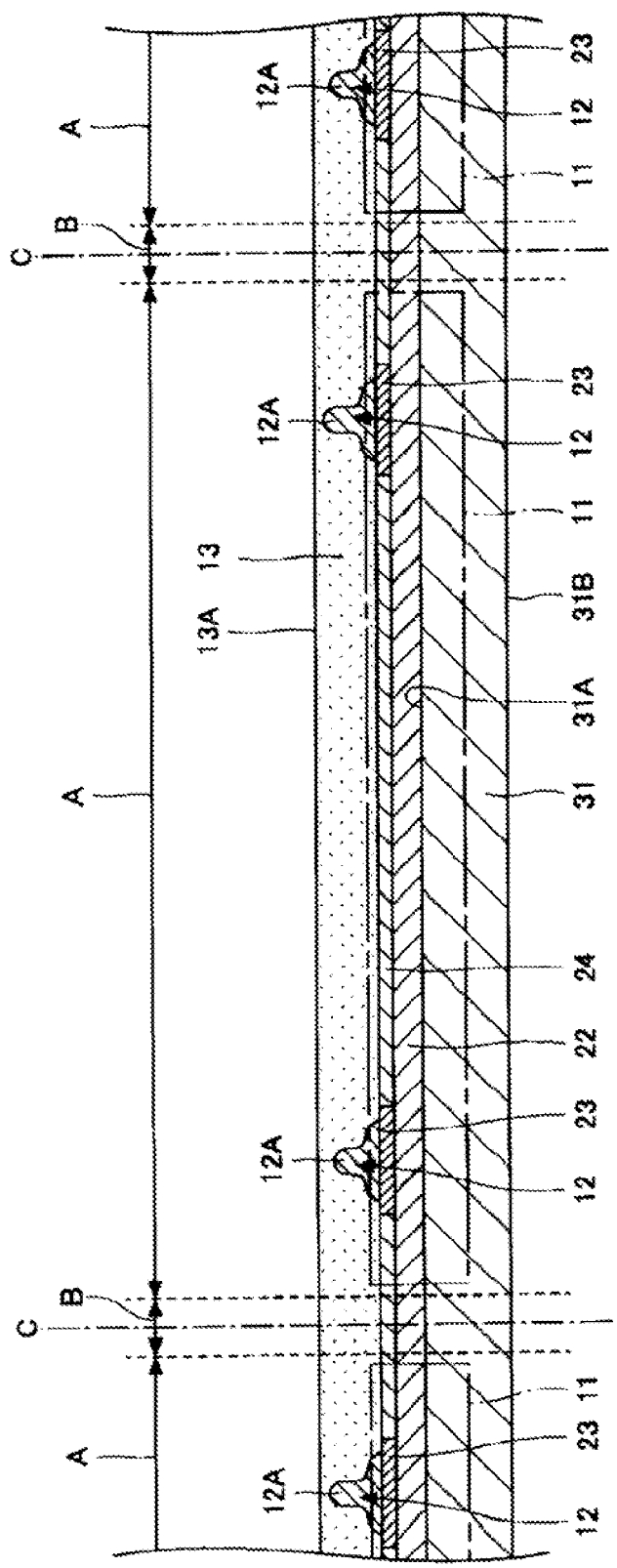
FIG. 15 is a view (No. 4) showing a step of manufacturing the semiconductor device according to the first embodiment of the invention.

At a step shown in FIG. 15, next, a resin layer 13 is formed to cover the semiconductor chips 11 at a side on which the internal connecting terminal 12 is provided (an upper surface side of the semiconductor chips 11) and the internal connecting terminal 12. As the resin layer 13, it is possible to use an insulating resin layer or an anisotropic conductive resin layer, for example. In the case in which the insulating resin layer is used as the resin layer 13, it is possible to use, as the insulating resin layer, a sheet-like resin layer having an adhesiveness (for example, an NCF (Non Conductive Film)) or a paste-like resin layer (for example, an NCP (Non Conductive Paste)), for example. In the case in which the sheet-like insulating resin having an adhesiveness is used, the sheet-like insulating resin is stuck to an upper surface side of the structure shown in FIG. 14 to form the resin layer 13. In the case in which the paste-like insulating resin is used as the resin layer 13, moreover, the paste-like insulating resin is formed on the upper surface side of the structure shown in FIG. 14 by a printing method and is then semicured through prebaking to form the resin layer 13. The insulating resin layer thus semicured has an adhesiveness. In the case in which the insulating resin layer is used as the resin layer 13, a thickness of the resin layer 13 can be set to be 10 μm to 60 μm, for example.

In the case in which the anisotropic conductive resin layer is used as the resin layer 13, it is possible to use, as the anisotropic conductive resin layer, a sheet-like anisotropic conductive resin layer having an adhesiveness (for example, an ACF (Anisotropic Conductive Film)) or a paste-like anisotropic conductive resin layer (for example, an ACP (Anisotropic Conductive Paste)), for instance. The ACP and the ACF are obtained by dispersing a resin taking a shape of a ball having a small diameter and covering an Ni/Au laminated film into an insulating resin containing an epoxy type resin as a base, and has an electrical conductivity in a vertical direction and has an insulating property in a horizontal direction.

In the case in which the paste-like anisotropic conductive resin (for example, the ACP (Anisotropic Conductive Paste)) is used as the resin layer 13, the paste-like anisotropic conductive resin layer is formed by the printing method and is then semicured through prebaking to form the resin layer 13, for example. Moreover, the anisotropic conductive resin layer thus semicured functions as an adhesive. In this case, the thickness of the resin layer 13 can be set to be 20 μm to 200 μm, for example.

By using the anisotropic conductive resin layer as the resin layer 13 which covers the semiconductor chips 11 at a side on which the internal connecting terminal 12 is provided and the internal connecting terminal 12 and on which the wiring patterns 14 and 15 are formed, thus, it is possible to reduce a pressure when pressing a metal layer 33 to be a base material of the wiring patterns 14 and 15 at a step shown in FIG. 17 which will be described below (a contact step). Therefore, it is possible to easily manufacture the semiconductor device 10.

At a step shown in FIG. 16, subsequently, the metal layer 33 is formed on the upper surface 13A of the resin layer 13 (a metal layer forming step). The metal layer 33 is subjected to etching and is thus changed into the wiring patterns 14 and 15 at a step shown in FIG. 19 which will be described below (a wiring pattern forming step). In other words, the metal layer 33 is the base material of the wiring patterns 14 and 15. The metal layer 33 is formed by preparing a metal foil (for example, a Cu foil) and sticking the metal foil to the upper surface 13A of the resin layer 13, for instance. In this case, a thickness of the metal layer 33 can be set to be 10 μm, for example. In the case in which Au is used as the metallic material constituting the internal connecting terminal 12, furthermore, it is preferable to use Cu as a material of the metal layer 33 (the metal foil), for example.

Figure 18:
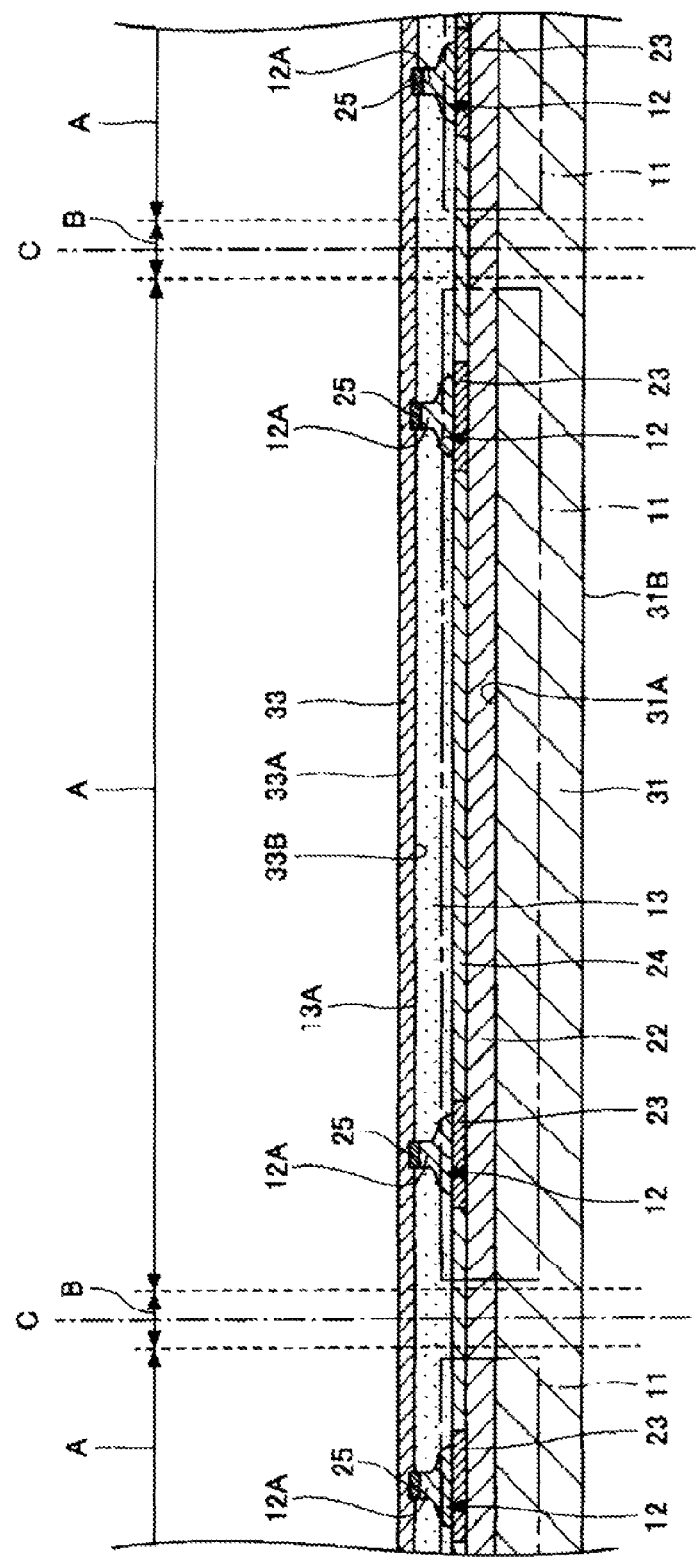
FIG. 18 is a view (No. 7) showing a step of manufacturing the semiconductor device according to the first embodiment of the invention.

By using the Au as the metallic material constituting the internal connecting terminal 12 and using the Cu as the material of the metallic layer 33 (the metal foil), thus, it is possible to form an alloy layer 25 (in this case, a Cu—Au alloy layer) having a great bonding force between the metal layer 33 (the base material of the wiring patterns 14 and 15) and the internal connecting terminal 12 at a step shown in FIG. 18 which will be described below. As compared with the case in which the internal connecting terminal 12 and the wiring pattern 14 are electrically connected to each other through an alloy layer other than the Cu—Au alloy layer, therefore, it is possible to sufficiently enhance an electrical connecting reliability between the internal connecting terminal 12 and the wiring pattern 14.

Figure 16:
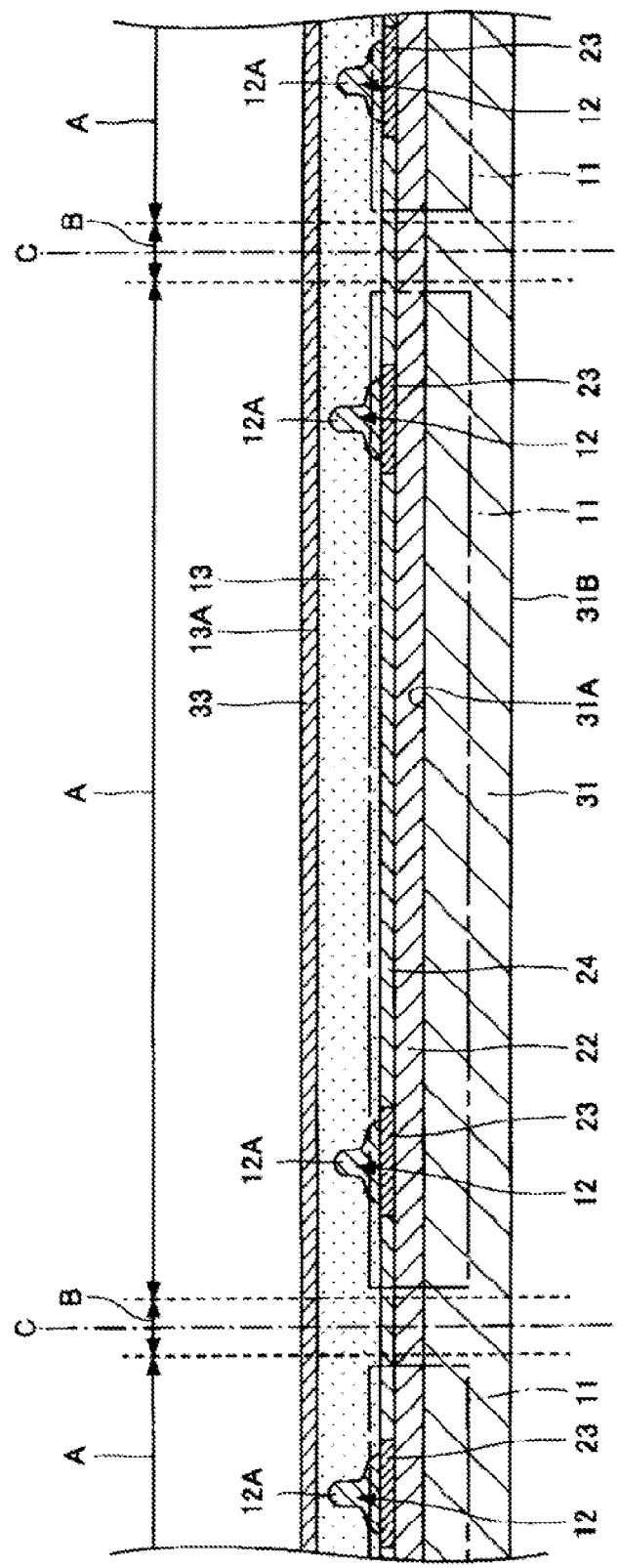
FIG. 16 is a view (No. 5) showing a step of manufacturing the semiconductor device according to the first embodiment of the invention.
Figure 17:
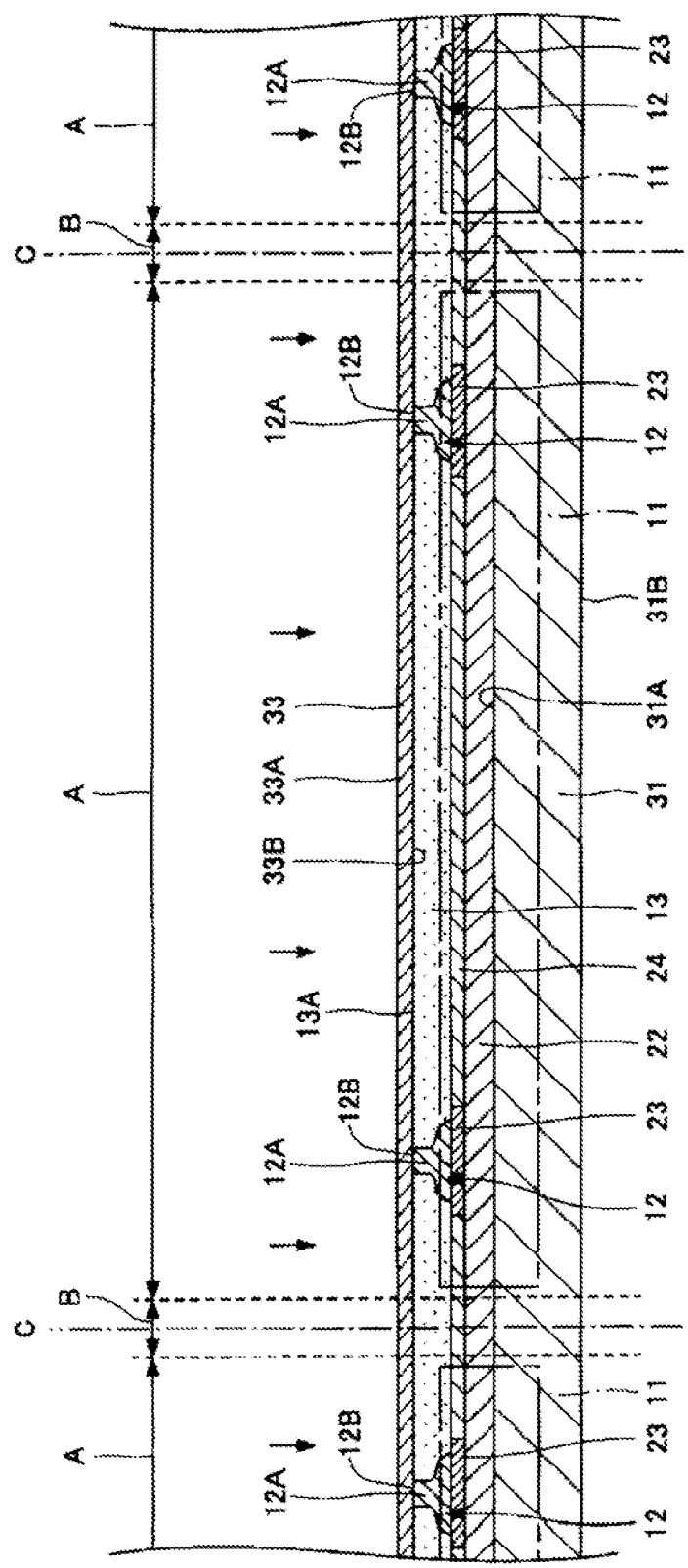
FIG. 17 is a view (No. 6) showing a step of manufacturing the semiconductor device according to the first embodiment of the invention.

At a step shown in FIG. 17, next, the metal layer 33 is pressed from an upper surface 33A side of the metal layer 33 to cause a lower surface 33B of the metal layer 33 to come in contact with upper ends 12A of the internal connecting terminals 12 and upper surfaces 12B to be almost flat surfaces are formed on the internal connecting terminals 12 in portions provided in contact with the lower surface 33B of the metal layer 33 in a state in which the structure shown in FIG. 16 is heated (the contact step). At this time, the structure shown in FIG. 17 is heated so that the resin layer 13 is cured. After the lower surface 33B of the metal layer 33 is caused to come in contact with the internal connecting terminals 12, the thickness of the resin layer 13 can be set to be 10 μm to 60 μm, for example.

Thus, there is not required a step of polishing the resin layer 13 to expose the upper ends of the internal connecting terminals 12 from the resin layer 13. There is also not required a step of forming the metal layer 33 serving as the base material of the wiring patterns 14 and 15 on the upper surface 13A of the resin layer 13 and then pressing the metal layer 33, thereby causing the lower surface 33B of the metal layer 33 to come in contact with the upper ends 12A of the internal connecting terminals 12 and forming the upper surfaces 12B to be almost flat surfaces in the internal connecting terminals 12 to cause the heights of the internal connecting terminals 12 to be uniform. Consequently, it is possible to decrease the number of the steps of manufacturing the semiconductor device 10. Therefore, it is possible to reduce the manufacturing cost of the semiconductor device 10.

At a step shown in FIG. 18, subsequently, the metal layer 33 in the portion provided in contact with the upper end 12A of the internal connecting terminal 12 (the metal layer 33 in the corresponding portion to the wiring pattern 14) is bonded to the upper end 12A of the internal connecting terminal 12 in the portion provided in contact with the lower surface 33B of the metal layer 33 to form the alloy layer 25 in the bonding portions of the internal connecting terminal 12 and the metal layer 33 (a bonding step). At the bonding step, by using at least one method of a group including a laser welding method, an ultrasonic welding method and a resistance welding method, for example, the internal connecting terminal 12 and the metal layer 33 are bonded to each other to form the alloy layer 25 in the bonding portions of the internal connecting terminal 12 and the metal layer 33.

Thus, the metal layer 33 (the base material of the wiring patterns 14 and 15) formed on the upper surface 13A of the resin layer 13 is pressed to cause the lower surface 33B of the metal layer 33 to come in contact with the upper ends 12A of the internal connecting terminals 12 and to then bond the metal layer 33 in the portion provided in contact with the internal connecting terminal 12 (the metal layer 33 in the corresponding portion to the wiring pattern 14) and the upper end 12A of the internal connecting terminal 12 in the portion provided in contact with the metal layer 33 to each other. Also in the case in which the resin layer 13 is deformed (for example, the case in which the resin layer 13 is swollen by an influence of water or heat), consequently, the bonding portions of the internal connecting terminal 12 and the metal layer 33 (the metal layer 33 in the corresponding portion to the wiring pattern 14) are prevented from being separated from each other. Therefore, it is possible to sufficiently ensure an electrical connecting reliability between the internal connecting terminal 12 and the wiring pattern 14.

By using the Au as the metallic material constituting the internal connecting terminal 12 and using the Cu as the material of the metal layer 33, moreover, it is possible to form the alloy layer 25 having a great bonding force (in this case, a Cu—Au alloy layer) between the metal layer 33 in the corresponding portion to the wiring pattern 14 and the internal connecting terminal 12. Therefore, it is possible to further enhance the electrical connecting reliability between the internal connecting terminal 12 and the wiring pattern 14. In the case in which the Cu—Au alloy layer is used as the alloy layer 25, the thickness of the alloy layer can be set to be 0.5 μm to 1.0 μm, for example.

Figure 19:
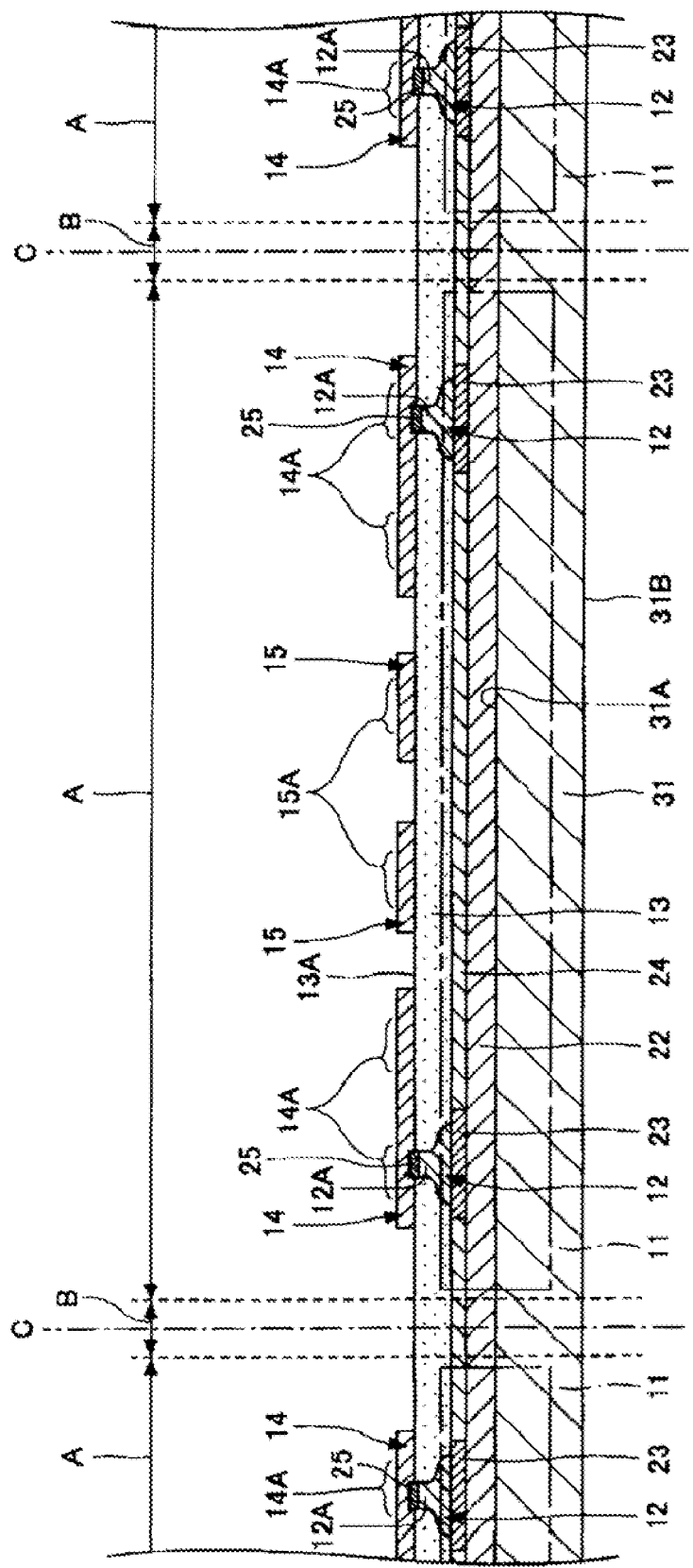
FIG. 19 is a view (No. 8) showing a step of manufacturing the semiconductor device according to the first embodiment of the invention.

At a step shown in FIG. 19, then, the metal layer 33 is subjected to patterning to form the wiring patterns 14 and in the semiconductor device forming regions A (a wiring pattern forming step) and to thereafter roughen the surfaces of the wiring patterns 14 and 15 (a roughening step). More specifically, at the wiring pattern forming step, a resist film subjected to the patterning to correspond to the shapes of the wiring patterns 14 and 15 is formed on the metal layer 33 and is subsequently used as a mask to carry out etching over the metal layer 33, thereby forming the wiring patterns 14 and 15, for example. The surfaces of the wiring patterns and 15 can be roughened (the roughening step) by either a blackening treatment or a roughening etching treatment.

By roughening the surfaces of the wiring patterns 14 and 15, thus, it is possible to enhance an adhesion of the solder resist layer 16 formed on the surfaces of the wiring patterns 14 and 15 (the upper and side surfaces of the wiring patterns 14 and 15) and the wiring patters 14 and 15.

Figure 20:
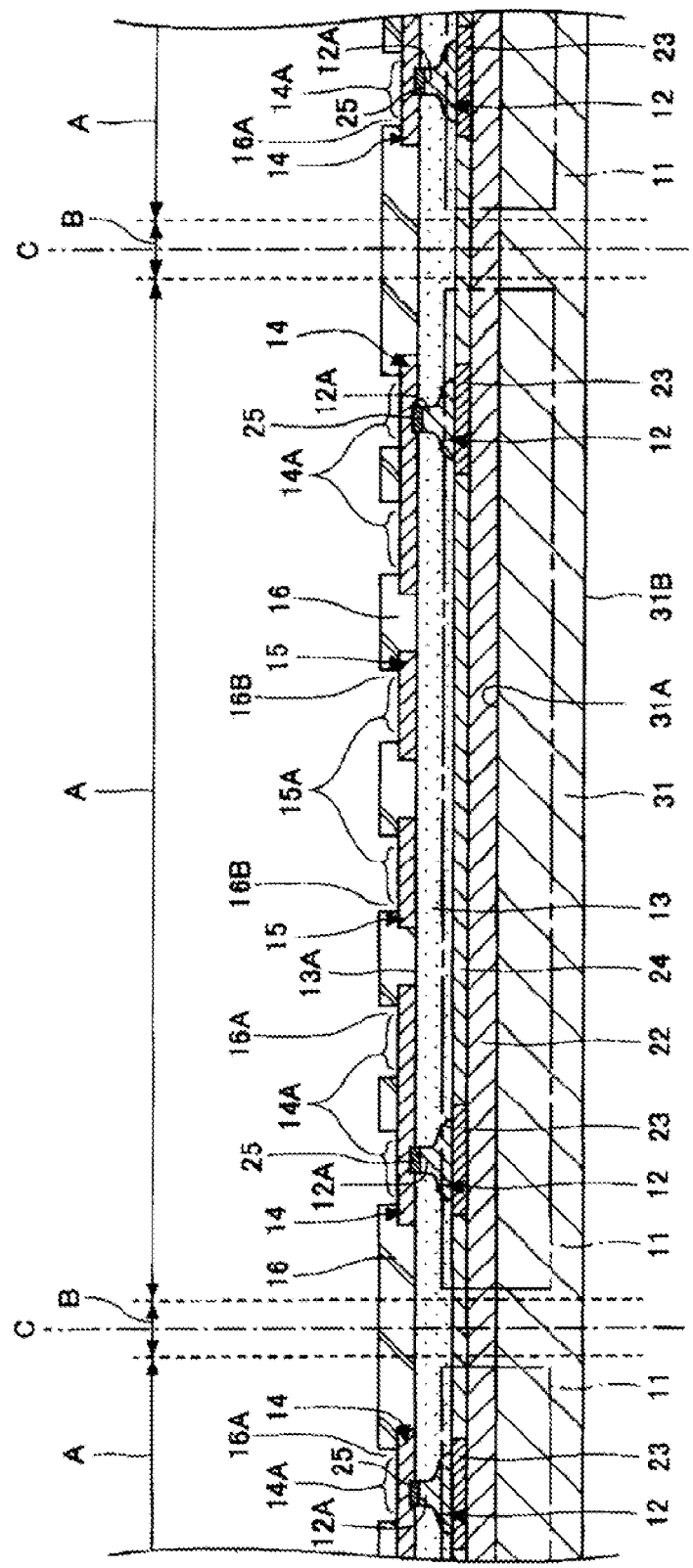
FIG. 20 is a view (No. 9) showing a step of manufacturing the semiconductor device according to the first embodiment of the invention.

At a step shown in FIG. 20, next, the solder resist layer 16 having opening portions 16A and 16B is formed on the upper surface 13A of the resin layer 13 to cover the wiring patterns 14 and 15 in portions excluding the external connecting terminal providing regions 14A and 15A. At this time, the opening portion 16A is formed to expose the external connecting terminal providing region 14A. Moreover, the opening portion 16B is formed to expose the external connecting terminal providing region 15A.

Figure 21:
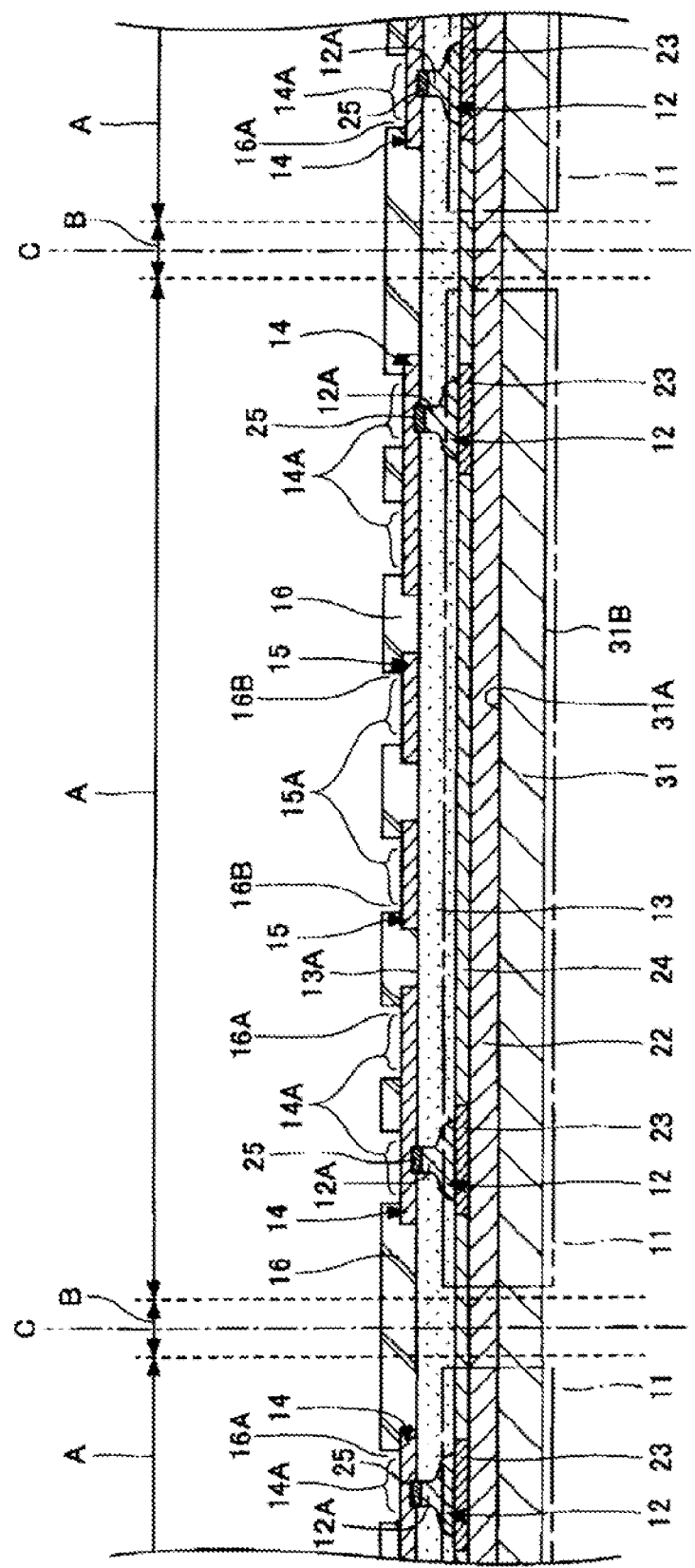
FIG. 21 is a view (No. 10) showing a step of manufacturing the semiconductor device according to the first embodiment of the invention.

At a step shown in FIG. 21, subsequently, the semiconductor substrate 31 is polished and/or ground from a back face 31B side of the semiconductor substrate 31 to form the semiconductor substrate 31 into a thin plate. The semiconductor substrate 31 can be formed into the thin plate by using a back side grinder, for example. A thickness of the semiconductor substrate 31 to be formed into the thin plate can be set to be 200 μm to 300 μm, for example.

Figure 22:
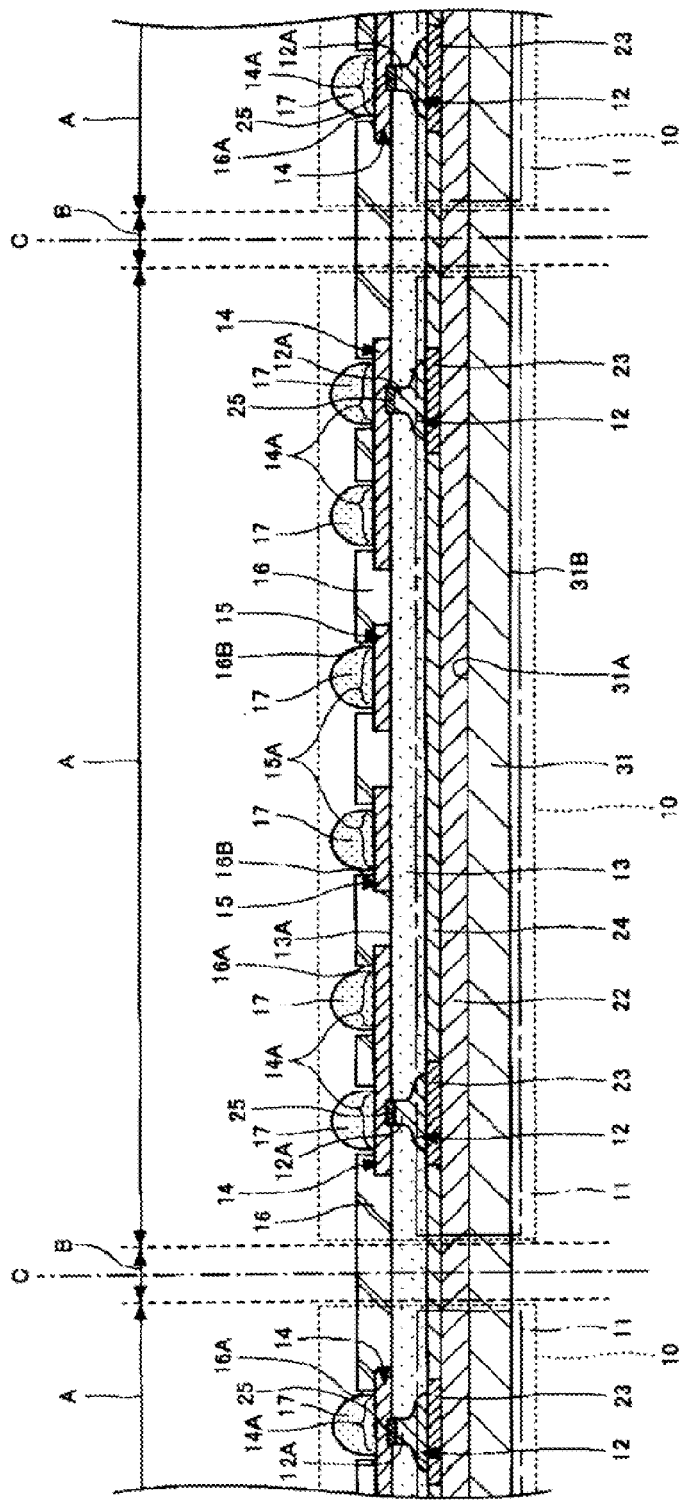
FIG. 22 is a view (No. 11) showing a step of manufacturing the semiconductor device according to the first embodiment of the invention.

At a step shown in FIG. 22, then, an external connecting terminal 17 is formed in the wiring patterns 14 and 15 in corresponding portions to the external connecting terminal providing regions 14A and 15A. Consequently, a plurality of semiconductor devices 10 is manufactured on the semiconductor substrate 31 formed into the thin plate. As the external connecting terminal 17, it is possible to use a solder bump, for example.

Figure 23:
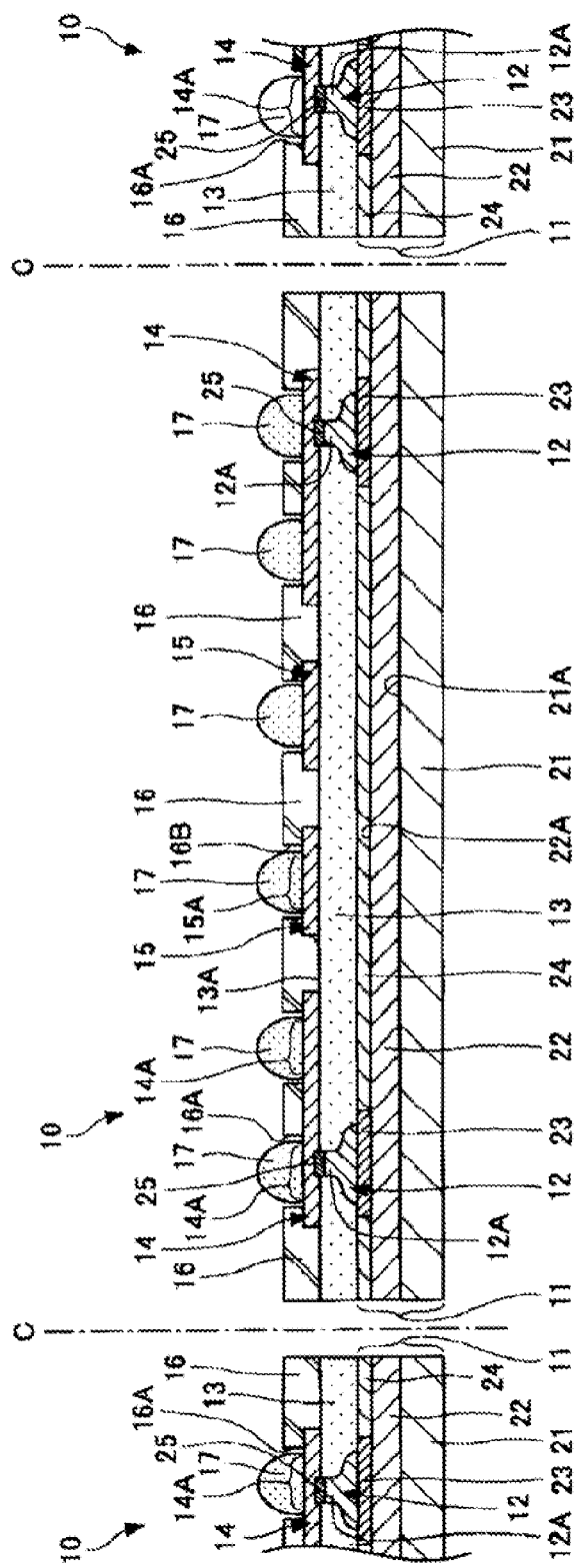
FIG. 23 is a view (No. 12) showing a step of manufacturing the semiconductor device according to the first embodiment of the invention.
Figure 24:
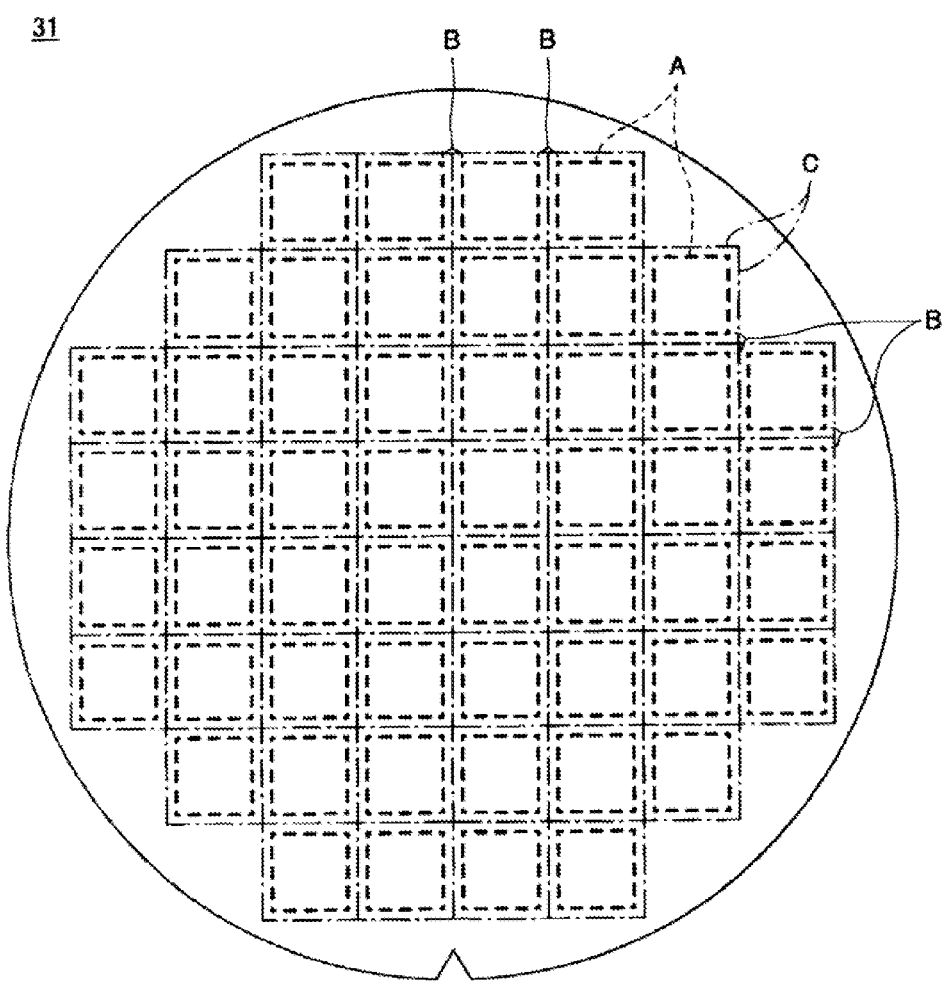
FIG. 24 is a plan view showing a semiconductor substrate on which a plurality of semiconductor devices is formed.

At a step shown in FIG. 23, thereafter, the structure shown in FIG. 22 is cut along the cutting position C. Consequently, the semiconductor devices 10 are divided into individual pieces.

According to the method of manufacturing the semiconductor device in accordance with the embodiment, the metal layer 33 (the base material of the wiring patterns 14 and 15) formed on the upper surface 13A of the resin layer 13 is pressed to cause the lower surface 33B of the metal layer 33 to come in contact with the upper ends 12A of the internal connecting terminals 12 and to then bond the metal layer 33 in the portion provided in contact with the internal connecting terminal 12 (the metal layer 33 in the corresponding portion to the wiring pattern 14) to the upper end 12A of the internal connecting terminal 12 in the portion provided in contact with the metal layer 33. Also in the case in which the resin layer 13 is deformed (for example, the case in which the resin layer 13 is swollen by the influence of water or heat), consequently, the bonding portions of the internal connecting terminal 12 and the metal layer 33 (the metal layer 33 in the corresponding portion to the wiring pattern 14) are prevented from being separated from each other. Therefore, it is possible to sufficiently ensure the electrical connecting reliability between the internal connecting terminal 12 and the wiring pattern 14.

By using the Au as the metallic material constituting the internal connecting terminal 12 and using the Cu as the material of the metal layer 33, moreover, it is possible to form the alloy layer 25 having a great bonding force (in this case, a Cu—Au alloy layer) between the metal layer 33 in the corresponding portion to the wiring pattern 14 and the internal connecting terminal 12. Therefore, it is possible to further enhance the electrical connecting reliability between the internal connecting terminal 12 and the wiring pattern 14.

Figure 25:
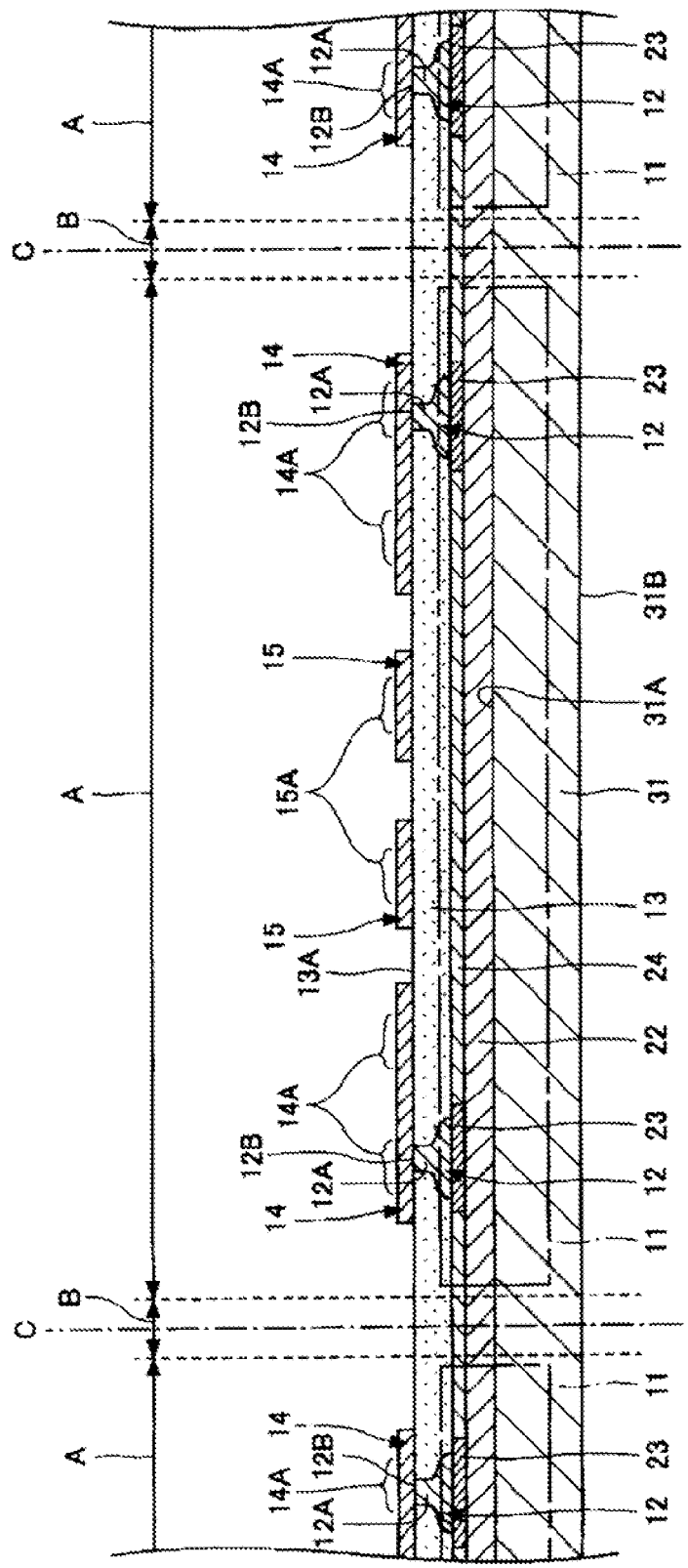
FIG. 25 is a view (No. 1) showing a variant of the process for manufacturing the semiconductor device according to the first embodiment of the invention.
Figure 26:
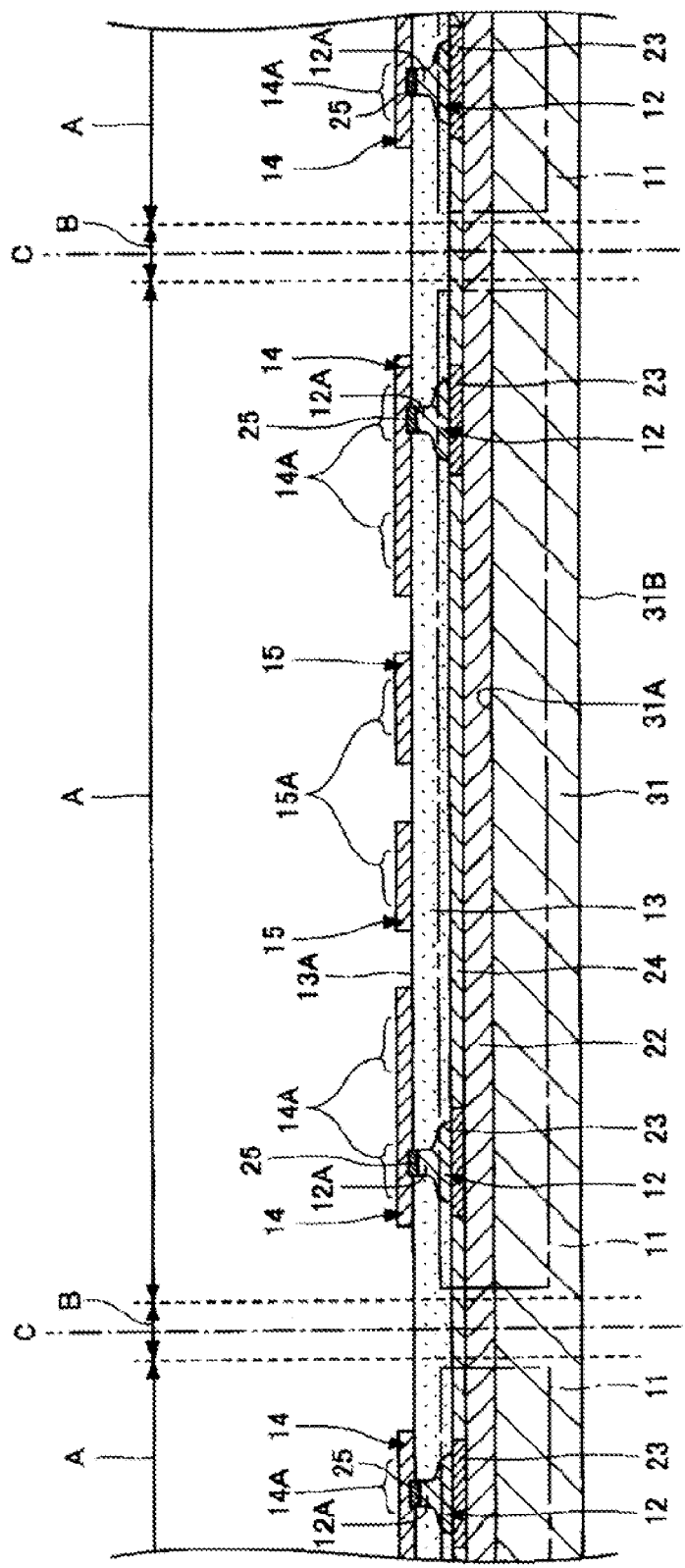
FIG. 26 is a view (No. 2) showing a variant of the process for manufacturing the semiconductor device according to the first embodiment of the invention.

FIGS. 25 and 26 are views showing a variant of the process for manufacturing the semiconductor device according to the first embodiment of the invention. In FIGS. 25 and 26, the same components as those in the semiconductor device 10 according to the first embodiment have the same reference numerals.

With reference to FIGS. 25 and 26, description will be given to another method of manufacturing the semiconductor device 10 according to the first embodiment. First of all, the same processings as those in the steps shown in FIGS. 12 to 17 described above (which include the resin layer forming step, the metal layer forming step and the contact step) are carried out to form the structure shown in FIG. 17. At a step shown in FIG. 25, next, a metal layer 33 provided in contact with an upper surface 12B of an internal connecting terminal 12 is subjected to patterning to form wiring patterns 14 and 15 in a plurality of semiconductor device forming regions A (a wiring pattern forming step).

At a step shown in FIG. 26, subsequently, a wiring pattern 14 in a portion provided in contact with an upper end 12A of the internal connecting terminal 12 is bonded to the upper end 12A of the internal connecting terminal 12 in a portion provided in contact with a lower surface of the wiring pattern 14 to form an alloy layer 25 in bonding portions of the internal connecting terminal 12 and the wiring pattern 14 (a bonding step). At the bonding step, by using at least one method of a group including a laser welding method, an ultrasonic welding method and a resistance welding method, for example, the internal connecting terminal 12 and the wiring pattern 14 are bonded to each other to form the alloy layer 25 in the bonding portions of the internal connecting terminal 12 and the wiring pattern 14. In the case in which Au is used as a metallic material constituting the internal connecting terminal 12, it is preferable to use Cu as a material of the wiring pattern 14, for example. Consequently, it is possible to form the alloy layer 25 (in this case, a Cu—Au alloy layer) having a great bonding force between the wiring pattern 14 and the internal connecting terminal 12.

Then (after the boding step), surfaces of the wiring patters 14 and 15 are roughened (a roughening step). At the roughening step, for example, the surfaces of the wiring patterns 14 and 15 are roughened by a blackening treatment or a roughening etching treatment, for example. Thereafter (after the roughening treatment), the same processings as the steps shown in FIGS. 20 to 23 described above are carried out so that a plurality of semiconductor devices 10 formed on a semiconductor substrate 31 is divided into individual pieces.

According to another method of manufacturing the semiconductor device in accordance with the embodiment, the metal layer 33 formed on the upper surface 13A of the resin layer 13 is pressed to cause the lower surface 33B of the metal layer 33 to come in contact with the upper ends 12A of the internal connecting terminals 12, to then carry out patterning over the metal layer 33 to form the wiring patterns and 15 and to thereafter bond the wiring pattern 14 in the portion provided in contact with the internal connecting terminal 12 to the internal connecting terminal 12 in the portion provided in contact with the wiring pattern 14. Also in the case in which the resin layer 13 is deformed (for example, the case in which the resin layer 13 is swollen by the influence of water or heat), consequently, the bonding portions of the internal connecting terminal 12 and the wiring pattern 14 are prevented from being separated from each other. Therefore, it is possible to sufficiently ensure the electrical connecting reliability between the internal connecting terminal 12 and the wiring pattern 14.

By using the Au as the metallic material constituting the internal connecting terminal 12 and using the Cu as the material of the metal layer 33, moreover, it is possible to form the alloy layer 25 having a great bonding force (in this case, a Cu—Au alloy layer) between the metal layer 33 in a corresponding portion to the wiring pattern 14 and the internal connecting terminal 12. Therefore, it is possible to further enhance the electrical connecting reliability between the internal connecting terminal 12 and the wiring pattern 14.

Second Embodiment

Figure 27:
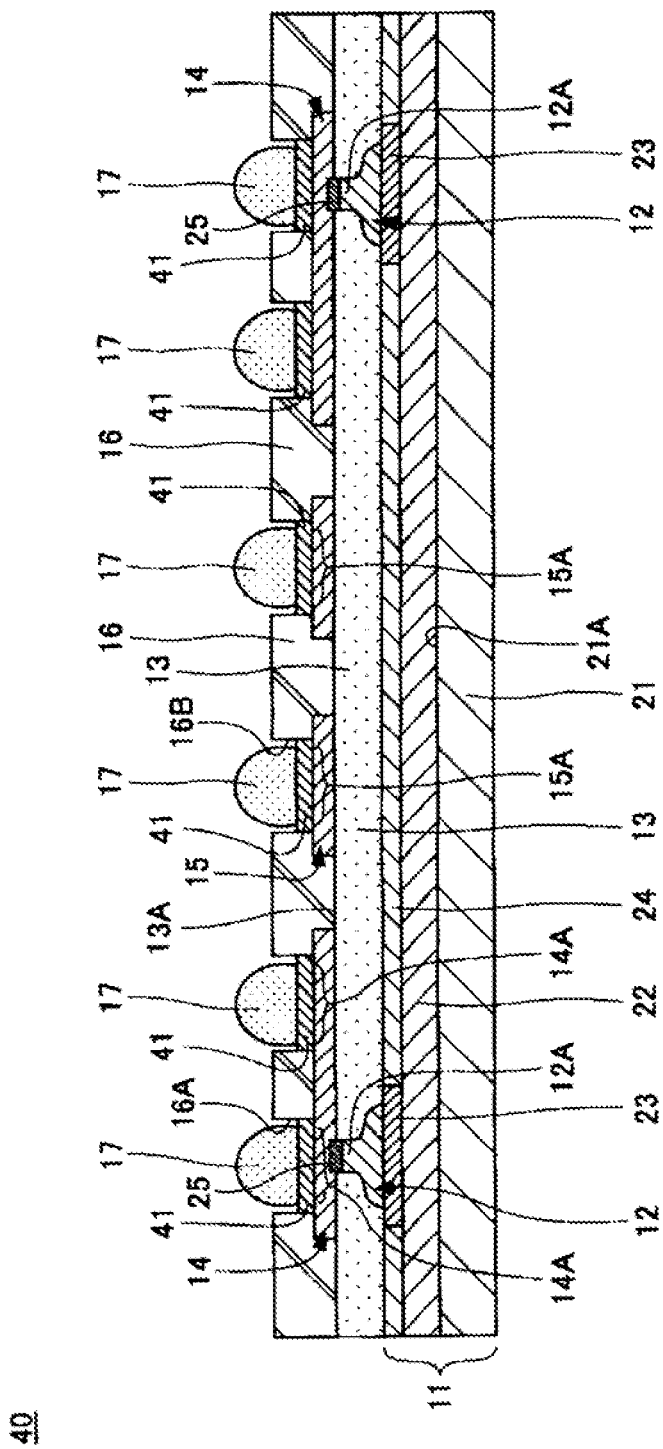
FIG. 27 is a sectional view showing a semiconductor device according to a second embodiment of the invention.

FIG. 27 is a sectional view showing a semiconductor device according to a second embodiment of the invention. In FIG. 27, the same components as those in the semiconductor device 10 according to the first embodiment have the same reference numerals.

With reference to FIG. 27, a semiconductor device 40 according to the second embodiment is constituted in the same manner as the semiconductor device 10 except that a connecting pad 41 is further provided in the structure of the semiconductor device 10 according to the first embodiment.

The connecting pad 41 is provided to cover external connecting terminal providing regions 14A and 15A of wiring patterns 14 and 15. The connecting pad 41 is exposed from opening portions 16A and 16B of a solder resist layer 16. An external connecting terminal 17 is provided on the connecting pad 41 in portions exposed from the opening portions 16A and 16B. The connecting pad 41 serves to electrically connect the wiring pattern 14 to the external connecting terminal 17. As the connecting pad 41, it is possible to use an Sn layer, an Ni layer or a Ti layer, for example. A thickness of the connecting pad 41 can be set to be 2 μm, for example.

FIGS. 28 to 34 are views showing a process for manufacturing the semiconductor device according to the second embodiment of the invention. In FIGS. 28 to 34, the same components as those of the semiconductor device 40 according to the second embodiment have the same reference numerals.

With reference to FIGS. 28 to 34, description will be given to a method of manufacturing the semiconductor device 40 according to the second embodiment. First of all, the same processings as the steps shown in FIGS. 12 to 15 described in the first embodiment (which include a resin layer forming step) are carried out to form the structure shown in FIG. 15.

Figure 28:
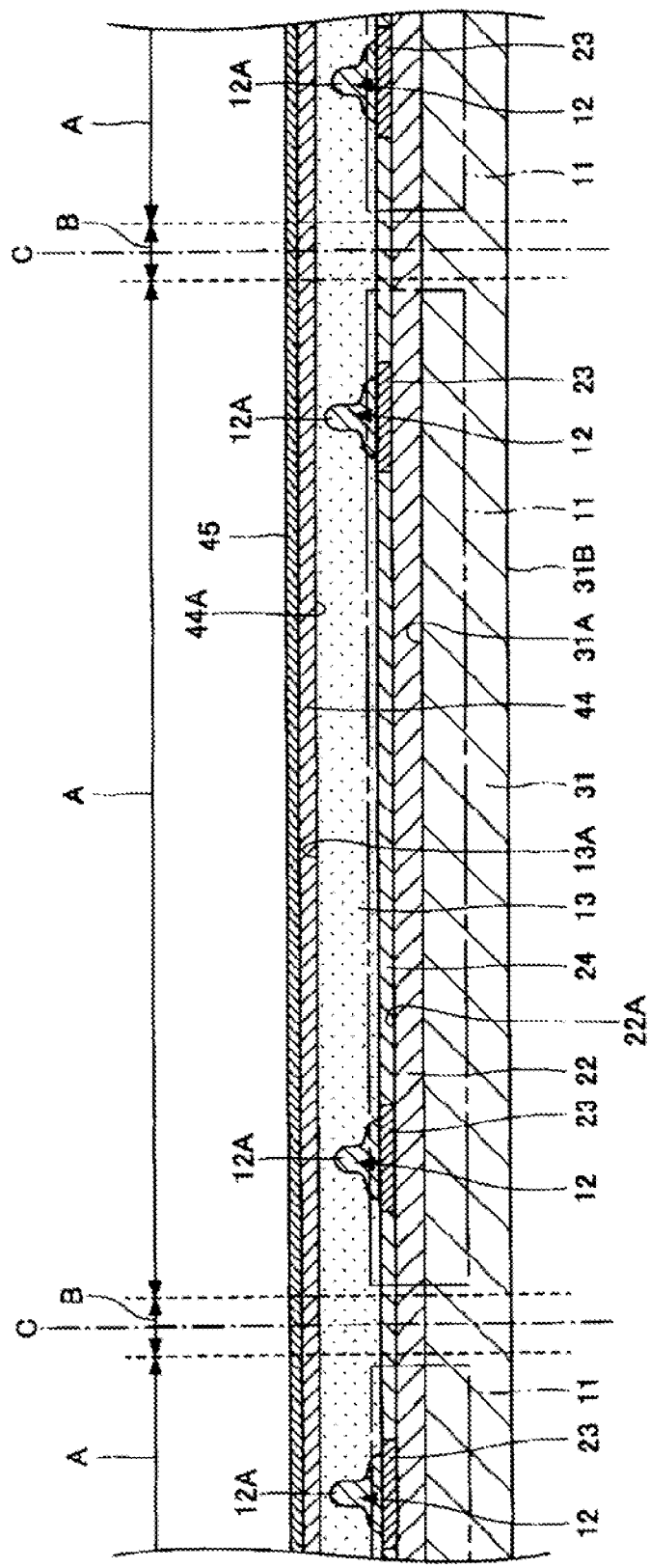
FIG. 28 is a view (No. 1) showing a step of manufacturing the semiconductor device according to the second embodiment of the invention.

At a step shown in FIG. 28, next, a first metal layer 44 and a second metal layer 45 are sequentially provided on an upper surface 13A of a resin layer 13. The first metal layer 44 serves as a base material of wiring patterns 14 and 15. The first metal layer 44 is constituted by a metallic material which is hard to etch against an etchant or an etching gas when the second metal layer 45 (a base material of a connecting pad 41) is to be etched. More specifically, in the case in which an Sn layer, an Ni layer or a Ti layer is used as the second metal layer 45, for example, a Cu layer or a Cu foil can be used as the first metal layer 44, for example.

Thus, the first metal layer 44 is constituted by the metallic material which is hard to etch against the etchant or the etching gas when the second metal layer 45 is to be etched. When etching the second metal layer 45 to form the connecting pad 41 (see FIG. 31), it is possible to prevent the first metal layer 44 serving as the base material of the wiring patterns 14 and 15 from being etched.

At the step of forming the metal layers, more specifically, a sheet-like layered member obtained by forming an Sn layer serving as the second metal layer 45 on a Cu foil serving as the first metal layer 44 is stuck to the upper surface 13A of the resin layer 13 so that the first and second metal layers 44 and 45 are formed, for example. In the case in which the Cu foil is used as the first metal layer 44, a thickness of the first metal layer 44 can be set to be 10 μm, for example. In the case in which the Sn layer is used as the second metal layer 45, moreover, a thickness of the second metal layer 45 can be set to be 2 μm, for example.

Figure 29:
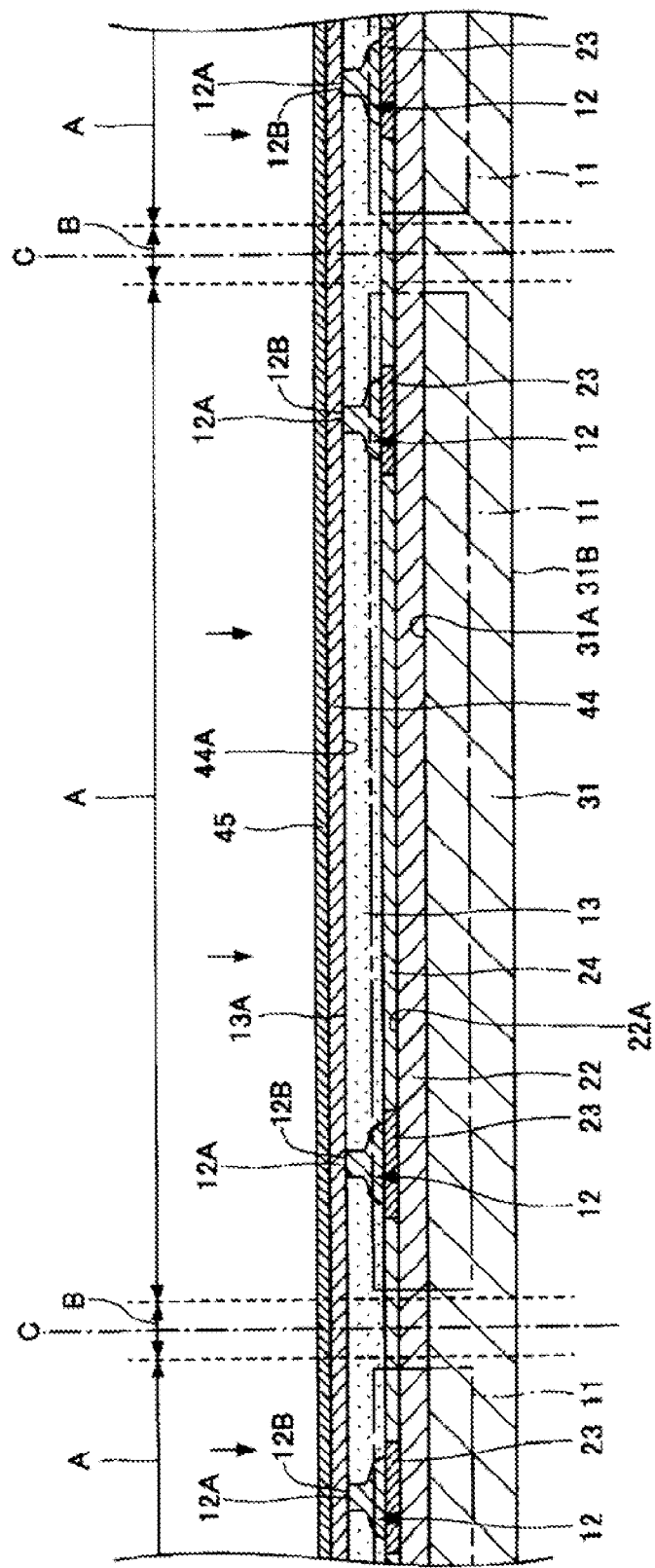
FIG. 29 is a view (No. 2) showing a step of manufacturing the semiconductor device according to the second embodiment of the invention.

At a step shown in FIG. 29, subsequently, the second metal layer 45 is pressed to cause a lower surface 44A of the first metal layer 44 to come in contact with upper ends 12A of the internal connecting terminals 12 and to form upper surfaces 12B to be almost flat surfaces on the internal connecting terminals 12 in portions provided in contact with the lower surface 44A of the first metal layer 44 in a state in which the structure shown in FIG. 28 is heated (a contact step). At this time, the structure shown in FIG. 28 is heated so that the resin layer 13 is cured. After the lower surface 44A of the first metal layer 44 is caused to come in contact with the internal connecting terminals 12, a thickness of the resin layer 13 can be set to be 10 μm to 60 μm, for example.

Thus, there is not required a step of polishing the resin layer 13 to expose the upper ends of the internal connecting terminals 12 from the resin layer 13. There is also not required a step of pressing the second metal layer 45 to cause the first metal layer 44 serving as the base material of the wiring patterns 14 and 15 to come in contact with the internal connecting terminals 12, thereby causing heights of the internal connecting terminals 12 to be uniform. Consequently, it is possible to decrease the number of the steps of manufacturing the semiconductor device 40. Therefore, it is possible to reduce a manufacturing cost of the semiconductor device 40.

Figure 30:
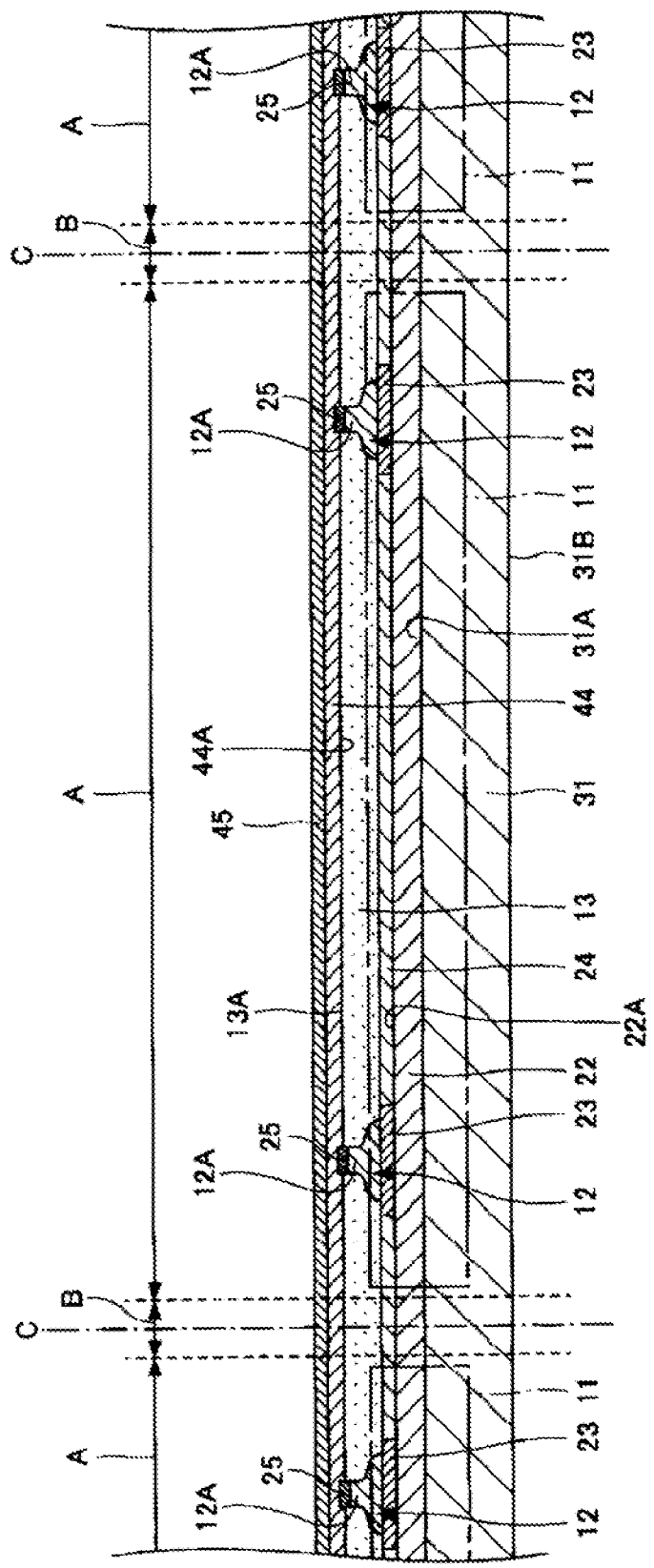
FIG. 30 is a view (No. 3) showing a step of manufacturing the semiconductor device according to the second embodiment of the invention.

At a step shown in FIG. 30, then, the first metal layer 44 in the portion provided in contact with the upper end 12A of the internal connecting terminal 12 (the first metal layer 44 in the corresponding portion to the wiring pattern 14) is bonded to the upper end 12A of the internal connecting terminal 12 in the portion provided in contact with the lower surface 44A of the first metal layer 44 to form an alloy layer 25 in bonding portions of the internal connecting terminal 12 and the first metal layer 44 (a bonding step).

For example, by using at least one method of a group including a laser welding method, an ultrasonic welding method and a resistance welding method at the bonding step, the internal connecting terminal 12 is bonded to the first metal layer 44 to form the alloy layer 25 in the bonding portions of the internal connecting terminal 12 and the first metal layer 44.

Thus, the first metal layer 44 (the base material of the wiring patterns 14 and 15) formed on the upper surface 13A of the resin layer 13 is pressed to cause the lower surface 44A of the first metal layer 44 to come in contact with the upper ends 12A of the internal connecting terminals 12 and to then bond the first metal layer 44 in the portion provided in contact with the internal connecting terminal 12 (the first metal layer 44 in the corresponding portion to the wiring pattern 14) and the upper end 12A of the internal connecting terminal 12 in the portion provided in contact with the first metal layer 44 to each other. Also in the case in which the resin layer 13 is deformed (for example, the case in which the resin layer 13 is swollen by an influence of water or heat), consequently, the bonding portions of the internal connecting terminal 12 and the first metal layer 44 (the first metal layer 44 in the corresponding portion to the wiring pattern 14) are prevented from being separated from each other. Therefore, it is possible to sufficiently ensure an electrical connecting reliability between the internal connecting terminal 12 and the wiring pattern 14.

Moreover, it is also possible to use Au as a metallic material constituting the internal connecting terminal 12 and to use Cu as a material of the first metal layer 44. By using the Au as the metallic material constituting the internal connecting terminal 12 and using the Cu as the material of the first metal layer 44, thus, it is possible to form the alloy layer 25 having a great bonding force (in this case, a Cu—Au alloy layer) between the first metal layer 44 in the corresponding portion to the wiring pattern 14 and the internal connecting terminal 12. Therefore, it is possible to further enhance the electrical connecting reliability between the internal connecting terminal 12 and the wiring pattern 14. In the case in which the Cu—Au alloy layer is used as the alloy layer 25, the thickness of the alloy layer 25 can be set to be 0.5 μm to 1.0 μm, for example.

At a step shown in FIG. 31, subsequently, the second metal layer 45 is subjected to patterning through etching to form the connecting pad 41 on the first metal layer 44 in the corresponding portions to the external connecting terminal providing regions 14A and 15A (a connecting pad forming step). More specifically, a resist film subjected to the patterning is formed on the second metal layer 45 and the second metal layer 45 is etched by anisotropic etching using the resist film as a mask to form the connecting pad 41.

Figure 31:
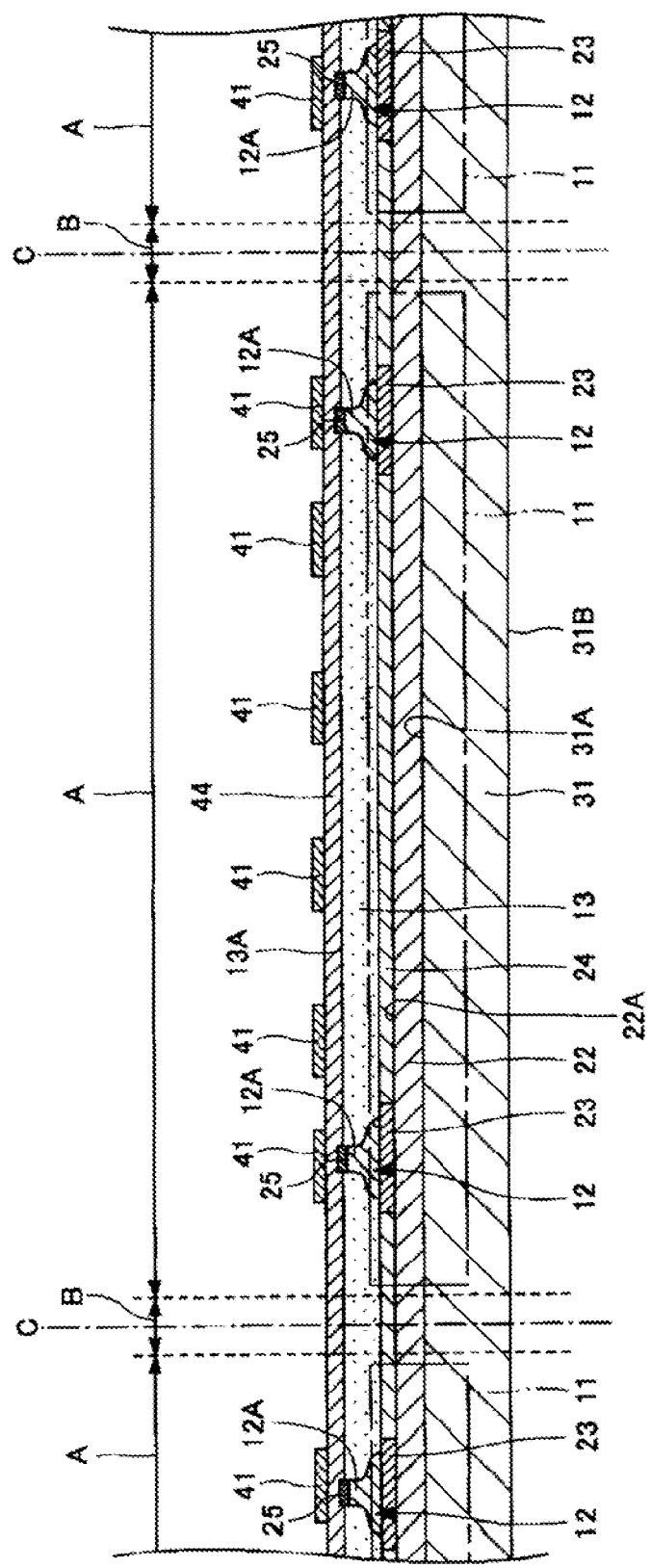
FIG. 31 is a view (No. 4) showing a step of manufacturing the semiconductor device according to the second embodiment of the invention.
Figure 32:
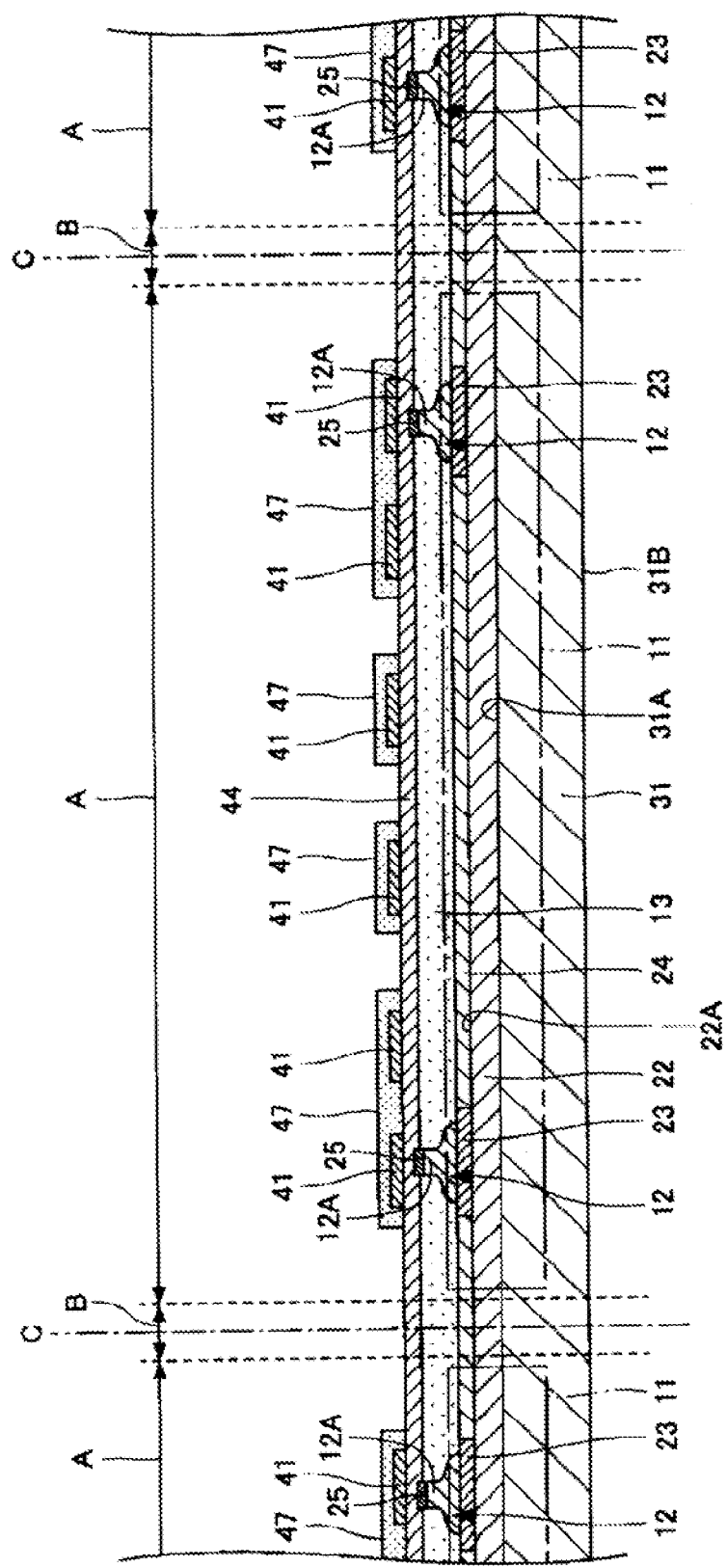
FIG. 32 is a view (No. 5) showing a step of manufacturing the semiconductor device according to the second embodiment of the invention.

At a step shown in FIG. 32, then, a resist film 47 subjected to the patterning is formed on the structure shown in FIG. 31. The resist film 47 is a mask for etching the first metal film 44 to form the wiring patterns 14 and 15.

At a step shown in FIG. 33, subsequently, the resist film 47 is used as a mask to carry out the etching over the first metal layer 44, thereby forming the wiring patterns 14 and 15 (a wiring pattern forming step).

Figure 33:
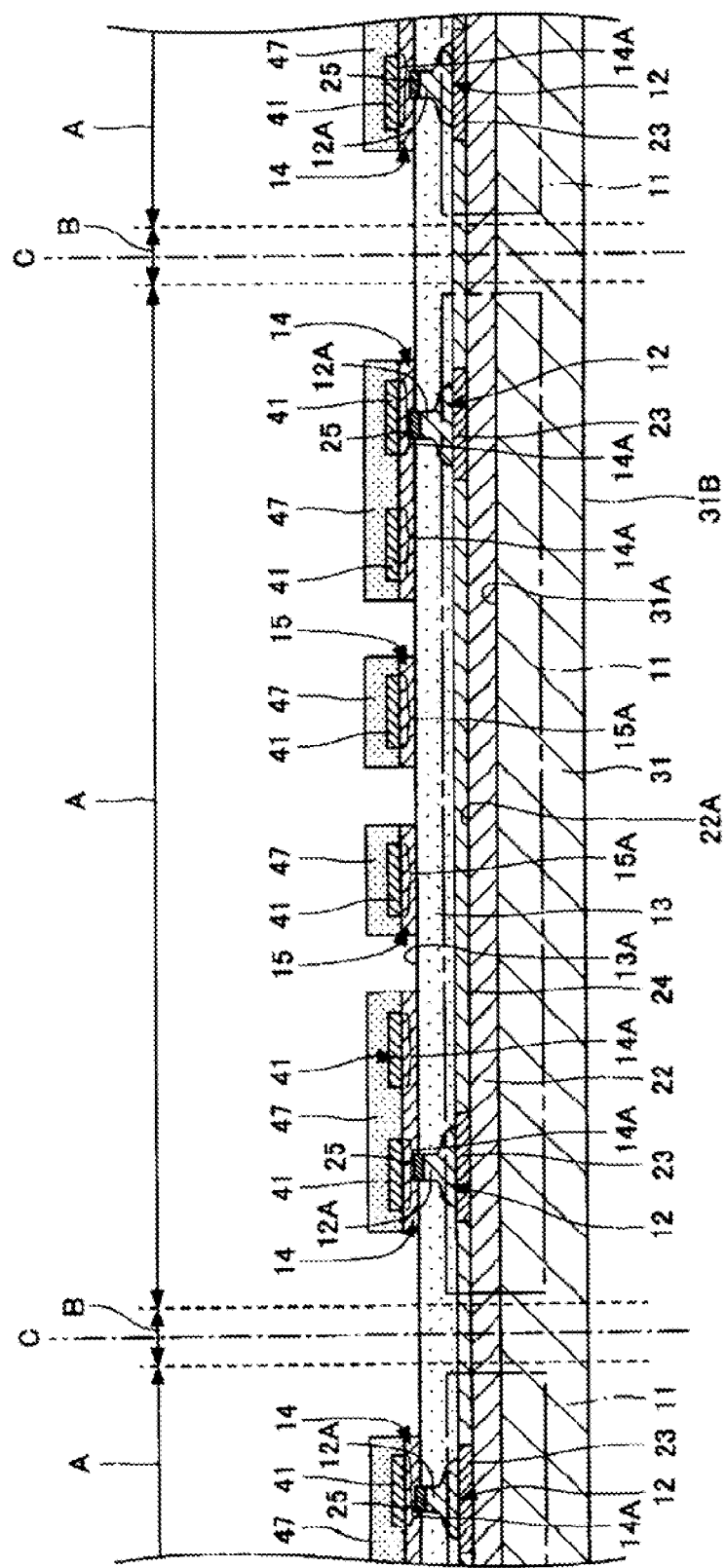
FIG. 33 is a view (No. 6) showing a step of manufacturing the semiconductor device according to the second embodiment of the invention.
Figure 34:
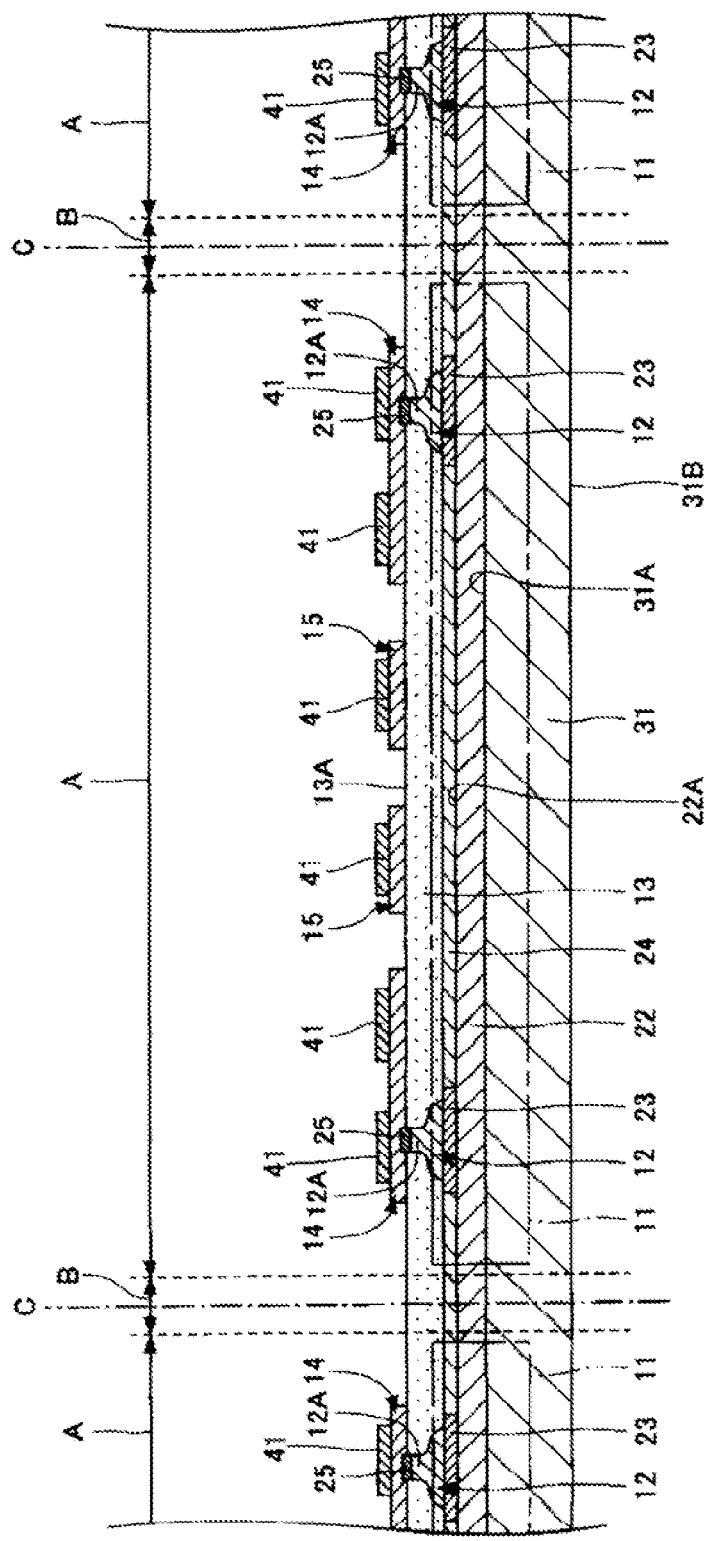
FIG. 34 is a view (No. 7) showing a step of manufacturing the semiconductor device according to the second embodiment of the invention.

At a step shown in FIG. 34, next, the resist film 47 shown in FIG. 33 is removed. Then, the same processings as the steps shown in FIGS. 20 to 23 described in the first embodiment are carried out so that the semiconductor devices 40 manufactured on a semiconductor substrate 31 are divided into individual pieces.

According to the method of manufacturing the semiconductor device in accordance with the embodiment, the first metal layer 44 (the base material of the wiring patterns 14 and 15) formed on the upper surface 13A of the resin layer is pressed to cause the lower surface 44A of the first metal layer 44 to come in contact with the upper ends 12A of the internal connecting terminals 12 and to then bond the first metal layer 44 in the portion provided in contact with the internal connecting terminal 12 (the first metal layer 44 in the corresponding portion to the wiring pattern 14) and the upper end 12A of the internal connecting terminal 12 in the portion provided in contact with the first metal layer 44 to each other. Also in the case in which the resin layer 13 is deformed (for example, the case in which the resin layer 13 is swollen by an influence of water or heat), consequently, the bonding portions of the internal connecting terminal 12 and the first metal layer 44 (the first metal layer 44 in the corresponding portion to the wiring pattern 14) are prevented from being separated from each other. Therefore, it is possible to sufficiently ensure an electrical connecting reliability between the internal connecting terminal 12 and the wiring pattern 14.

By using the Au as the metallic material constituting the internal connecting terminal 12 and using the Cu as the material of the first metal layer 44, moreover, it is possible to form the alloy layer 25 having a great bonding force (in this case, a Cu—Au alloy layer) between the first metal layer 44 in the corresponding portion to the wiring pattern 14 and the internal connecting terminal 12. Therefore, it is possible to further enhance the electrical connecting reliability between the internal connecting terminal 12 and the wiring pattern 14.

Although the description has been given by taking, as an example, the case in which the bonding step is carried out after the contact step in the method of manufacturing the semiconductor device 40 according to the embodiment, the bonding step may be carried out after the connecting pad forming step or the wiring pattern forming step. In these cases, it is possible to produce the same advantages as those in the method of manufacturing the semiconductor device 40 according to the embodiment.

Figure 35:
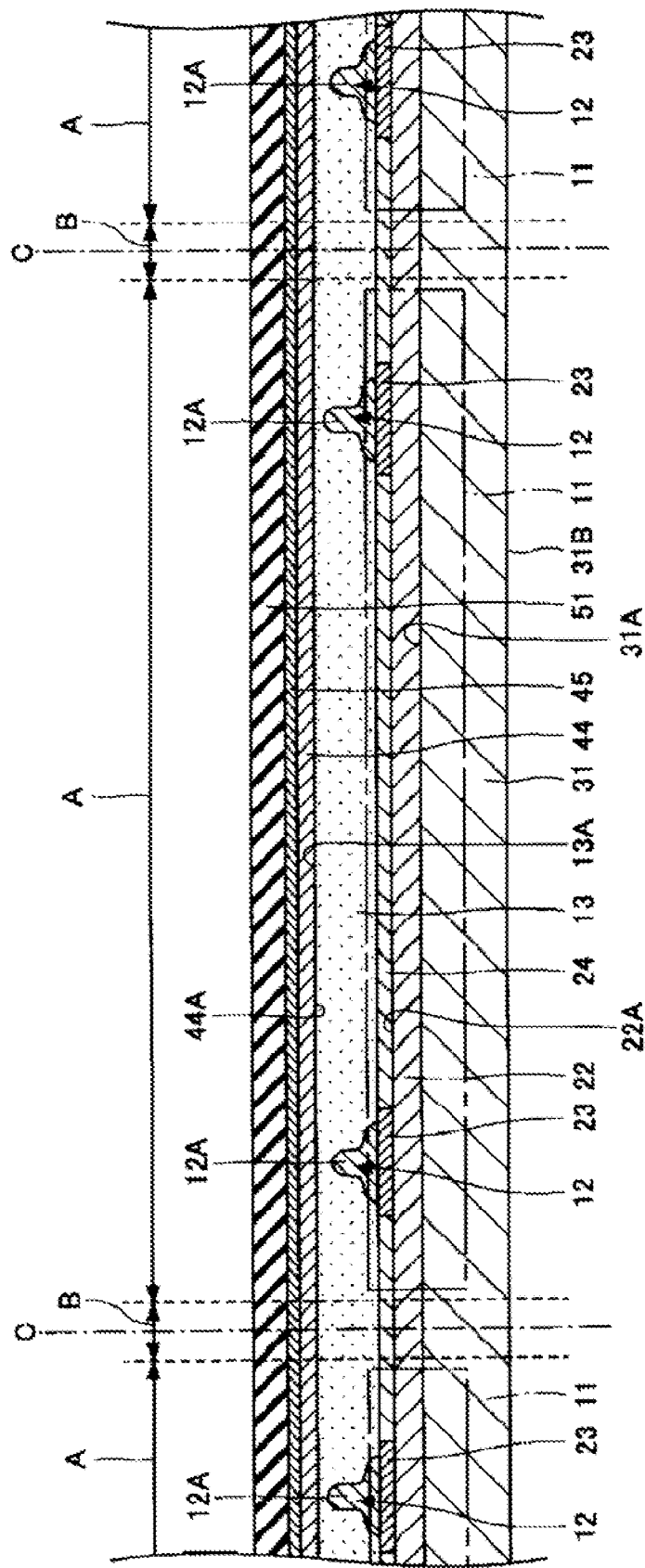
FIG. 35 is a view (No. 1) showing a variant of the process for manufacturing the semiconductor device according to the second embodiment of the invention.
Figure 36:
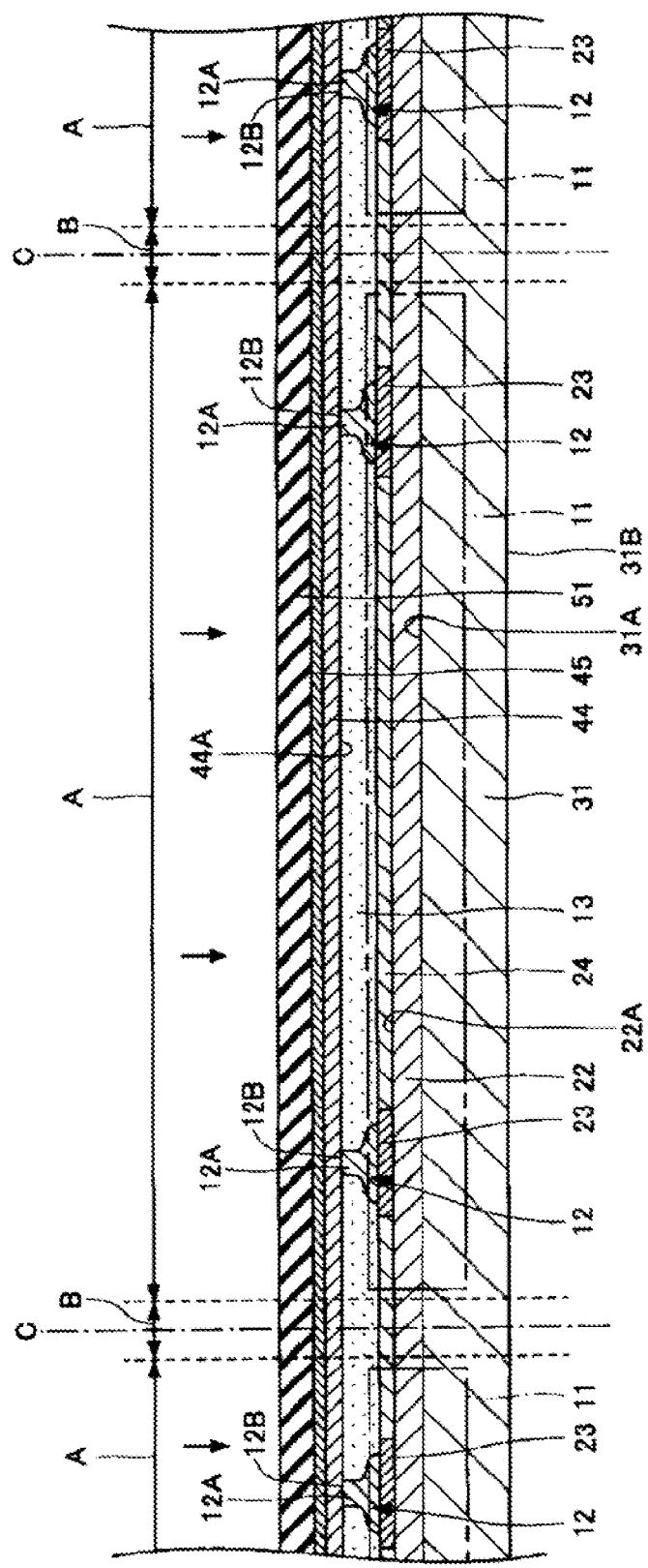
FIG. 36 is a view (No. 2) showing a variant of the process for manufacturing the semiconductor device according to the second embodiment of the invention.
Figure 37:
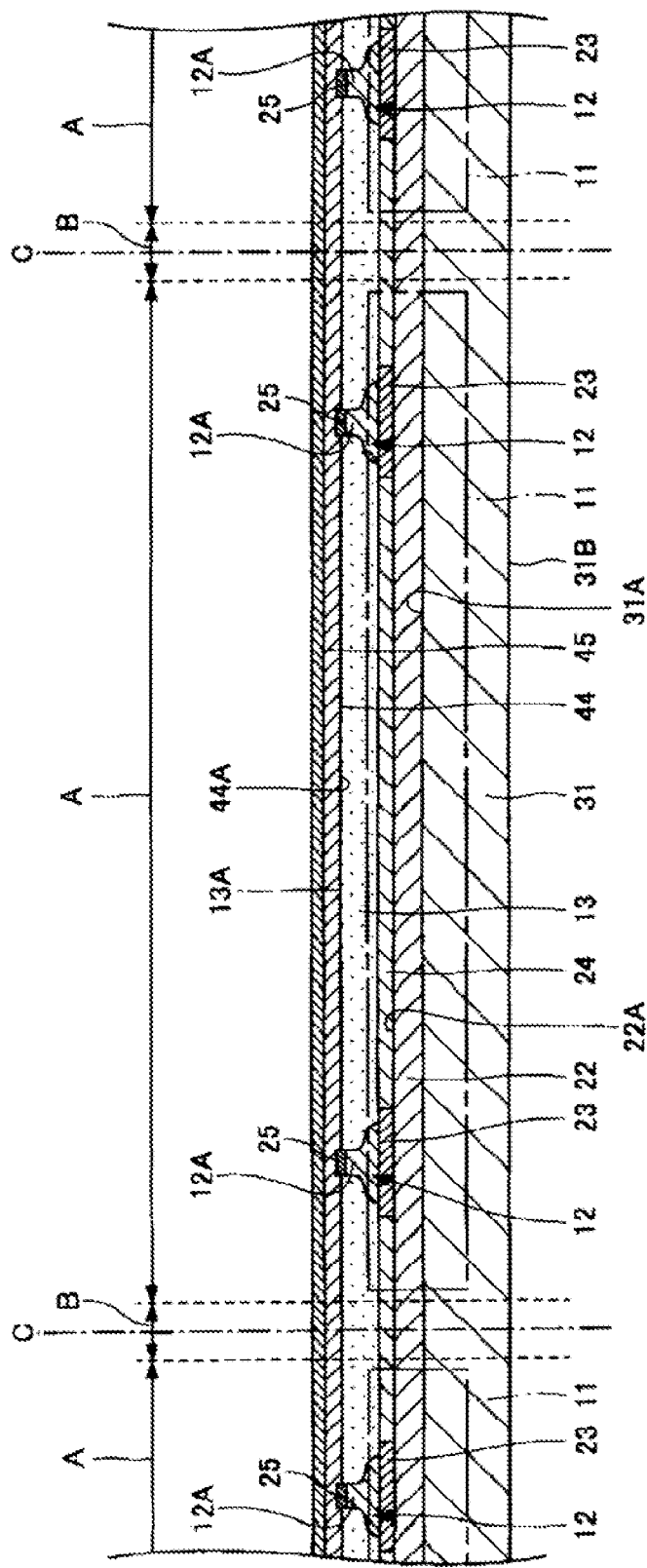
FIG. 37 is a view (No. 3) showing a variant of the process for manufacturing the semiconductor device according to the second embodiment of the invention.

FIGS. 35 to 37 are views showing a variant of the process for manufacturing the semiconductor device according to the second embodiment of the invention. In FIGS. 35 to 37, the same components as those in the semiconductor device 40 according to the second embodiment have the same reference numerals.

With reference to FIGS. 35 to 37, description will be given to another method of manufacturing the semiconductor device 40 according to the second embodiment. First of all, the same processings as the steps shown in FIGS. 12 to 15 described above (which include a resin layer forming step) are carried out to form the structure shown in FIG. 15. At a step shown in FIG. 35, next, a first metal layer 44, a second metal layer 45 and a protective layer 51 are sequentially provided on an upper surface 13A of a resin layer 13. The protective layer 51 serves to protect the second metal layer 45. The protective layer 51 is stuck to the second metal layer 45 with an adhesive having a small bonding force. Consequently, the protective layer 51 can easily be peeled from the second metal layer 45. As the protective layer 51, it is possible to use a metal foil (for example, a Cu foil), for example. In the case in which the Cu foil is used as the protective layer 51, a thickness of the protective layer 51 can be set to be 35 μm to 200 μm, for example.

At a step shown in FIG. 36, subsequently, the protective layer 51 is pressed to cause a lower surface 44A of the first metal layer 44 to come in contact with upper ends 12A of internal connecting terminals 12 and to form upper surfaces 12B to be almost flat surfaces on the internal connecting terminals 12 in portions provided in contact with the lower surface 44A of the first metal layer 44 in a state in which the structure shown in FIG. 35 is heated (a contact step). At this time, the structure shown in FIG. 35 is heated so that the resin layer 13 is cured. After the lower surface 44A of the first metal layer 44 is caused to come in contact with the internal connecting terminals 12, a thickness of the resin layer 13 can be set to be 10 μm to 60 μm, for example.

Thus, the protective layer 51 formed on the second metal layer 45 is pressed to cause the first metal layer 44 in a corresponding portion to a wiring pattern 14 to come in contact with the internal connecting terminals 12. At a contact step, consequently, it is possible to prevent the second metal layer from being damaged. The protective layer 51 is formed on the second metal layer 45 and is then pressed to cause the first metal layer 44 in the corresponding portion to the wiring pattern 14 to come in contact with the internal connecting terminals 12, which is particularly effective for the case in which the second metal layer 45 has a small thickness.

At a step shown in FIG. 37, next, the protective layer 51 shown in FIG. 36 is removed (a protective layer removing step). Then, the same processings as the steps shown in FIGS. 30 to 34 described above (which include the bonding step, the connecting pad forming step and the wiring pattern forming step) are carried out and the same processings as the steps shown in FIGS. 20 to 23 described in the first embodiment are subsequently carried out. Consequently, the semiconductor devices 40 manufactured on a semiconductor substrate 31 are divided into individual pieces.

According to the variant of the method of manufacturing the semiconductor device in accordance with the embodiment, the protective layer 51 formed on the second metal layer 45 is pressed to cause the first metal layer 44 in the corresponding portion to the wiring pattern 14 to come in contact with the internal connecting terminals 12. Consequently, it is possible to prevent the second metal layer 45 from being damaged at the contact step.

According to the variant of the method of manufacturing the semiconductor device in accordance with the embodiment, moreover, it is possible to obtain the same advantages as those in the method of manufacturing the semiconductor device 40 according to the second embodiment.

Although the description has been given by taking, as an example, the case in which the bonding step is carried out after the protective layer removing step in the variant of the method of manufacturing the semiconductor device 40 in accordance with the embodiment, the bonding step may be carried out between the contact step and the protective layer removing step, after the connecting pad forming step or after the wiring pattern forming step. In these cases, it is possible to obtain the same advantages as those in the method of manufacturing the semiconductor device 40 according to the embodiment. In the case in which the bonding step is carried out between the contact step and the protective layer removing step, moreover, it is possible to prevent the second metal layer 45 from being damaged at the bonding step.

Third Embodiment

Figure 38:
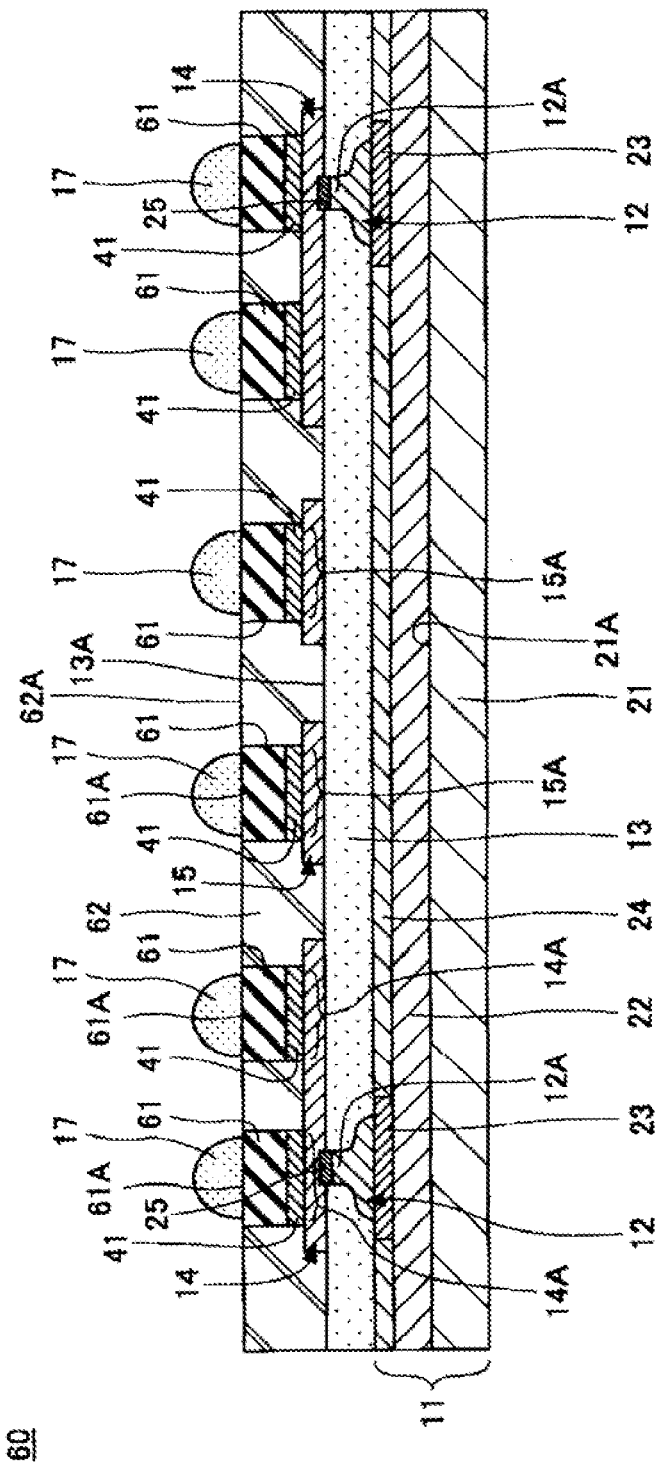
FIG. 38 is a sectional view showing a semiconductor device according to a third embodiment of the invention.

FIG. 38 is a sectional view showing a semiconductor device according to a third embodiment of the invention. In FIG. 38, the same components as those of the semiconductor device 60 according to the second embodiment have the same reference numerals.

With reference to FIG. 38, the semiconductor device 60 according to the third embodiment is constituted in the same manner as the semiconductor device 40 except that a sealing resin 62 is provided in place of the solder resist layer 16 provided in the semiconductor device 40 according to the second embodiment and a metal post 61 is further provided.

The metal post 61 is provided on a connecting pad 41. Consequently, the metal post 61 is electrically connected to the connecting pad 41. A side surface of the metal post 61 is covered with the sealing resin 62. An upper surface 61A of the metal post 61 is exposed from the sealing resin 62. The upper surface 61A of the metal post 61 is formed on almost the level with an upper surface 62A of the sealing resin 62. An external connecting terminal 17 is provided on the upper surface 61A of the metal post 61. The metal post 61 electrically connects the external connecting terminal 17 to the connecting pad 41.

Thus, the metal post 61 is provided between the external connecting terminal 17 and the connecting pad 41. When the external connecting terminal 17 is connected to a pad (not shown) provided on a mounting board such as a mother board (not shown), consequently, it is possible to relieve a stress received by the external connecting terminal 17 through the metal post 61. As a material of the metal post 61, it is possible to use Cu, for example. Moreover, a height of the metal post 61 can be set to be 50 μm to 200 μm, for example.

The sealing resin 62 is provided on an upper surface 13A of a resin layer 13 to cover wiring patterns 14 and 15 and the connecting pad 41, and the side surface of the metal post 61. As the sealing resin 62, it is possible to use an epoxy resin formed by a transfer molding method or a compression molding method, for example.

FIGS. 39 to 50 are views showing a process for manufacturing the semiconductor device according to the third embodiment of the invention. In FIGS. 39 to 50, the same components as those of the semiconductor device 60 according to the third embodiment have the same reference numerals.

With reference to FIGS. 39 to 50, description will be given to a method of manufacturing the semiconductor device 60 according to the third embodiment. First of all, the same processings as the steps shown in FIGS. 12 to 15 described in the first embodiment (which also include a resin layer forming step) are carried out to form the structure shown in FIG. 15.

Figure 39:
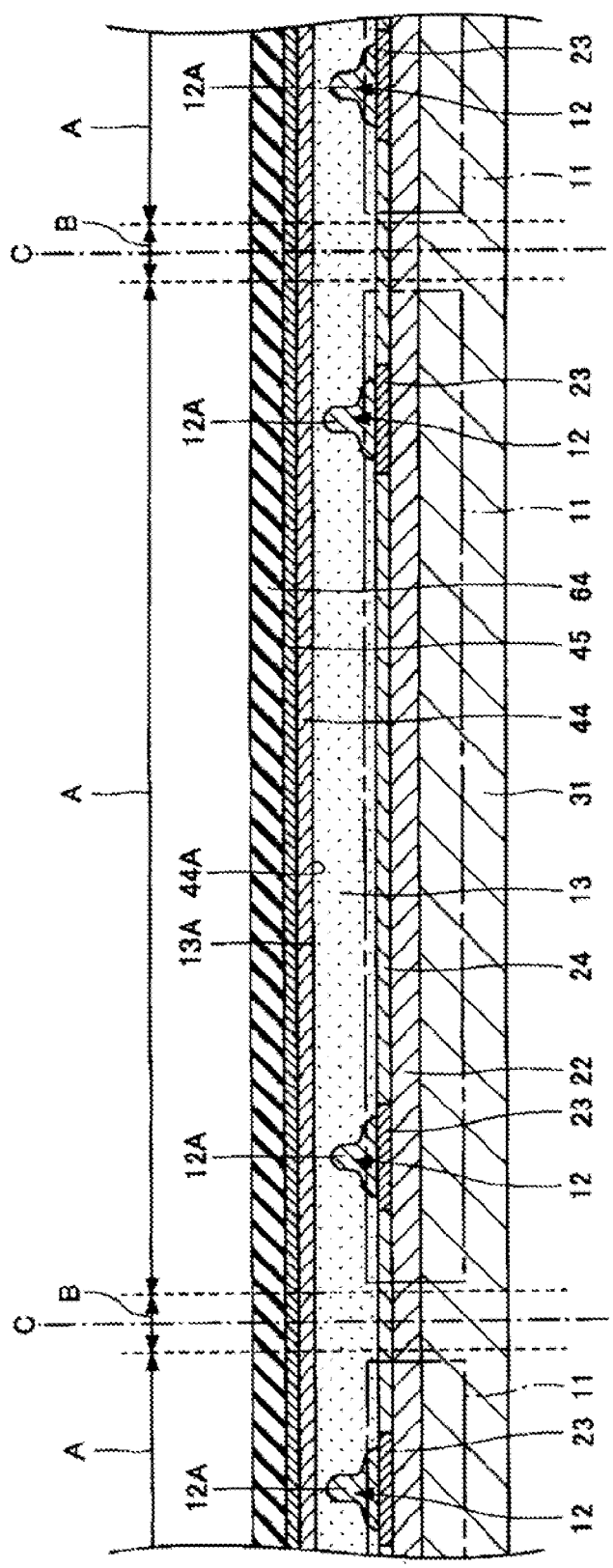
FIG. 39 is a view (No. 1) showing a step of manufacturing the semiconductor device according to the third embodiment of the invention.

At a step shown in FIG. 39, next, a first metal layer 44, a second metal layer 45 and a third metal layer 64 are sequentially provided on an upper surface 13A of a resin layer 13. The first metal layer 44 is a base material of wiring patterns 14 and 15. Moreover, the first metal layer 44 is constituted by a metallic material which is hard to etch against an etchant or an etching gas when the second metal layer 45 (a base material of a connecting pad 41) is to be etched. More specifically, in the case in which an Sn layer, an Ni layer or a Ti layer is used as the second metal layer 45, for example, a Cu layer or a Cu foil can be used as the first metal layer 44, for example. In the case in which the Cu foil is used as the first metal layer 44, a thickness of the first metal layer 44 can be set to be 10 μm, for example.

Thus, the first metal layer 44 is constituted by the metallic material which is hard to etch against the etchant or the etching gas when the second metal layer 45 is to be etched. When etching the second metal layer 45 to form the connecting pad 41 (see FIG. 31), consequently, it is possible to prevent the first metal layer 44 from being etched.

The second metal layer 45 is a base material of the connecting pad 41. Moreover, the second metal layer 45 is constituted by a metallic material which is hard to etch against an etchant or an etching gas when the third metal layer 64 (a base material of a metal post 61) is to be etched. More specifically, in the case in which a Cu foil is used as the third metal layer 64, an Sn layer, an Ni layer or a Ti layer can be used as the second metal layer 45, for example. In the case in which the Sn layer is used as the second metal layer 45, a thickness of the second metal layer 45 can be set to be 2 μm, for example.

The third metal layer 64 is subjected to patterning through etching and is thus changed into the metal post 61. As the third metal layer 64, it is possible to use a Cu layer or a Cu foil, for example. In this case, a thickness of the third metal layer 64 can be set to be 50 μm to 200 μm, for example.

At the step of forming the metal layers, more specifically, a sheet-like metal layered product obtained by sequentially providing an Sn layer serving as the second metal layer 45 and a Cu foil serving as the third metal layer 64 on another Cu foil serving as the first metal layer 44 is stuck to the upper surface 13A of the resin layer 13 so that the first to third metal layers 44, 45 and 64 are formed, for example.

Figure 40:
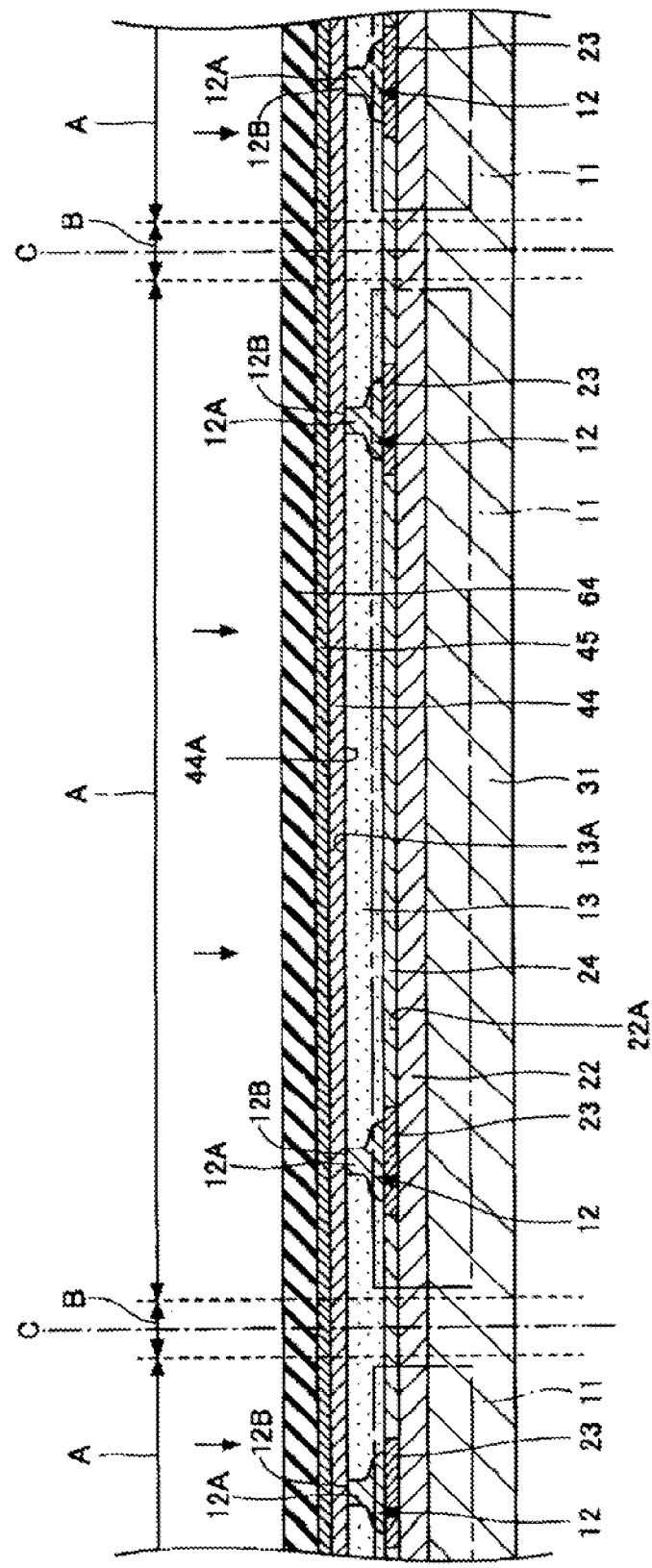
FIG. 40 is a view (No. 2) showing a step of manufacturing the semiconductor device according to the third embodiment of the invention.

At a step shown in FIG. 40, subsequently, the third metal layer 64 is pressed to cause a lower surface 44A of the first metal layer 44 to come in contact with upper ends 12A of internal connecting terminals 12 and to form upper surfaces 12B to be almost flat surfaces on the internal connecting terminals 12 in portions provided in contact with the lower surface 44A of the first metal layer 44 in a state in which the structure shown in FIG. 39 is heated (a contact step). At this time, the structure shown in FIG. 39 is heated so that the resin layer 13 is cured. After the lower surface 44A of the first metal layer 44 is caused to come in contact with the internal connecting terminals 12, a thickness of the resin layer 13 can be set to be 10 μm to 60 μm, for example.

Thus, there are not required a step of pressing the third metal layer 64 to cause the first metal layer 44 serving as the base material of the wiring patterns 14 and 15 to come in contact with the internal connecting terminals 12, thereby causing heights of the internal connecting terminals 12 to be uniform and a step of polishing the resin layer 13 to expose the upper ends of the internal connecting terminals 12 from the resin layer 13. Consequently, it is possible to decrease the number of the steps of manufacturing the semiconductor device 60. Therefore, it is possible to reduce a manufacturing cost of the semiconductor device 60.

Figure 41:
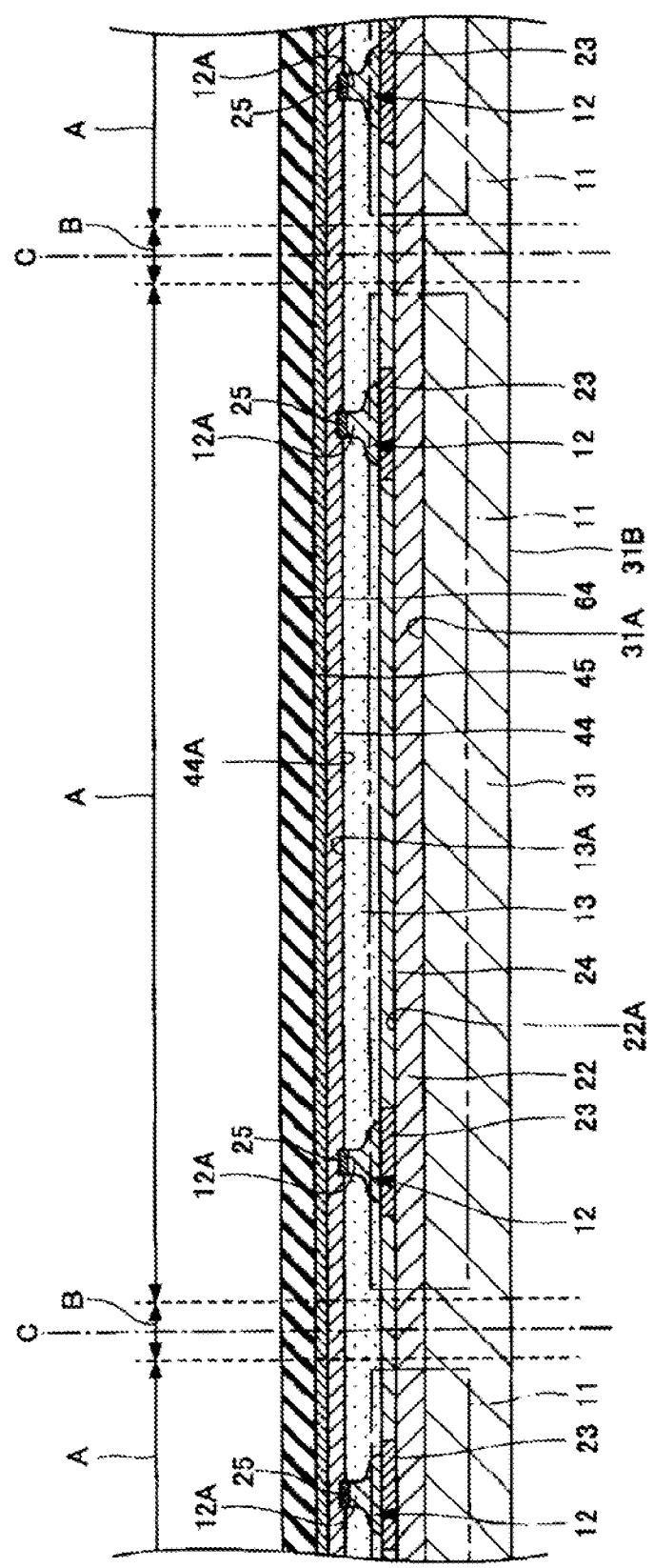
FIG. 41 is a view (No. 3) showing a step of manufacturing the semiconductor device according to the third embodiment of the invention.

At a step shown in FIG. 41, then, the first metal layer 44 in the portion provided in contact with the upper end 12A of the internal connecting terminal 12 (the first metal layer in a corresponding portion to the wiring pattern 14) is bonded to the upper end 12A of the internal connecting terminal in the portion provided in contact with the lower surface 44A of the first metal layer 44 to form an alloy layer 25 in bonding portions of the internal connecting terminal 12 and the first metal layer 44 (a bonding step).

For example, by using at least one method of a group including a laser welding method, an ultrasonic welding method and a resistance welding method at the bonding step, the internal connecting terminal 12 is bonded to the first metal layer 44 to form the alloy layer 25 in the bonding portions of the internal connecting terminal 12 and the first metal layer 44.

Thus, the third metal layer 64 is pressed to cause the lower surface 44A of the first metal layer 44 to come in contact with the upper ends 12A of the internal connecting terminals 12 and to then bond the first metal layer 44 in the portion provided in contact with the internal connecting terminal 12 (the first metal layer 44 in the corresponding portion to the wiring pattern 14) and the upper end 12A of the internal connecting terminal 12 in the portion provided in contact with the first metal layer 44 to each other. Also in the case in which the resin layer 13 is deformed (for example, the case in which the resin layer 13 is swollen by an influence of water or heat), consequently, the bonding portions of the internal connecting terminal 12 and the first metal layer 44 (the first metal layer 44 in the corresponding portion to the wiring pattern 14) are prevented from being separated from each other. Therefore, it is possible to sufficiently ensure an electrical connecting reliability between the internal connecting terminal 12 and the wiring pattern 14.

Moreover, it is also possible to use Au as a metallic material constituting the internal connecting terminal 12 and to use Cu as a material of the first metal layer 44. By using the Au as the metallic material constituting the internal connecting terminal 12 and using the Cu as the material of the first metal layer 44, thus, it is possible to form the alloy layer 25 having a great bonding force (in this case, a Cu—Au alloy layer) between the first metal layer 44 in the corresponding portion to the wiring pattern 14 and the internal connecting terminal 12. Therefore, it is possible to further enhance the electrical connecting reliability between the internal connecting terminal 12 and the wiring pattern 14. In the case in which the Cu—Au alloy layer is used as the alloy layer 25, a thickness of the alloy layer 25 can be set to be 0.5 μm to 1.0 μm, for example.

Figure 42:
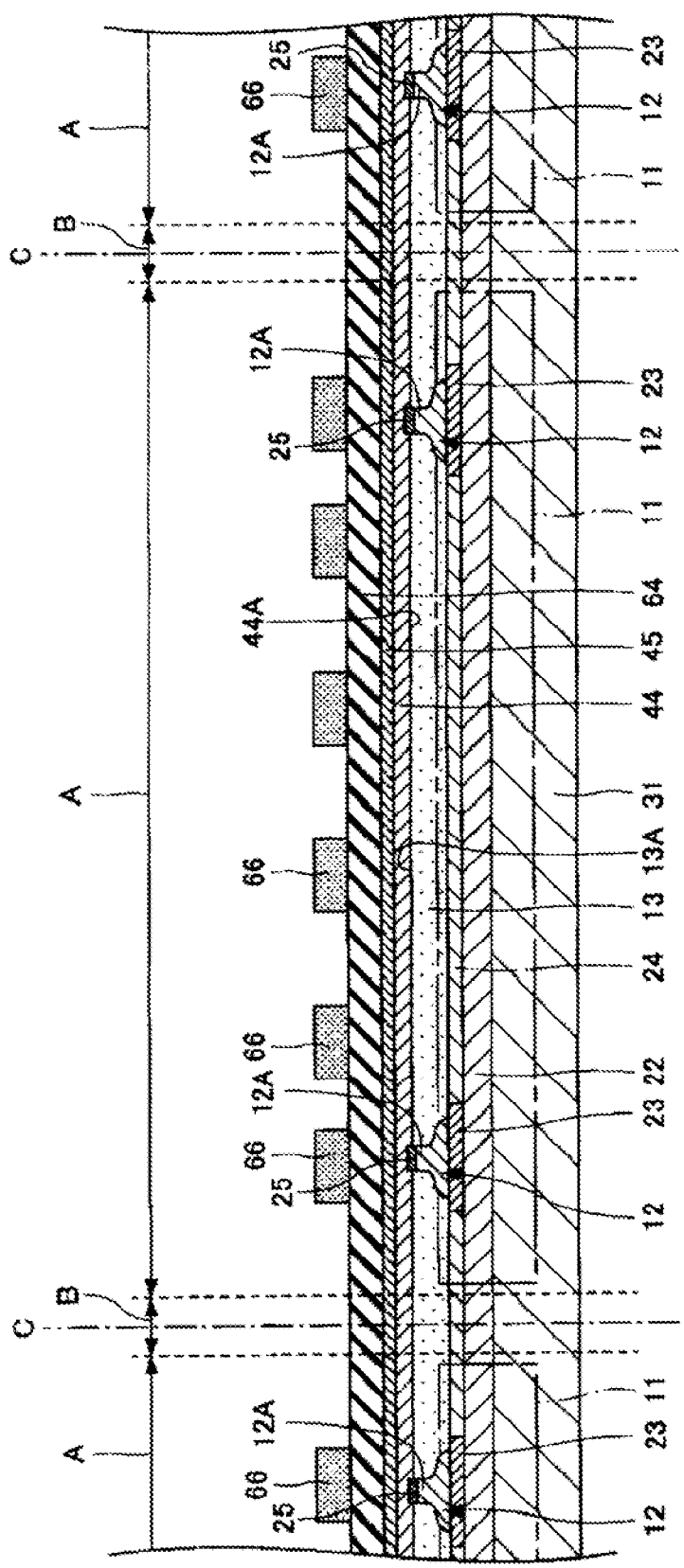
FIG. 42 is a view (No. 4) showing a step of manufacturing the semiconductor device according to the third embodiment of the invention.
Figure 43:
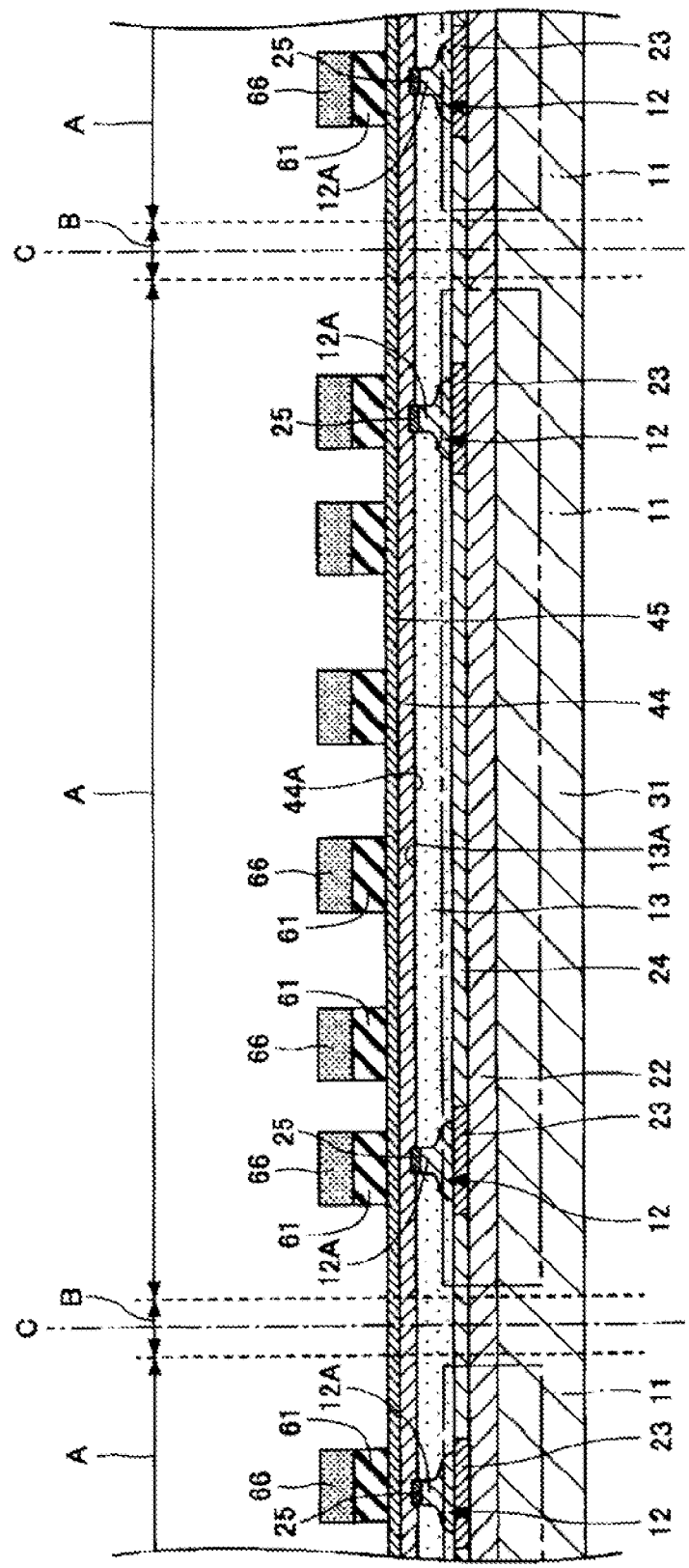
FIG. 43 is a view (No. 5) showing a step of manufacturing the semiconductor device according to the third embodiment of the invention.

At a step shown in FIG. 42, subsequently, a resist film 66 subjected to patterning is formed on the third metal layer 64 in a corresponding portion to a region in which the metal post 61 is to be formed. At a step shown in FIG. 43, next, the resist film 66 is used as a mask to carry out etching over the third metal layer 64 so that the metal post 61 is formed under the resist film 66 (a metal post forming step).

At this time, the second metal layer 45 functions as an etching stopper for etching the third metal layer 64. Therefore, it is possible to prevent the second metal layer 45 from being etched when carrying out the etching over the third metal layer 64. In the etching of the third metal layer 64, it is possible to use anisotropic etching (for example, dry etching), for instance.

At a step shown in FIG. 44, subsequently, the resist film 66 is used as a mask to carry out the etching over the second metal layer 45, thereby forming the connecting pad 41 (a connecting pad forming step).

At this time, the first metal layer 44 functions as an etching stopper for etching the second metal layer 45. Therefore, it is possible to prevent the first metal layer from being etched when carrying out the etching over the second metal layer 45. In the etching of the second metal layer 45, it is possible to use anisotropic etching (for example, dry etching), for instance.

Figure 44:
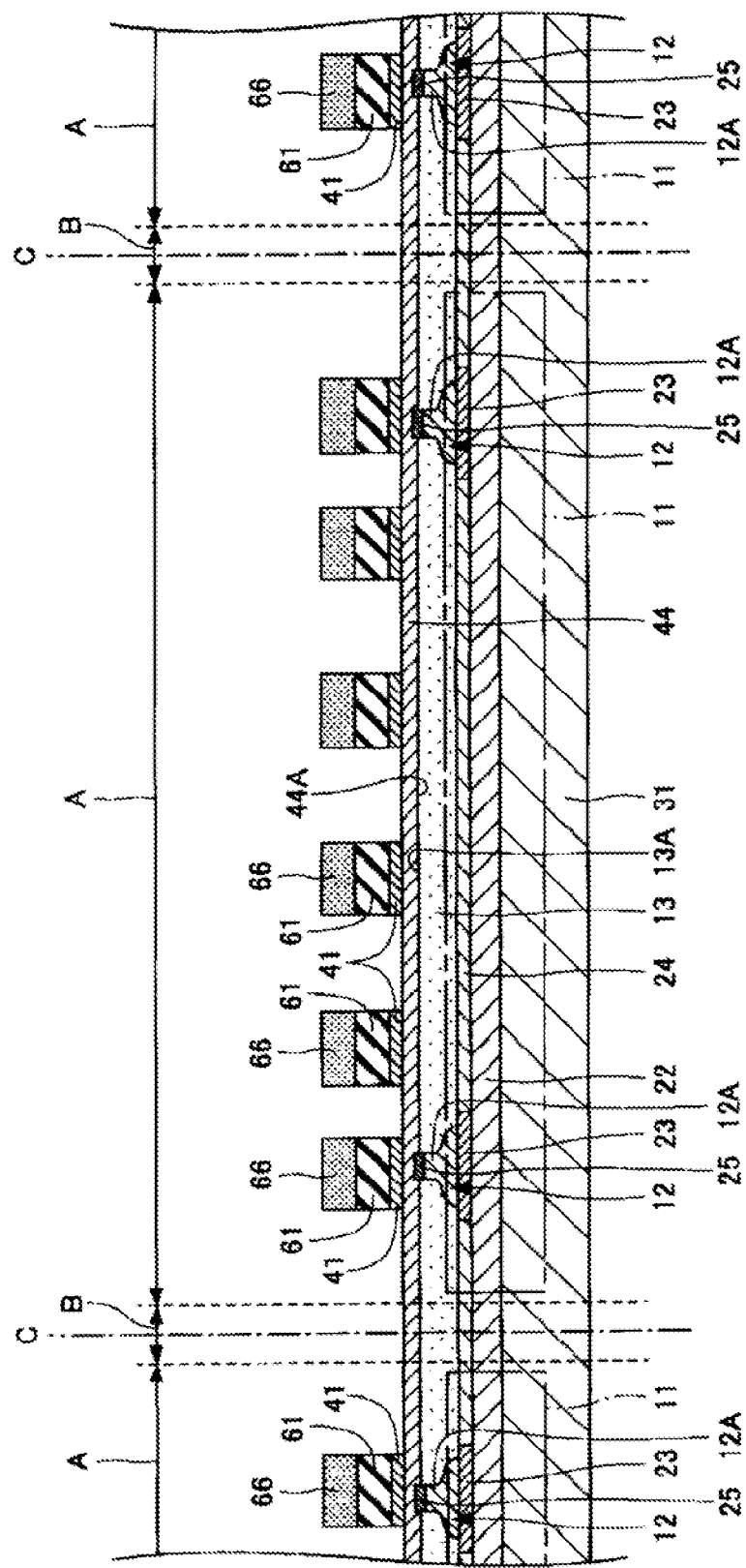
FIG. 44 is a view (No. 6) showing a step of manufacturing the semiconductor device according to the third embodiment of the invention.
Figure 45:
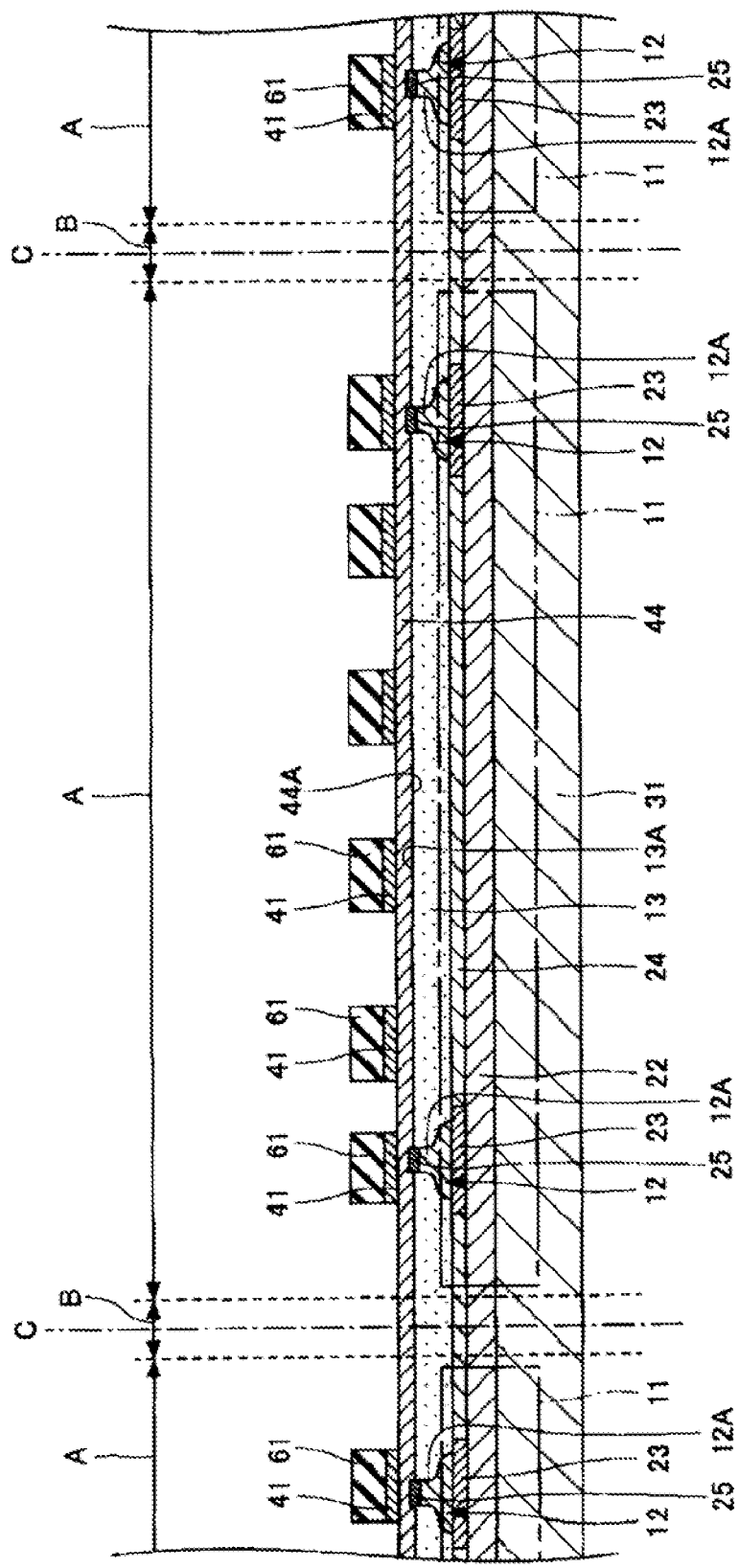
FIG. 45 is a view (No. 7) showing a step of manufacturing the semiconductor device according to the third embodiment of the invention.
Figure 46:
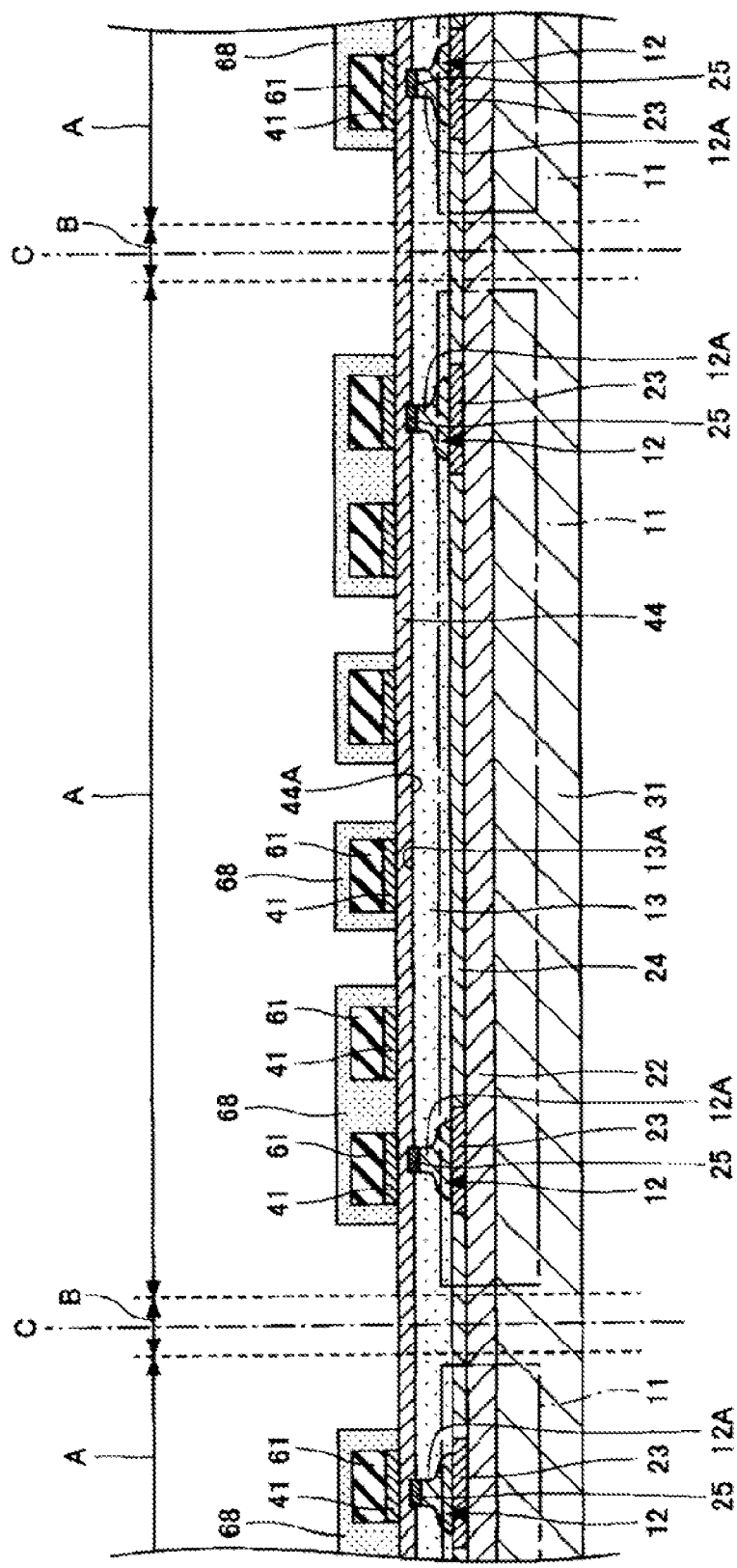
FIG. 46 is a view (No. 8) showing a step of manufacturing the semiconductor device according to the third embodiment of the invention.

At a step shown in FIG. 45, subsequently, the resist film 66 shown in FIG. 44 is removed. At a step shown in FIG. 46, then, a resist film 68 subjected to patterning is formed on the structure shown in FIG. 45. The resist film 68 is formed to cover the structure shown in FIG. 45 in corresponding portions to regions in which wiring patterns 14 and 15 are to be formed. The resist film 68 is an etching mask for carrying out etching over the first metal layer 44 to form the wiring patterns 14 and 15.

Figure 47:
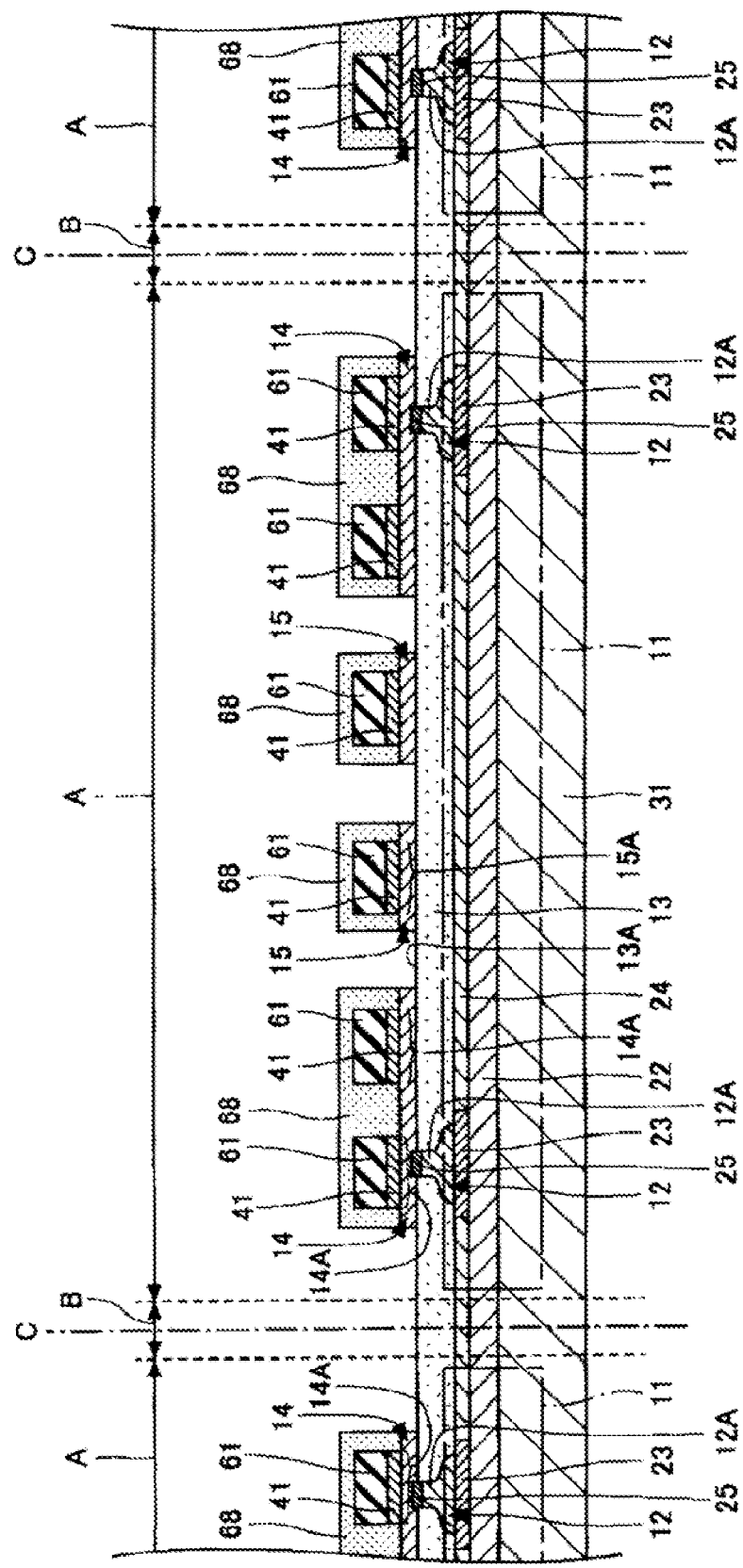
FIG. 47 is a view (No. 9) showing a step of manufacturing the semiconductor device according to the third embodiment of the invention.

At a step shown in FIG. 47, thereafter, the resist film 68 is used as a mask to carry out the etching over the first metal layer 44, thereby forming the wiring patterns 14 and 15 (a wiring pattern forming step). In the etching of the first metal layer 44, it is possible to use anisotropic etching (for example, dry etching), for instance. At a step shown in FIG. 48, next, the resist film 68 shown in FIG. 47 is removed.

Figure 48:
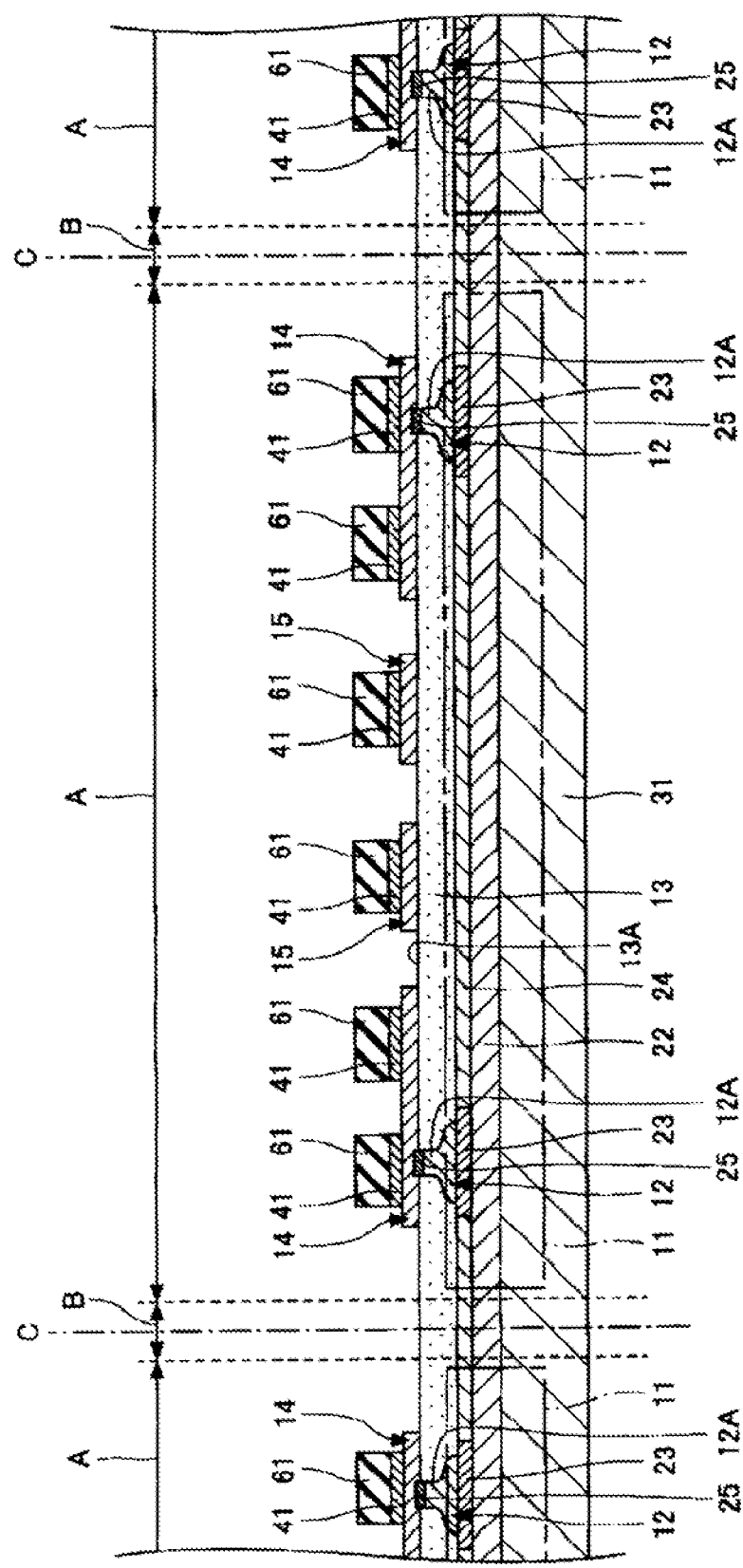
FIG. 48 is a view (No. 10) showing a step of manufacturing the semiconductor device according to the third embodiment of the invention.
Figure 49:
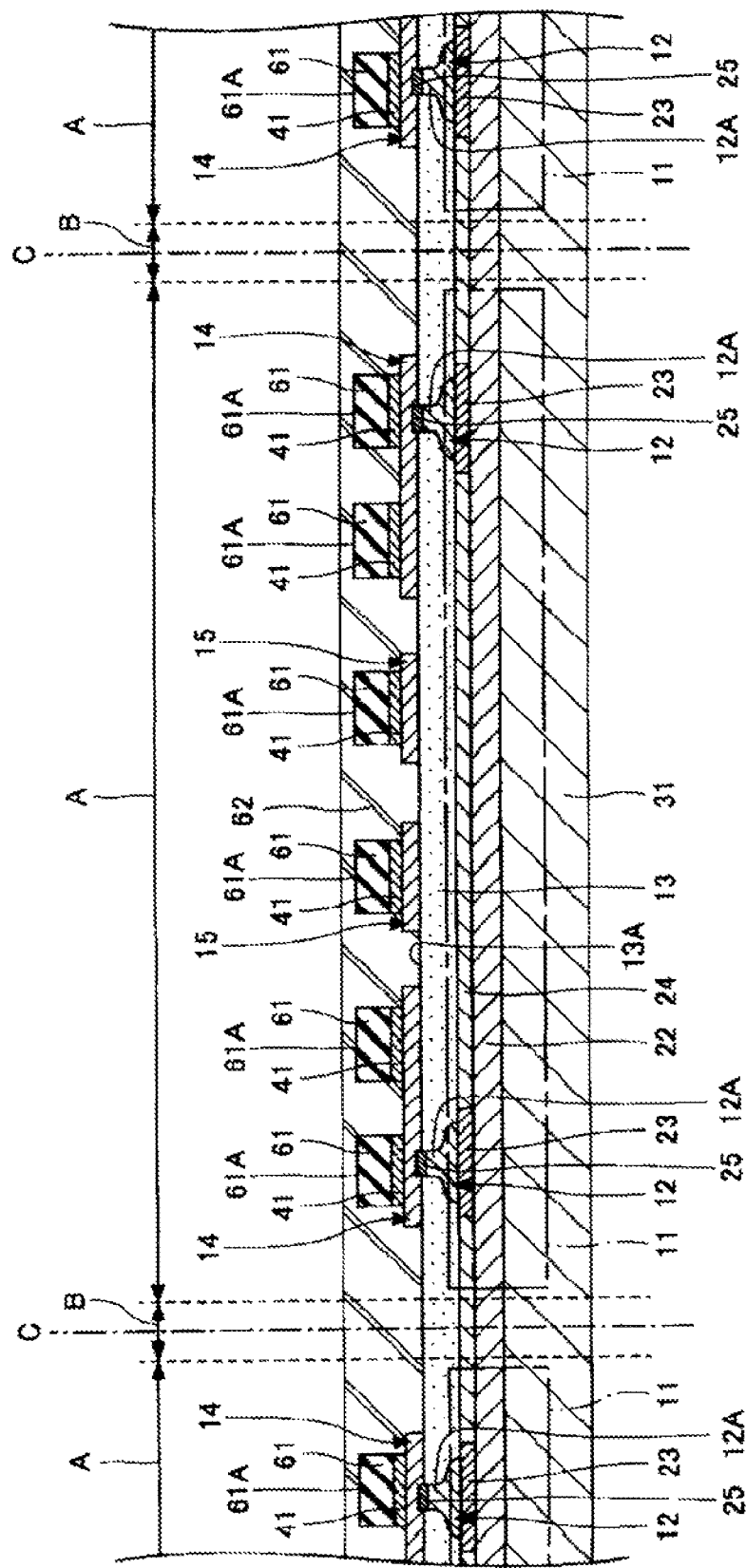
FIG. 49 is a view (No. 11) showing a step of manufacturing a semiconductor device according to the third embodiment of the invention.

At a step shown in FIG. 49, next, a sealing resin 62 is formed to cover an upper surface side of the structure shown in FIG. 48 (more specifically, the wiring patterns 14 and 15, the connecting pad 41, the metal post 61 and the upper surface 13A of the resin layer 13). At this time, the sealing resin 62 is formed to cover an upper surface 61A of the metal post 61. The sealing resin 62 is formed by a transfer molding method or a compression molding method, for example. As the sealing resin 62, for example, it is possible to use an epoxy resin.

Figure 50:
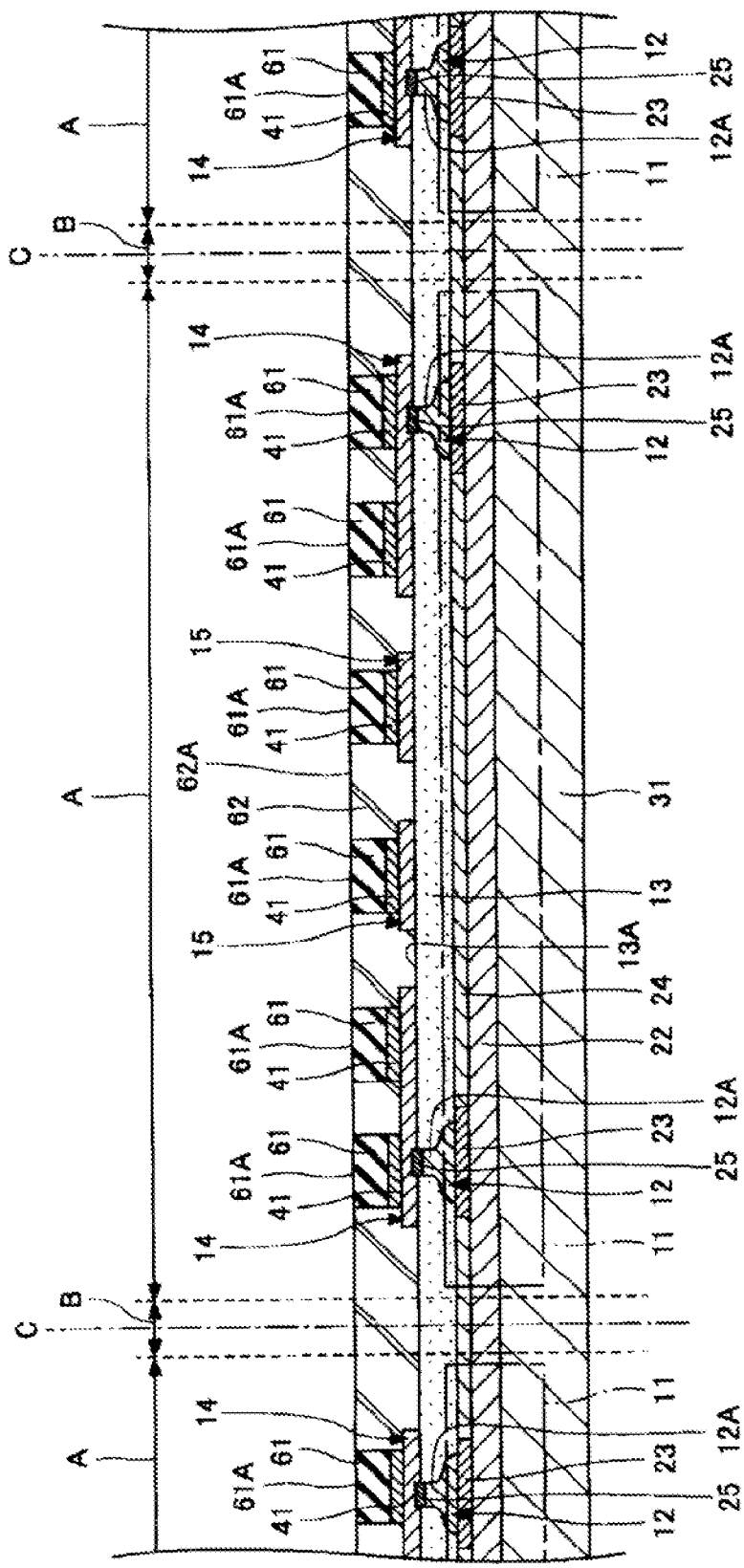
FIG. 50 is a view (No. 12) showing a step of manufacturing the semiconductor device according to the third embodiment of the invention.

At a step shown in FIG. 50, subsequently, the extra sealing resin 62 (the sealing resin 62 in a portion positioned above a plane passing through the upper surface 61A of the metal post 61) is removed in such a manner that the upper surface 61A of the metal post 61 is almost on the level with the upper surface 62A of the sealing resin 62. More specifically, the extra sealing resin 62 is removed by plasma ashing, for example. Then, the same processings as the steps shown in FIGS. 21 to 23 described in the first embodiment are carried out so that the semiconductor devices 60 manufactured on a semiconductor substrate 31 are divided into individual pieces.

According to the method of manufacturing the semiconductor device in accordance with the embodiment, the third metal layer 64 is pressed to cause the lower surface 44A of the first metal layer 44 to come in contact with the upper ends 12A of the internal connecting terminals 12 and to then bond the first metal layer 44 in the portion provided in contact with the internal connecting terminal 12 (the first metal layer 44 in the corresponding portion to the wiring pattern 14) and the upper end 12A of the internal connecting terminal 12 in the portion provided in contact with the first metal layer 44 to each other. Also in the case in which the resin layer 13 is deformed (for example, the case in which the resin layer 13 is swollen by an influence of water or heat), consequently, the bonding portions of the internal connecting terminal 12 and the first metal layer 44 (the first metal layer 44 in the corresponding portion to the wiring pattern 14) are prevented from being separated from each other. Therefore, it is possible to sufficiently ensure an electrical connecting reliability between the internal connecting terminal 12 and the wiring pattern 14.

By using the Au as the metallic material constituting the internal connecting terminal 12 and using the Cu as the material of the first metal layer 44, moreover, it is possible to form the alloy layer 25 having a great bonding force (in this case, a Cu—Au alloy layer) between the first metal layer 44 in the corresponding portion to the wiring pattern 14 and the internal connecting terminal 12. Therefore, it is possible to further enhance the electrical connecting reliability between the internal connecting terminal 12 and the wiring pattern 14.

By forming the metal post 61 between the external connecting terminal 17 and the connecting pad 41, moreover, it is possible to eliminate a stress received by the external connecting terminal 17.

Although the description has been given by taking, as an example, the case in which the bonding step is carried out after the contact step in the method of manufacturing the semiconductor device 60 according to the embodiment, the bonding step may be carried out after the metal post forming step (after the resist film 66 is removed), after the connecting pad forming step (after the resist film 66 is removed) or after the wiring pattern forming step (after the resist film 68 is removed). In these cases, it is possible to produce the same advantages as those in the method of manufacturing the semiconductor device 60 according to the embodiment.

While the preferred embodiments according to the invention have been described above in detail, the invention is not restricted to the specific embodiments but various changes and modifications can be carried out without departing from the scope of the invention described in the claims.

The invention can be applied to a method of manufacturing a semiconductor device in which a semiconductor chip is connected to a wiring pattern by flip-chip bonding and the semiconductor device has an almost equal size to a size of the semiconductor chip as seen on a plane.

What is claimed is:

1. A method of manufacturing a semiconductor device including a semiconductor substrate, a plurality of semiconductor chips formed on the semiconductor substrate, the semiconductor chips each having an electrode pad, an internal connecting terminal provided on the electrode pad, and a wiring pattern which is electrically connected to the internal connecting terminal, comprising:

a resin layer forming step of forming a resin layer having a thickness that is larger than a height of the internal connecting terminal so as to cover the semiconductor chips at a side on which the internal connecting terminal is provided, said resin also covering a side surface of the internal connecting terminal, and an upper surface of the internal connecting terminal;

a metal layer forming step of forming at least one metal layer on an upper surface of the resin layer;

a contact step of pressing the metal layer into contact with the upper surface of the internal connection terminal and thereby making the upper surface of the internal connecting terminal flat;

a bonding step of bonding a portion of the metal layer provided in contact with the internal connecting terminal to the internal connecting terminal after the contact step; and a wiring pattern forming step of patterning the metal layer to form the wiring pattern after the bonding step, wherein the metal layer and the internal connecting terminal are bonded to each other by at least one method of a group including a laser welding method and a resistance welding method at the bonding step.

2. The method of manufacturing a semiconductor device according to claim 1, wherein an alloy layer is formed in a bonding portion of the metal layer and the internal connecting terminal at the bonding step.

3. A method of manufacturing a semiconductor device including a semiconductor substrate, a plurality of semiconductor chips formed on the semiconductor substrate, the semiconductor chips each having an electrode pad, an internal connecting terminal provided on the electrode pad, and a wiring pattern which is electrically connected to the internal connecting terminal, comprising:

a resin layer forming step of forming a resin layer having a thickness that is larger than a height of the internal connecting terminal so as to cover the semiconductor chips at a side on which the internal connecting terminal is provided, said resin also covering a side surface of the internal connecting terminal and an upper surface of the internal connecting terminal;

a metal layer forming step of forming a metal layer on an upper surface of the resin layer;

a contact step of pressing the metal layer into contact with the upper surface of the internal connecting terminal and thereby making the upper surface of the internal connecting terminal flat, a wiring pattern forming step of patterning the metal layer to form the wiring pattern after the contact step; and a bonding step of bonding a portion of the wiring pattern provided in contact with the internal connecting terminal to the internal connecting terminal after the wiring pattern forming step, wherein the wiring pattern and the internal connecting terminal are bonded to each other by at least one method of a group including a laser welding method and a resistance welding method at the bonding step.

4. The method of manufacturing a semiconductor device according to claim 3, wherein an alloy layer is formed in a bonding portion of the wiring pattern and the internal connecting terminal at the bonding step.

5. The method of manufacturing a semiconductor device according to claim 1, further comprising:

a roughening step of roughening a surface of the wiring pattern after the bonding step.

6. The method of manufacturing a semiconductor device according to claim 3, wherein a material of the internal connecting terminal is Au and a material of the wiring pattern is Cu.

7. The method of manufacturing a semiconductor device according to claim 1, wherein the resin layer is an insulating resin layer or an anisotropic conductive resin layer.

8. The method of manufacturing a semiconductor device according to claim 3, wherein the resin layer is an insulating resin layer or an anisotropic conductive resin layer.

9. A method of manufacturing a semiconductor device including a semiconductor substrate, a plurality of semiconductor chips formed on the semiconductor substrate, the semiconductor chips each having an electrode pad, an internal connecting terminal provided on the electrode pad, and a wiring pattern which is electrically connected to the internal connecting terminal, comprising:

a resin layer forming step of forming a resin layer to cover the semiconductor chips at a side on which the internal connecting terminal is provided and the internal connecting terminal;

a metal layer forming step of sequentially forming a first metal layer and a second metal layer on an upper surface of the resin layer;

a contact step of pressing the second metal layer to cause the first metal layer to come in contact with the internal connecting terminal;

a bonding step of bonding the first metal layer in a portion provided in contact with the internal connecting terminal to the internal connecting terminal in a portion provided in contact with the first metal layer after the contact step;

a wiring pattern forming step of etching the first metal layer to form the wiring pattern after the bonding step; and, a connecting pad forming step in which the second metal layer is etched to form a connecting pad.

10. The method of manufacturing a semiconductor device according to claim 9, further comprising:

a protective layer forming step of forming a protective layer for protecting the second metal layer on the second metal layer; and a protective layer removing step of removing the protective layer after the contact step, wherein in the contact step, the protective layer is pressed to cause the first metal layer to come in contact with the internal connecting terminal.

11. The method of manufacturing a semiconductor device according to claim 9, wherein in the metal layer forming step, the first metal layer, the second metal layer and a third metal layer are sequentially provided on the upper surface of the resin layer, wherein in the contact step, the third metal layer is pressed to cause the first metal layer to come in contact with the internal connecting terminal, and wherein said method of manufacturing a semiconductor device further comprises a metal post forming step of carrying out etching over the third metal layer to form a metal post.

12. The method of manufacturing a semiconductor device according to claim 9, wherein an alloy layer is formed in a bonding portion of the first metal layer and the internal connecting terminal at the bonding step.

13. The method of manufacturing a semiconductor device according to claim 9, wherein the first metal layer and the internal connecting terminal are bonded to each other by at least one method of a group including a laser welding method, an ultrasonic welding method and a resistance welding method at the bonding step.

14. The method of manufacturing a semiconductor device according to claim 9, further comprising:
a roughening step of roughening a surface of the wiring pattern after the bonding step.

15. The method of manufacturing a semiconductor device according to claim 9, wherein a material of the internal connecting terminal is Au and a material of the wiring pattern is Cu.

16. The method of manufacturing a semiconductor device according to claim 9, wherein the resin layer is an insulating resin layer or an anisotropic conductive resin layer.

17. The method of manufacturing a semiconductor device according to claim 9, wherein the first metal layer is an etching stopper for etching the second metal layer.

18. The method of manufacturing a semiconductor device according to claim 11, wherein the second metal layer is an etching stopper for etching the third metal layer.

* * * * *